United States Patent [19]

Nakahigashi et al.

[11] Patent Number: 5,562,952

[45] Date of Patent: Oct. 8, 1996

[54] PLASMA-CVD METHOD AND APPARATUS

[75] Inventors: Takahiro Nakahigashi; Hiroshi Murakami, both of Kyoto; Satoshi Otani, Osaka; Takao Tabata, Kyoto; Hiroshi Maeda, Kyoto; Hiroya Kirimura, Kyoto; Hajime Kuwahara, Kyoto, all of Japan

[73] Assignee: Nissin Electric Co., Ltd., Kyoto, Japan

[21] Appl. No.: 416,477

[22] Filed: Apr. 4, 1995

Related U.S. Application Data

[63] Continuation of Ser. No. 338,125, Nov. 9, 1994, abandoned.

[30] Foreign Application Priority Data

Nov. 11, 1993 [JP] Japan .................................... 5-282207
Feb. 18, 1994 [JP] Japan .................................... 6-21217
Feb. 21, 1994 [JP] Japan .................................... 6-22311
Feb. 21, 1994 [JP] Japan .................................... 6-22337
Apr. 13, 1994 [JP] Japan .................................... 6-74993
Aug. 10, 1994 [JP] Japan .................................... 6-188090
Aug. 10, 1994 [JP] Japan .................................... 6-188634

[51] Int. Cl.⁶ .................................................. C23C 14/02
[52] U.S. Cl. .......................... 427/534; 118/50; 118/600; 118/715; 427/126.3; 427/126.4; 427/249; 427/255; 427/255.3; 427/294; 427/296; 427/307; 427/309; 427/322; 427/535; 427/536; 427/537; 427/539; 427/553; 427/561; 427/568; 427/576; 427/577; 427/579; 427/595
[58] Field of Search .............................. 427/126.3, 126.4, 427/249, 255, 255.3, 294, 296, 307, 309, 322, 535, 536, 537, 539, 553, 561, 568, 576, 577, 579, 595; 118/50, 600, 715

[56] References Cited

FOREIGN PATENT DOCUMENTS

| 58-122979 | 7/1983 | Japan . |
| 58-142958 | 8/1983 | Japan . |
| 58-147483 | 9/1983 | Japan . |
| 58-172243 | 10/1983 | Japan . |
| 58-172242 | 10/1983 | Japan . |
| 3-259512 | 11/1991 | Japan . |

(List continued on next page.)

OTHER PUBLICATIONS

Patent Abstracts Of Japan, vol. 017, No. 554 (C–118) 6 Oct. 1993 & JP–A–05 156 451 (Nissin Electric Co Ltd) 22 Jun. 1993 (Abstract).

Patent Abstracts Of japan, vol. 017, No. 361 (C–1080) 8 Jul. 1993 & JP–A–05 051 753 (Nissin Electric Co Ltd) 2 Mar. 1993 (Abstract).

36th National Symposium Of The American Vacuum Society, Boston, MA, USA, 23–27 Oct. 1989, ISSN 0734–2101, Journal Of Vacuum Science & Technology A A (Vacuum, Surfaces, And Films), May–Jun. 1990, USA pp. 1851–1856 Verdeyen J. T. et al "Modulated Discharges: Effect on Plasma Parameters and deposition".

(List continued on next page.)

*Primary Examiner*—Bernard Pianalto
*Attorney, Agent, or Firm*—Nikaido, Marmelstein, Murray & Oram LLP

[57] ABSTRACT

In a plasma-CVD method and apparatus, plasma is formed from a film material gas in a process chamber and, in the plasma, a film is deposited on a substrate disposed in the process chamber. Formation of the plasma from the material gas is performed by application of an rf-power prepared by effecting an amplitude modulation on a basic rf-power having a frequency in a range from 10 MHz to 200 MHz. A modulation frequency of the amplitude modulation is in a range from 1/1000 to 1/10 of the frequency of the basic rf-power. Alternatively, the rf-power is prepared by effecting on the basic rf-power a first amplitude modulation at a frequency in a range from 1/1000 to 1/10 of the frequency of the basic rf-power, and additionally effecting a second amplitude modulation on the modulated rf-power. A modulation frequency of the second amplitude modulation is in a range from 1/100 to 100 times the modulation frequency of the first amplitude modulation.

32 Claims, 20 Drawing Sheets

FOREIGN PATENT DOCUMENTS

| | | |
|---|---|---|
| 5-51753 | 3/1993 | Japan . |
| 5-156451 | 6/1993 | Japan . |
| 5-70930 | 10/1993 | Japan . |
| 6-70995 | 9/1994 | Japan . |
| 2105729 | 3/1983 | United Kingdom . |

OTHER PUBLICATIONS

"Application of Modulated RF Discharge to a–Si:H Deposition," Proceedings of Japanese Symposium on Plasma Chemistry, vol. 1, 1988, M. Shiratani et al. (No month available).

"Effects of Low–frequency Modulation on RF Discharge Chemical Vapor Deposition," Appl. Phys. Lett. 53 (14), Oct. 3, 1988, Y. Watanabe et al.

"Reaction Control in Processing Plasmas by Square–Wave–Amplitude–Modulating RF Voltage," Technology Reports of Kyushu University, vol. 62, No. 6, Dec. 1989, Masaharu Shiratani et al.

Basic rf-Power

First Amplitude Modulation

Second Amplitude Modulation

PLASMA-CVD METHOD AND APPARATUS

This application is a continuation of application Ser. No. 08/338,125, filed Nov. 9, 1994, abandoned.

BACKGROUND OF THE INVENTION

1. Field of the Invention

The present invention relates to a plasma chemical vapor deposition method in which plasma is produced by a deposition material gas and a film is formed or deposited on a substrate in the plasma, and also relates to a plasma chemical vapor deposition apparatus for executing the above method.

In this specification and appended claims, the plasma chemical vapor deposition is referred to as "plasma-CVD"

2. Description of the Background Art

Plasma-CVD has been utilized for many purposes such as manufacturing of thin film transistors, manufacturing of various kinds of semiconductor devices such as sensors utilizing semiconductor materials, manufacturing of various kinds of thin film devices used in solar batteries, LCDs (liquid-crystal displays) and others, formation of ferroelectric films used, for example, in flash memories, gas sensors and thin film capacitor, formation of carbon films for loudspeaker diaphragms, coating of ornaments and decorations, and formation of films having a wear resistance for machine parts, tools and others requiring a wear resistance.

Various types of apparatuses performing the plasma-CVD have been known.

As a typical example, a parallel plated plasma-CVD apparatus utilizing radio-frequency power will be described below with reference to FIGS. 15 and 16. In the following description and appended claims, "radio-frequency" and "radio-frequency power" is referred to as "rf" and "rf-power", respectively, and plasma-CVD using the rf-power is referred to as "rf plasma-CVD".

In the apparatus shown in FIG. 15, two electrodes for producing plasma are arranged parallel to each other in the longitudinal direction. The apparatus shown in FIG. 16, two electrodes for producing plasma are arranged parallel to each other in the lateral direction. These apparatuses have the substantially same structure and operation except for arrangement of the electrodes and other several portions. Parts and portions having the substantially same function bear the same reference numbers.

Each of the plasma-CVD apparatuses shown in FIGS. 15 and 16 includes a vacuum container 10 used as a process chamber, in which an electrode 20 also serving as a substrate holder for holding a substrate S10, on which a film is to be deposited, as well as an electrode 30 are arranged in an opposed fashion.

The electrode 20 is generally a ground electrode, and is additionally provided with a heater 210 for heating the substrate S10 disposed thereon to a deposition temperature. If radiant heat is used to heat the substrate S10, the heater 210 is spaced from the electrode 20.

The electrode 30 is a power application electrode which applies the rf-power to the film deposition gas, i.e., gas for film formation or deposition, introduced between the electrodes 20 and 30 so as to convert the gas into the plasma. In these examples, the electrode 30 is connected to an rf-power source 320 via a matching box 310.

An exhaust pump 520 is connected to the process chamber 10 via a valve 510, and a gas source 40 for the film deposition gas is connected thereto via a piping. The gas source 40 includes one or more mass-flow controllers 411, 412, . . . , one or more valves 421, 422, . . . connected to the mass-flow controllers, respectively, and one or more film deposition gas sources 431, 432, . . . connected to the valves, respectively.

According to the parallel plated plasma-CVD apparatuses described above, the substrate S10 is transferred by an unillustrated substrate transfer device into the process chamber 10 and mounted on the electrode 20. The valve 510 is opened and the exhaust pump 520 is driven to set the process chamber 10 to a predetermined degree of vacuum, and the film deposition gas is supplied into the chamber 10 from the gas source 40. The power source 320 applies the rf-power to the rf-electrode 30. Thereby, the introduced gas forms plasma, in which an intended film is deposited on the surface of the substrate S10.

For example, the pressure in the process chamber 10 is set to about hundreds of millitorrs, and the heater 210 heats the substrate holder electrode 20 to a temperature of about 300° C. The substrate S10 is mounted on the electrode 20, and the gas source 40 supplies predetermined amounts of monosilane ($SiH_4$) gas and hydrogen ($H_2$) gas, and the rf-power of a frequency of 13.56 MHz is applied to the electrode 30. Whereby, the gases form the plasma, and an amorphous silicon film is deposited on the substrate S10. A predetermined amount of ammonia ($NH_3$) gas may be introduced instead of the hydrogen gas, in which case a silicon nitride film is formed.

Another processing may be executed as follows. The pressure in the process chamber 10 is approximately set to hundreds of millitorrs, the substrate holder electrode 20 is heated by the heater 210, and the substrate S10 is mounted on the electrode 20. The gas source 40 supplies only a predetermined amount of hydrocarbon compound gas such as a methane ($CH_4$) gas or a ethane ($C_2H_6$) gas, or predetermined amounts of the above hydrocarbon compound gas and hydrogen ($H_2$) gas. An rf-power of a frequency, e.g., of 13.56 MHz is applied to the electrode 30. Whereby, the gas forms plasma, and a thin carbon film is deposited on the substrate S10. In this case, the film quality can be controlled by changing the processing temperature of the substrate S10. For example, if the film is to be deposited on the substrate made of synthetic resin such as polyimide resin, the substrate is set to a temperature of about 100° C. or less considering heat resistance of the substrate, in which case a diamond like carbon (will be also referred to as "DLC") film is deposited. The DLC film is used as a diaphragm of a loudspeaker, coating of an decoration and others.

A plasma-CVD apparatus shown in FIG. 17 is also well known.

This apparatus can use a safe material, which is liquid in an ambience of room temperature of, e.g., 25° C., for depositing even such a film that requires the plasma-CVD apparatuses shown in FIGS. 15 and 16 to use a dangerous gas such as flammable gas or explosive gas for depositing the film.

For example, in order to form the amorphous silicon film or silicon nitride film, the plasma-CVD apparatuses in FIGS. 15 and 16 use the monosilane ($SiH_4$) gas as described above. However, the $SiH_4$ gas is legally designated as a dangerous (e.g., flammable or explosive) special material gas, so that a significantly expensive countermeasure for safety is required for using the silane gas. For this reason, the apparatus shown in FIG. 17 is used. More specifically, when the amorphous silicon film is to be formed, a gas of silicon tetrachloride ($SiCl_4$), which is liquid at room temperature, and a hydrogen gas are used. When the silicon nitride film is to be formed, the silicon tetrachloride ($SiCl_4$) gas and an ammonia ($NH_3$) gas are used.

When silicon tetrachloride ($SiCl_4$) is used, $SiCl_4$ is stored in a bubbler 44, as shown in FIG. 17, and is bubbled to supply it to the process chamber 10. More specifically, in the apparatus shown in FIG. 17, a gas supply unit 400 which is connected to the process chamber 10 via a piping includes the sealedly closable container (bubbler) 44, which is connected to a gas source 453 of a carrier gas via a mass-flow controller 451 and a valve 452. A piping extending from the mass-flow controller 451 has an end located at the vicinity of the bottom of the bubbler 44. An upper space in the bubbler 44 is connected to the process chamber 10 via a piping. In order to prevent condensation of the $SiCl_4$ gas vaporized in the bubbler 44, heaters 401 and 402 are associated to the bubbler 44 and the piping between the bubbler 44 and the process chamber 10, respectively. If necessary, the process chamber 10 may be connected to a gas source(s) 463, 473, . . . storing other material gas(es) via one or more mass-flow controllers 461, 471, . . . and valves 462, 472, . . . , respectively. Structure other than the above is the same as those shown in FIG. 16, and the same parts and portions as those in FIG. 16 bear the same reference numbers.

In the process of forming, e.g., an amorphous silicon film by the above plasma-CVD apparatus, the substrate S10 is mounted on the ground electrode 20, and is heated to about 500° C. by the heater 210. Liquid $SiCl_4$ is stored in the bubbler 44, and a vacuum pressure is applied into the process chamber 10 by the pump 520, so that hydrogen gas is introduced from the gas source 453 into the bubbler 44 for bubbling the $SiCl_4$, and the generated $SiCl_4$ gas is supplied to the process chamber 10. The bubbling may be performed, for example, with a hydrogen ($H_2$) gas or an inert carrier gas such as argon (Ar) gas or helium (He) gas supplied from a gas source, and hydrogen gas may be supplied from another gas source such as source 463. The power source 320 applies the rf-power to the gas introduced into the process chamber 10 to form plasma from the gas, and the amorphous silicon film is deposited on the substrate S10 in the plasma. If the temperature of substrate is set to 800° C. or more, a polycrystalline silicon (will be also referred to as "p-Si") film or a single crystal silicon film can be formed.

A plasma-CVD apparatus shown in FIG. 18 has also been known.

This apparatus has also been known as a parallel plated rf plasma-CVD apparatus, and includes, as a process chamber, a vacuum container 1A, in which an electrode 2A also serving as a substrate holder for carrying the substrate S10 is disposed together with an electrode 3A opposed to the electrode 2A.

The electrode 2A is generally grounded, and is provided with a heater 21A for heating the substrate S10 mounted thereon to a film deposition temperature. If radiation heat is used for heating the substrate S10, the heater 21A is separated from the electrode 2A.

The electrode 3A functions as a power application electrode for applying the power to the film deposition gas introduced between the electrodes 2A and 3A so as to form plasma. In the illustrated prior art, the electrode 3A is connected to an rf-power source 32A via a matching box 31A. A heater 33A is associated to the electrode 3A for maintaining the gaseous state of the deposition material gas introduced between the electrodes 2A and 3A, even if the apparatus uses the gas which is liquid at room temperature. The heater 33A may be separated from the electrode 3A.

The process chamber 1A is connected to an exhaust pump 42A via a valve 41A, and is connected via a piping to a gas supply unit 5A for supplying a pretreatment gas and a film deposition gas. The gas supply unit 5A can supply the film deposition gas of compound such as silicon tetrachloride ($SiCl_4$), which is liquid at room temperature, to the process chamber 1A by bubbling such a compound. For this purpose, the gas supply unit 5A is formed of a bubbler unit 51A for supplying the gas of the compound which is liquid at a room temperature, and a gas supply portion 52A for supplying the gas of compound which is gaseous at room temperature.

The bubbler unit 51A is provided with one or more sealedly closable containers (bubblers) $51a1$, $51a2$, . . . , which are connected to gas sources $51d1$, $51d2$, . . . of carrier gases via mass-flow controllers $51b1$, $51b2$, . . . and valves $51c1$, $51c2$, . . . , respectively. Ends of pipings extending from the mass-flow controllers $51b1$, $51b2$, . . . are located near the bottom of the bubblers $51a1$, $51a2$, . . . , respectively.

Upper spaces in the bubblers $51a1$, $51a2$, . . . are connected to the process chamber 1A via valves $51e1$, $51e2$, . . . and pressure regulators $51f1$, $51f2$, . . . Each of the pressure regulators $51f1$, $51f2$, . . . is formed of a pressure regulator valve and a pressure gauge. Temperature controllers $51g1$, $51g2$, . . . each including a heater and a Peltier element are associated to the bubblers $51a1$, $51a2$, . . . , respectively. A heater $51h$ is provided at the piping extending from the bubblers $51a1$, $51a2$, . . . to the process chamber 1A.

The gas supply unit 52A includes one or more gas sources $523a$, $523b$, . . . as well as mass-flow controllers $521a$, $521b$, . . . and valves $522a$, $522b$, . . . associated thereto for supplying a gas such as a film deposition gas, a pretreatment gas and, if necessary, a carrier gas or the like, which are gaseous at room temperature, to the process chamber 1A.

In the operation of depositing an amorphous silicon film on the substrate S10 by the above plasma-CVD apparatus, the substrate S10 is transferred into the process chamber 1A, and is mounted on the electrode 2A which is heated to about 500° C. by the heater 21A. Then, the valve 41A is operated and the exhaust pump 42A is driven to set the chamber 1A to an intended degree of vacuum of about hundreds of millitorrs. The gas supply portion 52A in the gas supply unit 5A supplies a hydrogen ($H_2$) gas as a pretreatment gas, and the power source 32A applies the rf-power to the rf-electrode 3A for a predetermined time period. Thereby, plasma is formed from the hydrogen gas, and the surface of the substrate S10 is cleaned in the plasma. Then, the carrier gas, i.e., hydrogen gas is introduced from the gas source $51d1$ into the bubbler $51a1$ storing liquid silicon tetrachloride ($SiCl_4$) for bubbling the liquid silicon tetrachloride, and the $SiCl_4$ gas thus generated is supplied into the process chamber 1A. In this operation, the bubbler $51a1$ is heated by the heat controller $51g1$ to about 50°–70° C. If necessary, the piping between the bubbler $51a1$ and the chamber 1A is heated by the heater $51h$ to an appropriate temperature, and likewise the electrode 3A is heated by the heater 33A. At the same time, the power source 32A applies the rf-power to the rf-electrode 3A, so that plasma is formed from the introduced gas, and the amorphous silicon film is formed on the surface of the substrate S10. Bubbling may be carried out, for example, with a hydrogen gas or an inert gas such as a helium (He) gas or an argon (Ar) gas, and hydrogen gas may be supplied via another passage from the gas supply unit 52A.

In the deposition method and apparatus described above, a polycrystalline silicon film or a single crystal silicon film is deposited if the substrate is maintained at a temperature of 800° C. or more during the deposition. In the deposition process, if the bubbling is carried out with a hydrogen gas, and the gas supply unit 52A introduces an ammonia ($NH_3$) gas into the chamber 1A, a silicon nitride film is deposited. In the deposition process, a hydrogen gas or a nitrogen ($N_2$) gas may be introduced as a carrier gas into the bubbler storing, as film material, titanium tetrachloride ($TiCl_4$), and an ammonia gas may be introduced from the gas supply unit 52A into the chamber 1A, in which case a titanium nitride film is deposited. If the deposition is carried out at a relatively low temperature, a monosilane ($SiH_4$) gas and a hydrogen gas can be used to deposit an amorphous silicon film without using a film material which is liquid at a room temperature, and likewise a monosilane gas and an ammonia gas can be used to deposit a silicon nitride film.

Several prior arts of the plasma-CVD have been described. Now, formation of a ferroelectric film in the prior art will be described below, because the invention also relates to the formation of the ferroelectric film.

In general, the ferroelectric film is formed by a thermal chemical vapor deposition (thermal-CVD) method. A typical example of the thermal-CVD apparatus for this film formation is shown in FIG. 19.

This apparatus has a process chamber 1 as well as a load lock chamber 3 connected to the chamber 1 via a gate valve a. In the process chamber 1, there is arranged a substrate holder 4 for holding the substrate S10, and the substrate holder 4 is provided with a high-temperature plate heater 41 heating the substrate mounted on the substrate S10 to a film deposition temperature. If radiation heat is used for heating the substrate S10, the heater 41 is separated from the holder 4.

The process chamber 1 is also connected to an exhaust device 6, which includes a valve 61, a turbo molecular pump 62, a valve 63 and a rotary pump 64 connected in this order.

The process chamber 1 is also connected to a gas supply unit 2. For forming a ferroelectric film, one generally uses an organic compound gas containing element of the intended ferroelectric film as well as another kind of gas which contains oxygen and is different from the organic compound gas. In many cases, the organic compound is liquid at a room temperature. Therefore, the gas supply unit 2 can supply the organic compound into the process chamber 1 by bubbling it. For this purpose, the gas supply unit 2 is formed of a bubbler unit 21 for supplying the organic compound, which is liquid at a room temperature, and a different gas supply unit 22 for supplying the different kind of gas.

The bubbler unit 21 is provided with one or more sealedly closable containers or bubblers $21a1$, $21a2$, . . . , which are connected to gas sources $21d1$, $21d2$, . . . of carrier gases via mass-flow controllers $21b1$, $21b2$, . . . and valves $21c1$, $21c2$, . . . , respectively. Ends of pipings extending from the mass-flow controllers $21b1$, $21b2$, . . . are located near the bottoms of the bubblers $21a1$, $21a2$, . . . , respectively. Upper spaces in the bubblers $21a1$, $21a2$, . . . are connected to the process chamber 1 via pipings provided with valves $21e1$, $21e2$, . . . and pressure regulators $21f1$, $21f2$, . . . . Each of the pressure regulators $21f1$, $21f2$, . . . . is formed of a pressure regulator valve and a pressure gauge. Temperature controllers $21g1$, $21g2$, . . . each including a heater and a Peltier element are associated to the bubblers $21a1$, $21a2$, . . . . A heater $21h$ is associated to the pipings between the bubblers $21a1$, $21a2$, . . . and the process chamber 1.

The different gas supply unit 22 contains one or more gas sources $223a$, $223b$, . . . of different kinds of gases which are connected to the chamber 1 via mass-flow controllers $221a$, $221b$, . . . and valves $222a$, $222b$, . . . , so that a gas containing oxygen and, if required, a different kind of gas such as a carrier gas can be supplied into the process chamber 1.

The load lock chamber 3 is provided with a gate valve b which can be externally opened. A lamp heater 31 for preheating the substrate S10 is arranged in the chamber 3. The chamber 3 is connected to an exhaust device 8. The exhaust device 8 is formed of a valve 81, a turbo molecular pump 82, a valve 83 and a rotary pump 84 connected in this order, and the rotary pump 84 is also connected to the chamber 3 via a valve 85. When a vacuum pressure is to be applied to the load lock chamber 3 at the atmospheric pressure, only the valve 85 is opened and the rotary pump 84 is driven. Once a predetermined degree of vacuum is attained, the valve 85 is closed, the valves 81 and 83 are opened, and the rotary pump 84 and the turbo molecular pump 82 are driven to maintain the vacuum pressure.

In the operation of depositing ditantalum pentoxide ($Ta_2O_5$) film on the substrate by the above thermal-CVD apparatus, the substrate S10 is transferred through the gate valve b into the load lock chamber 3 heated by the lamp heater 31. Then, the gate valve b is closed, and the exhaust device 8 is driven to attain the predetermined degree of vacuum in the chamber 3. Then, the substrate S10 is transferred through the gate valve a into the process chamber 1 which is maintained at the predetermined degree of vacuum for film deposition, i.e., from about hundreds militorrs to about several torrs by driving the exhaust device 6, and is mounted on the substrate holder 4 heated by the heater 41 to a temperature from about 600° to about 650° C. Then, the valve a is closed. Subsequently, a carrier gas, i.e. , hydrogen ($H_2$) is supplied from the gas source $21d1$ into the bubbler $21a1$ storing liquid pentaethoxytantalum ($Ta(OC_2H_5)_5$) for bubbling pentaethoxytantalum, and the generated pentaethoxytantalum gas is supplied into the process chamber 1. In this operation, the bubbler $21a1$ is heated to a predetermined temperature by the temperature controller $21g1$, and, if necessary, the heater $21h$ is turned on for maintaining the intended gaseous state. The different gas supply unit 22 supplies an oxygen ($O_2$) gas. The bubbling may be performed, for example, with an inert gas such as a helium (He) gas or an argon (Ar) gas or a hydrogen gas, and a hydrogen gas may be supplied via another passage from the different gas supply unit 22.

The gas thus introduced is decomposed at the vicinity of the heated substrate S10, so that an intended film is deposited on the surface of the substrate S10. If the film material stored in the bubbler is gaseous at room temperature, the material may be cooled to an appropriate temperature by the temperature controller $21g1$.

In addition to the ditantalum pentoxide film, the apparatus described above can also form various kinds of ferroelectric films. For example, it can form a lead monoxide (PbO) film from tetraethyllead ($Pb(C_2H_5)_4$) (or lead dipivalylmethanate ($Pb(DPM)_2$) and oxygen ($O_2$) gases, a titanium dioxide ($TiO_2$) film from titanium tetrachloride ($TiCl_4$) (or pentaethoxytitanium ($Ti(OC_2H_5)_5$) or tetraisoproxytitanium ($Ti(O-i-C_3H_7)_4$)) and oxygen ($O_2$) gases, a zirconium oxide ($ZrO_2$) film from tetra-tert-butoxyzirconium ($Zr(O-t-C_4H_9)_4$) and oxygen ($O_2$) gases, a barium oxide (BaO) film from diethoxybarium ($Ba(OC_2H_5)_2$) and oxygen ($O_2$) gases, a strontium oxide (SrO) film from diethoxy strontium ($Sr(OC_2H_5)_2$) and oxygen ($O_2$) gases, and a lanthanum oxide ($La_2O_3$) film from lanthanum dipivalylmethanate ($La(DPM)_2$) and oxygen ($O_2$) gases. Among the aforementioned film materials, tetraethyllead, titanium tetrachloride, pentaethoxytitanium and tetraisoproxytitanium are liquid at room temperature, and thus are supplied into the process chamber 1 by bubbling them. Lanthanum dipivalylmethanate, diethoxybarium, diethoxy strontium and lanthanum dipivalylmethanate are solid at room temperature, so that they are solved, for example, in alcohol such as ethanol for bubbling them. Tetra-tert-butoxyzirconium is gaseous at room temperature, so that it may be cooled to an appropriate temperature, if necessary or desirable.

If a composite oxide film, such as a strontium titanate ($SrTiO_3$) film, barium metatitanate ($BaTiO_3$) film or zirconium oxide titanium oxide lead ($Pb(Zr,Ti)_xO_2$) film is to be formed, two or more bubblers are used to bubble several kinds of film material liquids containing film forming elements for supplying them to the process chamber 1.

However, the film deposition by the plasma-CVD and thermal-CVD described above presents the following problems.

First, the problem caused by the plasma-CVD will be described below.

According to the plasma-CVD method and apparatus, powder particles are generated due to gaseous phase reaction in the plasma, and they form dust which adheres to or are mixed into the film formed on the surface of the substrate, resulting in deterioration of the film quality.

For example, if an amorphous hydrogenated silicon (will be also referred to as "a-Si:H") film is to be formed from the material gas of monosilane ($SiH_4$), plasma is formed from the gas for film deposition, and, at the same time, high order silane is generated due to the reaction in the gaseous phase and is polymerized to generate the dust.

In order to prevent the dust from adhering to and mixing into the film, the plasma-CVD apparatus has generally been devised to suppress generation of the particles in various manners, and more specifically, devices are applied to a system for transferring the substrate to the process chamber, arrangement of the substrate in the process chamber, materials and others of respective members and film deposition conditions (such as a magnitude of the applied power for plasma deposition, a gas pressure during deposition and a deposition temperature). Also, cleaning is generally effected on the interior of the process chamber, the electrodes and the substrate transferring system during intervals between operations of the plasma-CVD apparatus.

However, even if conditions are determined to suppress the particle generation, the particles inevitably adhere to the substrate during film deposition. For example, when the parallel plated plasma-CVD apparatus is used to form an amorphous hydrogenated silicon (a-Si:H) film on the substrate from the material gas of monosilane ($SiH_4$), the particles inevitably adheres to the substrate even if optimum conditions are set to suppress the particle generation.

Meanwhile, as the applied power for plasma formation is increased for increasing a deposition rate, the amount of generated particles increases. Therefore, the applied power can be increased only to a limited value in view of suppression of the particle generation, so that the deposition rate cannot be increased sufficiently.

In order to suppress the particle generation, the following manner has also been proposed, for example, in Japanese Laid-Open Patent publication Nos. 5-51753 (1993) and 5-156451 (1993). For generating the plasma from the material gas, a first pulse modulation at a modulation frequency not higher than 1 kHz (e.g., in a range from 400 Hz to 1 kHz) is effected on an rf-power of a predetermined frequency, and further, a second modulation at a cycle period shorter than that in the first pulse modulation is effected in a superimposed manner on the above first modulated power. Further, a third pulse modulation at a cycle period shorter than that in the second pulse modulation is effected in a superimposed manner on it. By applying the rf-power thus produced, film deposition can be carried out without suppressing generation of radicals which contribute to the film deposition, while suppressing the particle generation. This plasma-CVD utilizes the facts that the radicals contributing to the film deposition have a relatively long life and the radicals causing dust particles have a relatively short life, and can suppress the particle generation and improve the deposition rate to some extent. However, the suppression of the particles and the improvement of the deposition rate can be achieved only to a limited extent and cannot be achieved sufficiently.

Also in the above case, the magnitude of the applied power is limited to some extent so as to suppress the particle generation in view of the fact that the increased power increases the numbers of generated particles. Therefore, the deposition rate is not sufficiently high.

Particles are generated not only by the plasma-CVD for forming the amorphous silicon film and silicon nitride film but also by the plasma-CVD for forming another kind of film such as a carbon film.

The carbon film has such characteristics that its hardness increases in accordance with increase of the substrate processing temperature for film deposition. Accordingly, when coating with hard carbon films is effected, for example, on cutting tools or machine parts in order to improve their surface hardness, the substrate processing temperature is set to 500° C. or more. However, an ECR plasma-CVD or a heat filament CVD is generally employed instead of the parallel plated plasma-CVD apparatus for setting the substrate processing temperature to a high value as described above. According to the ECR plasma-CVD, a substrate can be heated up to about 800° C. by positioning it at an ECR resonance point. Owing to the deposition process under such a high temperature condition, a DLC film of good quality can be easily formed as compared with the film deposition with the parallel plated plasma-CVD apparatus, and the ECR plasma-CVD can also produce a diamond film. According to the heat filament CVD, the substrate can be heated up to about 900°–1100° C. by radiant heat. Owing to such a high-temperature deposition, a DLC film and a diamond film having good quality can be produced easily. Deposition under the high-temperature condition by the ECR plasma-CVD and heat filament CVD can suppress the particle generation as compared with the deposition at the relatively low temperature by the parallel plated plasma-CVD apparatus.

For deposition of the carbon film, therefore, it is preferable to employ the ECR plasma-CVD or heat filament CVD in many cases if the substrate has a heat resistance. However, if the substrate is made of a material such as synthetic resin not having a sufficient heat resistance, the deposition must be performed at a relatively low temperature by the parallel plated plasma-CVD apparatus. In the latter case, the particle generation cannot be suppressed sufficiently, and further, the deposition rate can be increased only to a limited value because the particle generation is promoted as the applied power is increased for increasing the deposition rate.

If the plasma-CVD apparatus, for example, shown in FIG. 17 or FIG. 18, uses a material gas containing chlorine (Cl), and more specifically, if the apparatus forms an amorphous silicon film, silicon nitride film or the like from relatively safe silicon tetrachloride ($SiCl_4$), or forms a titanium nitride film from titanium tetrachloride ($TiCl_4$), a problem of the particle generation arises, and the chlorine is liable to remain in the deposited film. In order to avoid this, the substrate must be maintained at a high temperature of about 750° C. or more during deposition, in which case the quality, e.g., of the amorphous silicon film deteriorates due to the high temperature. This problem is caused not only in the case of use of chlorine compound but also in the case that the film deposition gas contains halogen compound due to the fact that the substrate must be maintained at a high temperature for avoiding remaining of halogen in the film.

Further, if the substrate is cleaned by exposing it to plasma which is formed from a pretreatment gas, as is done by the plasma-CVD apparatus shown in FIG. 18, such a problem arises that the particles are generated during film deposition after the cleaning, and further the cleaning itself causes such a problem that the process of cleaning the substrate by forming the plasma from the pretreatment gas cannot be performed efficiently. Additionally, since it is difficult to clean uniformly the substrate, the film deposited on the cleaned substrate cannot have a sufficiently uniform thickness.

Problems relating to a ferroelectric film by the thermal-CVD will be described below.

When forming the film by the thermal-CVD apparatus shown in FIG. 19, a supplying ratio of the film material gases supplied to the process chamber is not equal to a composition ratio of the deposited ferroelectric film, so that the composition ratio and hence quality of the deposited film cannot be controlled easily.

If the substrate is maintained at a high temperature of about 650° C. or more, which is preferable for improving the film quality, atoms such as lead (Pb) atoms having a high vapor pressure are liable to escape into the atmosphere. Therefore, if organic compound containing such an element is used as the film material, the required amount of the material and hence the film formation cost increase, and further it is difficult to control uniformity of the film thickness.

Further, the deposition rate is low, and, for example, the zirconium oxide titanium oxide lead ($Pb(Zr,Ti)_xO_2$) described above cannot be deposited at a rate exceeding about 60 Å/min.

In order to prevent the above problem relating to deposition of the ferroelectric film, a plasma-CVD apparatus, for example, shown in FIG. 20 may be employed, which was developed by the inventors during development of the invention.

This apparatus differs from the thermal-CVD apparatus shown in FIG. 19 in that a ground electrode 7 also serving as a substrate holder is provided instead of the substrate holder 4, and an rf-electrode 5 is opposed to the electrode 7 in the process chamber 1. The electrode 7, which serves as a power application electrode, applies an rf-power to a film material gas introduced between the electrodes 5 and 7 for forming the plasma, and is connected to an rf-power source 52 via a matching box 51. The electrode 7 is provided with a high-temperature plate heater 71 for heating the substrate S10 to a deposition temperature.

In the operation of forming, for example, a ditantalum pentoxide film by the aforementioned plasma-CVD apparatus shown in FIG. 20, the substrate S10 transferred into the process chamber 1 is mounted on the electrode 7, and then, predetermined amounts of pentaethoxytantalum gas and oxygen gas are introduced into the process chamber 1 from the gas supply unit 2 similarly to the case of forming the ditantalum pentoxide film by the apparatus shown in FIG. 19. Also, the rf-power source 52 applies the rf-power to the rf-electrode 5. Thereby, the plasma is formed from the introduced gases, and the ditantalum pentoxide film is deposited on the surface of substrate S10 in the plasma.

Other structure and operation are the same as those of the apparatus shown in FIG. 19. The same portions and parts as those in the apparatus shown in FIG. 19 bear the same reference numbers.

Even in the plasma-CVD apparatus described above, however, particles generated by gaseous phase reaction in the plasma adhere onto the film deposited on the substrate and/or are mixed into the film, resulting in deterioration of the film quality. Accordingly, it is preferable or necessary to restrict the applied power for suppressing the particle generation in view of the fact that increase of the applied power promotes the particle generation. However, this reduces the deposition rate.

Further, defects occur at the vicinity of the boundary between the substrate and the film, due to plasma damage, so that the dielectric constant of the film decreases to some extent.

SUMMARY OF THE INVENTION

Accordingly, it is a first object of the invention to provide a plasma-CVD method and a plasma-CVD apparatus, in which generation of radicals causing generation of dust particles can be suppressed without preventing generation of radicals contributing to film deposition, so that the film deposition can be performed without excessively reducing a deposition rate or at an improved deposition rate, and film quality can be improved owing to suppression of the particle generation.

A second object of the invention is to provide a plasma-CVD method and a plasma-CVD apparatus, which require neither use of a dangerous gas such as monosilane ($SiH_4$) nor high-temperature deposition deteriorating film quality, but can safely form various kinds of films such as an amorphous silicon film, a silicon compound film such as a silicon nitride film and a titanium (Ti) compound film such as a titanium nitride film without excessively reducing a deposition rate or at an improved deposition rate, while suppressing generation of dust particles, which causes deterioration of the film quality.

A third object of the invention is to provide a plasma-CVD method and a plasma-CVD apparatus for forming a carbon film, which can perform deposition without excessively reducing a deposition rate or at an improved deposition rate and can also suppress generation of dust particles, which deteriorates film quality, even in a film forming process at a relatively low temperature by plasma-CVD such as a film forming process by parallel plated plasma-CVD method and apparatus.

A fourth object of the invention is to provide a plasma-CVD method and a plasma-CVD apparatus, in which plasma is formed from a pretreatment gas by applying an rf-power to the same, a substrate is exposed to the plasma to clean the substrate, and then the substrate is exposed to plasma, which is formed by applying an rf-power to a deposition material gas, to deposit a film on the substrate, and particularly, to provide the apparatus and method, in which the substrate can be cleaned up efficiently and uniformly, and thickness uniformity of the film deposited on the cleaned substrate can be improved owing to the uniform cleaning of the substrate, and in which the film can be deposited without excessively reducing a deposition rate or at an improved deposition rate while suppressing generation of dust particles deteriorating the film quality.

A fifth object of the invention is to provide a plasma-CVD method and a plasma-CVD apparatus for forming a ferroelectric film, which can achieve the followings. For forming a film containing atoms such as lead atoms having a high vapor pressure, it is not necessary to perform a high-temperature deposition, which deteriorates a film quality, requires a large amount of film material and presents the difficulty in controlling uniformity of a film thickness. A film composition ratio and hence film quality can be controlled more accurately than a thermal-CVD. Generation of dust particles deteriorating the film quality can be suppressed. Excessive reduction of a deposition rate can be prevented, or a deposition rate can be improved.

A sixth object of the invention is to provide a plasma-CVD method and a plasma-CVD apparatus for forming a ferroelectric film, which can achieve the followings. For forming a film containing atoms such as lead atoms having a high vapor pressure, it is not necessary to perform a high-temperature deposition, which requires a large amount of film material and presents the difficulty in controlling uniformity of a film thickness. It is possible to prevent reduction of a dielectric constant of a film, which is caused in a conventional plasma-CVD method of forming a ferroelectric film due to defects caused by plasma damage at the vicinity of a boundary between the film and a substrate. Also, generation of dust particles deteriorating the film quality can be suppressed. Further, excessive reduction of a deposition rate can be prevented, or a deposition rate can be improved. Furthermore, a film composition ratio and hence film quality can be controlled accurately.

In order to achieve the first object, the invention provides a plasma-CVD method including the steps of forming plasma from a film deposition material gas in a process chamber, and, in the plasma, depositing a film on a substrate disposed in the process chamber, wherein formation of the plasma from the material gas is performed by application of an rf-power prepared by effecting an amplitude modulation on a basic rf-power having a frequency in a range from 10 MHz to 200 MHz, the amplitude modulation being performed at a modulation frequency in a range from 1/1000 to 1/10 of the frequency of the basic rf-power. The invention also provides a plasma-CVD apparatus including a process chamber for accommodating a substrate for deposition, a gas supply unit for supplying a film deposition material gas into the process chamber, and rf-power applying means for applying an rf-power to the material gas supplied from the gas supply unit into the process chamber to form plasma from the material gas, wherein the rf-power applied by the rf-power applying means is prepared by effecting an amplitude modulation on a basic rf-power having a frequency in a range from 10 MHz to 200 MHz, the amplitude modulation being performed at a modulation frequency in a range from 1/1000 to 1/10 of the frequency of the basic rf-power. Hereafter, the aforementioned method and apparatus will be referred to as a "primary plasma-CVD method" and a "primary plasma-CVD apparatus".

The basic idea and concept for the rf modulation are as follows;
1. At the beginning of plasma initiation, electrons are stripped from molecular gas and are accelerated to have high energy. These high energy electrons collide with surrounding molecules and form plasma. Within a certain time which should be compared with time of collision between an electron and a gas molecule, these high energy electrons survive and plasma itself has non-Maxwellian distribution which means nonthermal condition. On this time scale, electron energy can be controlled and radicals which contribute to a film deposition can be more effectively produced compared with a continuous discharge. So the modulation frequency of rf is chosen by taking an operation pressure into consideration and controlling the electron energy for effective production of deposition responsible radicals.
2. Another factor is to avoid dust formation in gas phase. This can be also done by rf modulation. However, the modulation frequency depends on the plasma process and may be quite different from the above mentioned reason (Case 1). In addition to these advantages, the method of rf modulation can provide several good effects such as an improved uniformity (electrostatically free period allows diffusion) and an improved quality of deposited film (depositin rest period enables some readjustment of lattice). These considerations and arguments are generally applied to the rf modulation frequency in this spesification and the appended claims.

In the above plasma-CVD method and apparatus, the basic rf-power before the modulation may have a waveform such as a sinusoidal, square, saw-tooth-like or triangular waveform.

The basic rf-power before the modulation has the frequency from 10 MHz to 200 MHz for the following reason. If the frequency were lower than 10 MHz, the plasma would not be formed efficiently. If it were higher than 200 MHz, the efficiency of plasma formation would not be improved even by the modulation as compared with the efficiency by the conventional method and apparatus, and a power cost would increase.

The modulation frequency is in the range from 1/1000 to 1/10 of the frequency of the basic rf-power from 10 MHz to 200 MHz. If it were lower than 1/1000 of the frequency of the basic rf-power, the rate of amplitude modulation would be low, so that it would be difficult to generate radicals contributing to the deposition while suppressing generation of radicals causing generation of dust. If the modulation frequency were higher than 1/10 of the basic frequency, it would be difficult to generate the plasma stably.

For achieving the first object more surely, the primary plasma-CVD method may be executed in such a manner that the formation of the plasma from the deposition material gas is effected with an rf-power which is prepared by effecting the aforementioned amplitude modulation (first amplitude modulation) on the basic rf-power, and additionally effecting a second amplitude modulation at a modulation frequency in a range from 1/100 to 100 times the modulation frequency of the first amplitude modulation. Also in the above primary plasma-CVD apparatus, the rf-power applying means may be adapted to effect the amplitude modulation on the basic rf-power and to effect a second amplitude modulation at a modulation frequency in a range from 1/100 to 100 times the modulation frequency of the first amplitude modulation on the modulated rf-power. If the frequency of the second amplitude modulation were higher than 100 times the first modulation frequency, the second amplitude modulation would not achieve a sufficient effect. If it were lower than 1/100, a deposition rate would excessively decrease.

The aforementioned first "amplitude modulation" and aforementioned second "amplitude modulation" as well as "amplitude modulation" which will be used in the specification and the appended claims each conceptionally include a pulse modulation by on and off of the applied power and a modulation in a pulse-like form.

The modulation frequency in the first amplitude modulation is set in a range from 1/1000 to 1/10 of the basic rf-power frequency, as already described. Preferably, it is set in a range from 1/270 to 1/68 of the basic rf-power frequency (about 50 kHz to about 200 kHz if the basic rf-power frequency is 13.56 MHz), and more preferably, it is set in a range from 1/270 to 1/135 of the basic rf-power frequency (about 50 kHz to about 100 kHz, e.g., 68 kHz or about 68 kHz, if the basic rf-power frequency is 13.56 MHz).

Typically, the first modulation and second modulation described above may be executed by turning on and off the applied power (in other words, pulse modulation or pulse-like modulation) in view of effective suppression of particle generation. In this case, a duty ratio, i.e., a ratio of power-on period to one cycle period of the modulation wave (on period/(on+off) period) can be arbitrarily set, and typically may be about 50%, in which case suppression of the generation of dust particles can be performed in a well-balanced manner, and prevention of excessive reduction of the deposition rate or improvement of the deposition rate can be performed in a well-balanced manner.

Typically, the modulated rf-power for forming the gas plasma may be originally produced by an rf-wave generator such as a so-called "function generator" capable of generating an intended rf-wave, and may be amplified by an amplifier. Alternatively, it may be prepared by producing the basic rf-power of the frequency in a range from 10 MHz to 200 MHz and then effecting an amplitude modulation on the same.

The above description on the concept of the "amplitude modulation", the modulation frequency and means for generating the modulated rf-power and others described above can be applied to plasma-CVD methods and plasma-CVD apparatuses of the invention which will be described hereinafter.

The aforementioned primary plasma-CVD method and apparatus can form films at the effectively improved deposition rate while effectively suppressing the generation of dust, and typically, such films may be an amorphous hydrogenated silicon (a-Si:H) film, an amorphous hydrogenated silicon nitride (will be also referred to as "a-SiN:H") film and an amorphous hydrogenated silicon oxide (will be also referred to as "a-SiO:H") film. For forming such films, the first modulation frequency is preferably in a range from 1/270 to 1/68 of the basic rf-power frequency, more preferably in a range from 1/270 to 1/135, and typically about 1/200.

According to the primary plasma-CVD method and apparatus described above, the plasma forming power is prepared by effecting the amplitude modulation at the modulation frequency from 1/1000 to 1/10 of the basic rf-power frequency on the basic rf-power of the frequency from 10 MHz to 200 MHz, so that generation of radicals causing the generation of dust particles can be suppressed without preventing the generation of radicals contributing to the deposition, and hence the dust generation can be suppressed sufficiently in contrast to the case not performing such modulation. Thereby, the film of high quality containing less defects can be formed, and the deposition rate can be prevented from excessive reduction or can be improved.

Since the dust particle generation is suppressed, the flow rate of the deposition gas and the magnitude of the power applied for forming the plasma from the gas can be improved, and correspondingly the deposition rate can be further improved.

Since the generation of dust particles can be suppressed, adhesion of particles to various portions of the process chamber can be suppressed, and hence the frequency of required maintenance can be reduced, so that the working efficiency of the apparatus is improved and hence the manufacturing cost of the film can be reduced.

These advantages can be easily achieved without significantly modifying the conventional apparatus.

With respect to the suppression of particles and the improvement of the deposition rate, the primary plasma-CVD method and apparatus can provide the following advantages. For forming a film such as an a-Si:H film or an a-SiN:H film, which is generally produced from the deposition gas of monosilane ($SiH_4$), the method and apparatus can suppress the generation of SiH radicals and $SiH_2$ radicals, which cause the dust generation, as compared with the whole radicals produced by decomposition of $SiH_4$, and do not suppress generation of $SiH_3$ radicals contributing to the film deposition. Therefore, the dust generation can be effectively suppressed and the deposition rate can be prevented from excessive reduction or can be improved as compared with the case not executing the modulation.

If the rf-power is prepared by the first and second amplitude modulations, the generation of particles can be suppressed more surely, and the film quality is further improved. Also, the deposition rate is also improved. This improvement of deposition rate will be probably achieved owing to the fact that the second amplitude modulation further increases an electron temperature in the plasma, and this correspondingly promotes the gas decomposition.

In order to achieve the aforementioned second object, the present invention provides a plasma-CVD method which includes the steps and features of the primary plasma-CVD method and further includes such features that the deposition material gas is a halogen compound gas used for forming a predetermined film, or is mixture of a halogen compound gas and a different kind of gas different from the halogen compound gas, the different kind of gas being used for forming the predetermined film together with the halogen compound gas. The invention also provides a plasma-CVD apparatus, achieving the second object, which includes the features of the primary plasma-CVD apparatus and further includes such features that the deposition material gas supplied by the material gas supply unit is halogen compound gas used for forming a predetermined film, or is mixture of a halogen compound gas and a different kind of gas different from the halogen compound gas, the different kind of gas being used for forming the predetermined film together with the halogen compound gas.

The halogen compound gas which is used as the single material of the film in the above method and apparatus may be a silicon tetrachloride ($SiCl_4$) gas or a difluoro silane ($SiH_2F_2$) gas for forming an amorphous silicon (will be also reffered to as "a-Si") film or a carbon tetrachloride ($CCl_4$) gas or a chlorotrifluoromethane ($CClF_3$) gas for forming a carbon (C) film, and others. The combination of the aforementioned halogen compound gas and the different kind of gas which forms the predetermined film together with the halogen compound gas may be combination of a silicon tetrachloride ($SiCl_4$) gas and a hydrogen ($H_2$) gas for forming an a-Si film, combination of a silicon tetrachloride ($SiCl_4$) gas and an ammonia ($NH_3$) gas for forming a silicon nitride film, a $SiCl_4$ gas and a methane ($CH_4$) gas for forming a silicon carbide film, or combination of a titanium tetrachloride ($TiCl_4$) gas and a methane ($CH_4$) gas for forming a titanium carbide film, and others.

If the halogen compound is liquid at room temperature, this may be bubbled with a hydrogen ($H_2$) gas, nitrogen ($N_2$) gas or an inert gas such as a helium (He) gas, neon (Ne) gas, argon (Ar) gas krypton (Kr) gas or the like to obtain the gas of the halogen compound.

According to these plasma-CVD method and apparatus, when depositing, for example, an amorphous silicon film, a silicon compound film such as a silicon nitride film, or a titanium compound film such as a titanium nitride film, the halogen compound gas is used as the material gas for forming the intended film, or alternatively, mixture of the halogen compound gas for forming the intended film is used as the material gas. The material gas is converted into the plasma by application of the rf-power prepared by effecting the amplitude modulation at the modulation frequency from 1/1000 to 1/10 of the basic rf-power frequency on the basic rf-power of the frequency from 10 MHz to 200 MHz, and the deposition is performed in the plasma thus formed. In this manner, the amorphous silicon film, silicon compound film, titanium compound film and others can be deposited safely without using a dangerous gas. Since formation of the plasma from the gas is performed by application of the amplitude-modulated rf-power, the particle generation is suppressed, and the film quality is improved. Also, excessive reduction of the deposition rate is prevented, or the deposition rate is improved. Also, it is possible to reduce the number of halogen atoms remaining in the deposited film, so that it is not necessary to maintain the substrate at a high temperature during deposition, which prevents deterioration of the film quality. The reduction in number of the halogen atoms remaining in the film is probably caused by the irradiation of fast electrons in the plasma. Here, the "fast electrons" are high energy part of non Maxwellian electrons shown as the tail b of curve a in FIG. 14 representing a relationship between an electron energy and a time relating to application of the rf-power.

In order to suppress the particle generation and improve the deposition rate more surely, the above method and apparatus may be adapted to form the plasma from the material gas by applying the rf-power, which is prepared by effecting the amplitude modulation on the basic rf-power and additionally effecting a second amplitude modulation on the modulated rf-power in a superposed manner, a modulation frequency of the second amplitude modulation being in a range from 1/100 to 100 times the modulation frequency of the first amplitude modulation.

In order to achieve the aforementioned third object, the present invention provides a plasma-CVD method which includes the steps and features of the primary plasma-CVD method, and further includes such features that the film to be deposited is a carbon film, and the deposition material gas is a hydrocarbon compound gas used for forming a predetermined carbon film, or is mixture of a hydrocarbon compound gas and a different kind of gas different from the hydrocarbon compound gas, the different kind of gas being used for forming the predetermined carbon film together with the hydrocarbon compound gas. The invention also provides a plasma-CVD apparatus, achieving the third object, which includes the features of the primary plasma-CVD apparatus and further includes such features that the deposition material gas supplied by the material gas supply unit is a hydrocarbon compound gas used for forming a predetermined carbon film, or is mixture of a hydrocarbon compound gas and a different kind gas different from the hydrocarbon compound gas, the different kind of gas being used for forming a predetermined carbon film together with the hydrocarbon compound gas.

In these method and apparatus, the hydrocarbon compound used therein may be alkane such as methane ($CH_4$), ethane ($C_2H_6$), propane ($C_3H_8$) or butane ($C_4H_{10}$), cycloalkane such as cyclopropane ($C_3H_6$) or cyclobutane ($C_4H_8$), alkene such as ethylene ($C_2H_4$), propene ($C_3H_6$) or butene ($C_4H_8$), alkyne such as acetylene ($C_2H_2$), and others. One, two or more among them can be used. Although each of them can be used as a single material gas for the carbon film, they may be used together with a different kind of gas such as a hydrogen gas or an inert gas (e.g., He gas, Ne gas, Ar gas, or Kr gas) for forming the carbon film.

According to these plasma-CVD method and apparatus, when depositing the carbon film, the hydrocarbon compound gas is used as the material gas, or alternatively, mixture of the hydrocarbon compound gas and the gas of the kind different from the hydrocarbon compound gas for forming the intended carbon film together with the hydrocarbon compound gas is used as the material gas. The material gas is converted into the plasma by application of the rf-power prepared by effecting the amplitude modulation at the modulation frequency from 1/1000 to 1/10 of the basic rf-power frequency on the basic rf-power of the frequency from 10 MHz to 200 MHz, and the carbon film is deposited in the plasma. According to these method and apparatus, the carbon film can be deposited at a relatively low temperature, and the generation of dust particles is sufficiently suppresses as compared with the conventional plasma-CVD. Also, excessive reduction of the deposition rate can be prevented or the deposition rate can be improved.

Owing to the first amplitude modulation, a diamond-like carbon film (DLC film) of a high quality can be formed. This is probably achieved by the irradiation of the high energy electrons (see FIG. 14) in the plasma.

In order to suppress the particle generation and improve the deposition rate more surely, the above method and apparatus may be adapted to form the plasma from the material gas by application of the rf-power, which is prepared by effecting the amplitude modulation on the basic rf-power and additionally effecting a second amplitude modulation at a modulation frequency, which is in a range from 1/10 to 100 times the modulation frequency of the first amplitude modulation, on the modulated rf-power.

In order to achieve the aforementioned fourth object, the present invention provides a plasma-CVD method, which includes the steps and features of the primary plasma-CVD method, and further includes the steps of introducing a pretreatment gas into the process chamber, forming plasma from the pretreatment gas by application of an rf-power prepared by effecting an amplitude modulation on a basic rf-power of a frequency in a range from 10 MHz to 200 MHz, a modulation frequency of the amplitude modulation being in a range from $1/10^5$ to 1/10 of the frequency of the basic rf-power, exposing the substrate to the plasma of the pretreatment gas for cleaning the substrate, introducing the deposition material gas into the process chamber, applying the modulated rf-power prepared for forming the plasma from the deposition material gas to form the plasma, and depositing the film on the cleaned surface of the substrate. The invention also provides a plasma-CVD apparatus, which includes the features of the primary plasma-CVD apparatus and further includes such features that it includes a pretreatment gas supply unit for supplying a pretreatment gas into the process chamber, and rf-power applying means for forming plasma from the pretreatment gas supplied from the pretreatment gas supply unit into the process chamber, and that the rf-power applying means for the pretreatment gas applies the rf-power prepared by effecting an amplitude modulation on the basic rf-power of a frequency in a range from 10 MHz to 200 MHz, a modulation frequency of the amplitude modulation being in a range from $1/10^5$ to 1/10 of the frequency of the basic rf-power.

In the above plasma-CVD apparatus and plasma-CVD method, the basic rf-power before modulation may have a wave form such as a sinusoidal, square, saw-tooth-like or triangular waveform.

The unmodulated basic rf-power for the cleaning has the frequency from 10 MHz to 200 MHz as described above. If the frequency were lower than 10 MHz, it would be impossible to efficiently generate the plasma. If it were higher than 200 MHz, the efficiency of plasma formation would not be improved even by the modulation as compared with the efficiency by the conventional method and apparatus, and the power cost would increase.

The modulation frequency is in the range from $1/10^5$ to 1/10 of the frequency of the basic rf-power in the range from 10 MHz to 200 MHz. If the modulation frequency were lower than $1/10^5$ of the basic rf-power frequency, the cleaning efficiency would decrease. If it were higher than 1/10, the rate of amplitude modulation would be low, and thus the power would be applied in a manner similar to a continuous application, so that it would be impossible to suppress sufficiently the generation of radicals causing the generation of dust.

Formation of the plasma from the pretreatment gas may be performed with an rf-power, which is prepared by effecting the amplitude modulation (first amplitude modulation) on the basic rf-power and additionally effecting a second amplitude modulation on the modulated rf-power, a modulation frequency of the second amplitude modulation being in a range from 1/100 to 100 times the modulation frequency of the first amplitude modulation. If the frequency of the second amplitude modulation were higher than 100 times the frequency of the first amplitude modulation or lower than 1/100 thereof, the cleaning cannot be performed sufficiently.

Typically, each amplitude modulation described above may be a modulation performing turn-on and turn-off of the applied power (i.e., pulse modulation or pulse-like modulation) in view of effective suppression of the particle generation.

The modulated rf-power for forming the plasma from the pretreatment gas may be originally produced by an rf-wave generator such as a so-called "function generator" capable of generating an intended rf-wave, and may be amplified by an amplifier. Alternatively, it may be prepared by producing the basic rf-power of the frequency in a range from 10 MHz to 200 MHz and then effecting an amplitude modulation on the same.

In the above method and apparatus, it is preferable that the amplitude-modulation rf-power is applied to the pretreatment gas for a predetermined time period so as to form the plasma, and consequently the deposition is performed by application of the modulated rf-power forming the plasma from the deposition material gas, whereby it is possible to prevent an instable state of the plasma, which may be caused if the power is turned off and then turned on during a period from the cleaning process to the start of deposition.

The rf-power applying means for forming the plasma from the pretreatment gas may serve also as the rf-power applying means for forming the plasma from the deposition gas.

The pretreatment gas used in these method and apparatus may be a hydrogen ($H_2$) gas, oxygen ($O_2$) gas, ammonia ($NH_3$) gas, nitrous oxide ($N_2O$) gas, methane ($CH_4$) gas, hydrogen chloride (HCl) gas or the like., and one, two or more among them can be used. The film to be deposited, the material of the film for deposition and the pretreatment gas for the cleaning may be selected, for example, in accordance with the combination show in the following table.

| Film | Film Material | Pretreatment Gas |
|---|---|---|
| Amorphous Silicon | $SiH_4$, $H_2$ | $H_2$ |
|  | $SiCl_4$, $H_2$ | $H_2$ |
| Silicon Dioxide | $SiH_4$, $H_2$, $O_2$ | $H_2$, $O_2$ |
|  | $SiCl_4$, $N_2O$ | $N_2O$, $H_2$ |
|  | $SiCl_4$, $O_2$, $H_2$ | $H_2$, $O_2$ |
|  | TEOS*, $O_2$ | $O_2$, $H_2$ |
| Silicon Nitride | $SiH_4$, $NH_3$ | $NH_3$, $H_2$ |
|  | $SiCl_4$, $NH_3$ | $NH_3$, $H_2$ |
| Silicon Carbide | $SiH_4$, $CH_4$, $H_2$ | $H_2$, $CH_4$ |
|  | $SiCl_4$, $CH_4$, $H_2$ | $H_2$, $CH_4$ |
| Titanium Dioxide | $TiCl_4$, $O_2$, $H_2$ | $H_2$, $O_2$ |
| Titanium Nitride | $TiCl_4$, $NH_3$, $H_2$ | $H_2$, $NH_3$ |
| Titanium Carbide | $TiCL_4$, $CH_4$, $H_2$ | $H_2$, $CH_4$ |
| Aluminum Oxide | $AlCl$, $O_2$, $H_2$ | $H_2$, $O_2$, HCl |
| Aluminum Nitride | $AlCl$, $NH_3$, $H_2$ | $H_2$, $NH_3$, HCl |
| Iridium Dioxide | $IrF_2$, $H_2$, $O_2$ | $H_2$, $O_2$ |

TEOS*: tetraethoxysilicon

If the film material is liquid at room temperature, this may be bubbled with a hydrogen ($H_2$) gas, nitrogen ($N_2$) gas or inert gas such as a helium (He) gas, neon (Ne) gas, argon (Ar) gas, krypton (Kr) gas or the like to obtain a gas of the material compound. Among the film materials in the table, $SiCl_4$, tetraethoxysilicon, $TiCl_4$ and iridium difluoride ($IrF_2$) are liquid at room temperature. For example, $SiCl_4$ and $IrF_2$ are bubbled with $H_2$ gas, and tetraethoxysilicon and $TiCl_4$ are bubbled with $H_2$ gas or $N_2$ gas.

Among the material gases, if the compound gas which is gaseous at room temperature is used as the carrier gas, the same gas may be used as the deposition material gas.

According to these plasma-CVD method and apparatus, the plasma is formed from the pretreatment gas to clean the substrate before deposition, and the rf-power applied to the pretreatment gas for forming the plasma is prepared by effecting the amplitude modulation at a frequency, which is in a range from $1/10^5$ to 1/10 of the frequency of the basic rf-power, on the basic rf-power of the frequency from 10 MHz to 200 MHz.

Owing to employment of the modulated power thus prepared, a generation region of the plasma for the cleaning spreads wide, so that the substrate is cleaned uniformly. Therefore, the thickness uniformity of the film deposited on the cleaned substrate is improved.

The employment of the modulated power described above improves the cleaning efficiency. The reason of this is probably that, owing to the employment of the above modulated power, non Maxwellian high energy electrons in the plasma act to promote decomposition in the gaseous phase and thus increases the concentration of radicals contributing to the cleaning.

Deposition of the film after the substrate cleaning is performed in the plasma which is prepared by effecting the amplitude modulation of a frequency, which is in a range from 1/1000 to 1/10 of the frequency of the basic rf-power, on the basic rf-power of the frequency from 10 MHz to 200 MHz. In this manner, generation of the dust particles is sufficiently suppressed, and the deposition rate is prevented from excessive reduction or is improved.

In these plasma-CVD method and apparatus performing the pretreatment, formation of the plasma from the depositin material gas may be performed with an rf-power, which is prepared by effecting a first amplitude modulation on the basic rf-power and additionally effecting a second amplitude modulation on the modulated rf-power, a modulation frequency of the second amplitude modulation being in a range from 1/100 to 100 times the modulation frequency of the first amplitude modulation.

In order to achieve the aforementioned fifth object, the present invention provides a plasma-CVD method, which includes the steps and features of the primary plasma-CVD method, and further includes such features that the film to be formed is a ferroelectric film, and the deposition material gas includes an organic compound gas containing an element of the ferroelectric film to be formed and a gas containing oxygen and differing in kind from the organic compound gas. The invention also provides a plasma-CVD apparatus, which includes the features of the primary plasma-CVD apparatus and further includes such features that the material gas supply unit supplies the deposition material gas which contains at least an organic compound gas containing an element of the ferroelectric film to be formed and a gas containing oxygen and differing in kind from the organic compound gas.

For forming the ferroelectric film according to these plasma-CVD method and apparatus, the deposition material gas includes the organic compound gas containing an element of the ferroelectric film to be formed and the gas containing oxygen and differing in kind from the organic compound gas. The ferroelectric film is deposited on the substrate in plasma formed from the deposition material gas by applying thereto an rf-power, which is prepared by effecting the amplitude modulation (first amplitude modulation) at the frequency, which is in a range from 1/1000 to 1/10 of the frequency of the basic rf-power, on the basic rf-power of the frequency from 10 MHz to 200 MHz . The ferroelectric film is deposited on the substrate in the plasma thus generated. Since the first amplitude modulation is effected on the rf-power applied for generating the plasma, a concentration of radicals contributing to film deposition in the plasma increases, so that it is not necessary to maintain the substrate at a high temperature during deposition. Therefore, atoms having a high vapor pressure in the film are suppressed from being escaping into the atmosphere, so that the required quantity of the film material can be reduced and the thickness uniformity of the film can be improved even if the film to be deposited contains the atoms such as lead atoms having a high vapor pressure. Since the concentration of radicals contributing to the deposition in the plasma increases, the film quality such as a film composition ratio can be improved. Further, generation of the dust particles which deteriorate the film quality is suppressed, and the deposition rate is prevented from excessive reduction or is improved.

In order to further ensure suppression of generation of the dust particles and improvement of the deposition rate in these method and apparatus, the plasma for deposition may be formed from the deposition material gas by applying the rf-power which is prepared by effecting the first amplitude modulation on the basic rf-power and further effecting thereon a second amplitude modulation at a modulation frequency in a range from 1/100 to 100 times the modulation frequency of the first amplitude modulation.

In order to achieve the aforementioned sixth object, the present invention provides a plasma-CVD method, which includes the steps and features of the primary plasma-CVD method, and further includes such features that the film to be formed is a ferroelectric film, the deposition material gas includes an organic compound gas containing an element of the ferroelectric film to be formed and a gas containing oxygen and differing in kind from the organic compound gas, and that it includes the steps of thermally decomposing the deposition material gas prior to the formation of the plasma from the deposition material gas, exposing the substrate to the decomposed material gas to form a boundary layer made of a ferroelectric layer, thereafter forming the plasma by applying the amplitude-modulated rf-power to the material gas, and subsequently exposing the boundary layer on the substrate to the plasma to form the ferroelectric film.

The invention also provides an apparatus for executing the above method, which includes a process chamber accommodating a substrate for forming a film on the same, a gas supply unit for supplying to the process chamber a deposition material gas which contains at least an organic compound gas containing an element of the ferroelectric film to be formed and a gas containing oxygen and differing in kind from the organic compound gas, heating means for thermally decomposing the deposition material gas supplied from the gas supply unit to the process chamber, and rf-power supplying means for supplying an rf-power to the material gas supplied from the gas supply unit to the process chamber for forming plasma from the material gas. The rf-power applying means applies the rf-power, which is prepared by effecting the amplitude modulation on a basic rf-power of a frequency from 10 MHz to 200 MHz, a modulation frequency of the amplitude modulation being in a range from 1/1000 to 1/10 of the frequency of the basic rf-power.

According to these method and apparatus for forming the ferroelectric film, the ferroelectric film such as a ditantalum pentoxide ($Ta_2O_5$) film is formed in such a manner that, prior to formation of the plasma from the deposition material gas by applying the rf-power thereto, the material gas is thermally decomposed to form the boundary layer made of the ferroelectric layer on the substrate, and subsequently, the ferroelectric film is deposited on the boundary layer in the plasma formed from the material gas. If the boundary layer were not formed, defects would be caused by plasma damage at the vicinity of a boundary between the substrate and the film formed in the plasma, and consequently, the dielectric constant of the film would decrease. The boundary layer can prevent this disadvantage.

The plasma is formed from the deposition material gas by applying thereto the rf-power, which is prepared by effecting the amplitude modulation (first amplitude modulation) at the frequency, which is in a range from 1/1000 to 1/10 of the frequency of the basic rf-power, on the basic rf-power of the frequency from 10 MHz to 200 MHz. A major portion of the ferroelectric film is formed at a relatively low temperature in the plasma thus formed. Since the first amplitude modulation is effected on the rf-power applied for generating the plasma, a concentration of radicals contributing to film deposition in the plasma increases, so that it is not necessary to maintain the substrate at a high temperature during deposition. Therefore, atoms having a high vapor pressure in the film are suppressed from being escaping into the atmosphere, so that the required quantity of the film material gas can be reduced and the thickness uniformity of the film can be improved even when the film to be deposited contains the atoms such as lead atoms having a high vapor pressure. Since the concentration of radicals contributing to the deposition in the plasma increases, the film quality such as a film composition ratio can be improved. Further, generation of the dust particles which deteriorate the film quality is suppressed, and the deposition rate is prevented from excessive reduction or is improved.

In order to further ensure suppression of generation of the dust particles and improvement of the deposition rate in these method and apparatus, the plasma may be formed from the deposition material gas by applying the rf-power which is prepared by effecting the amplitude modulation on the basic rf-power and further effecting thereon a second amplitude modulation at a modulation frequency in a range from 1/100 to 100 times the modulation frequency of the first amplitude modulation.

In these method and apparatus, the thickness of the boundary layer formed by thermal decomposition of the material gas may be from about 10 to about 200 Å depending on a kind of the film to be deposited. If it were smaller than 10 Å, it would be impossible to perfectly avoid the film defect, which may be caused by plasma damage. If it were larger than 200 Å, deposition of the film requires an excessively long time.

In each of the aforementioned plasma-CVD methods and apparatuses for forming the ferroelectric film, the organic compound containing the element of the ferroelectric film to be deposited may be, for example, pentaethoxytantalum ($Ta(OC_2H_5)_5$) for forming a ditantalum pentoxide ($Ta_2O_5$) film, tetraethyllead ($Pb(C_2H_5)_4$) or lead dipivalylmethanate ($Pb(DPM)_2$) for forming a lead monoxide (PbO) film, titanium tetrachloride ($TiCl_4$), pentaethoxytitanium ($Ti(OC_2H_5)_5$), tetraisoproxytitanium ($Ti(O-i-C_3H_7)_4$) or combination thereof for forming a titanium dioxide ($TiO_2$) film, tetra-tert-butoxyzirconium ($Zr(O-t-C_4H_9)_4$) for forming a zirconium oxide ($ZrO_2$) film, diethoxybarium ($Ba(OC_2H_5)_2$) for forming a barium oxide (BaO) film, diethoxy strontium ($Sr(OC_2H_5)_2$) for forming a strontium oxide (SrO) film, lanthanum dipivalylmethanate ($La(DPM)_2$) for forming a lanthanum oxide ($La_2O_3$) film, and others.

The combination of the organic compound containing the element of the ferroelectric oxide composite film may be, for example, combination of diethoxy strontium and at least one kind of compound selected from a group including titanium tetrachloride, pentaethoxytitanium and tetraisoproxytitanium for forming a strontium titanate ($SrTiO_3$) film, combination of diethoxybarium and at least one kind of compound selected from a group including titanium tetrachloride, pentaethoxytitanium and tetraisoproxytitanium for forming a barium metatitanate ($BaTiO_3$) film, or combination of at least one compound selected from a group including titanium tetrachloride, pentaethoxytitanium and tetraisoproxytitanium, one or both of tetraethyllead and lead dipivalylmethanate , tetra-tert-butoxyzirconium for forming a zirconium oxide titanium oxide lead ($Pb(Zr,Ti)_xO_2$) film, and others.

If the organic compound containing the element of the ferroelectric film to be deposited is liquid at a room temperature, this may be bubbled with a carrier gas such as a hydrogen ($H_2$) gas, nitrogen ($N_2$) gas or inert gas such as a helium (He) gas, neon (Ne) gas, argon (Ar) gas or krypton (Kr) gas to obtain the gas of the organic compound. This compound may be the tetraethyllead, titanium tetrachloride, pentaethoxytitanium or tetraisoproxytitanium.

If the organic compound is solid at a room temperature, it is solved into organic solvent, e.g., of alcohol such as ethanol, and then bubbling is effected on the same with the carrier gas already described to obtain the gas of the organic compound. This compound may be lead dipivalylmethanate ($Pb(DPM)_2$), diethoxybarium, diethoxystrontium or lanthanum dipivalylmethanate ($La(DPM)_2$).

The different kind of gas containing oxygen element may be, for example, $O_2$ gas, ozone ($O_3$) gas, nitrogen monoxide (NO) gas, nitrous oxide ($N_2O$) gas or the like regardless of the kind of the film to be formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
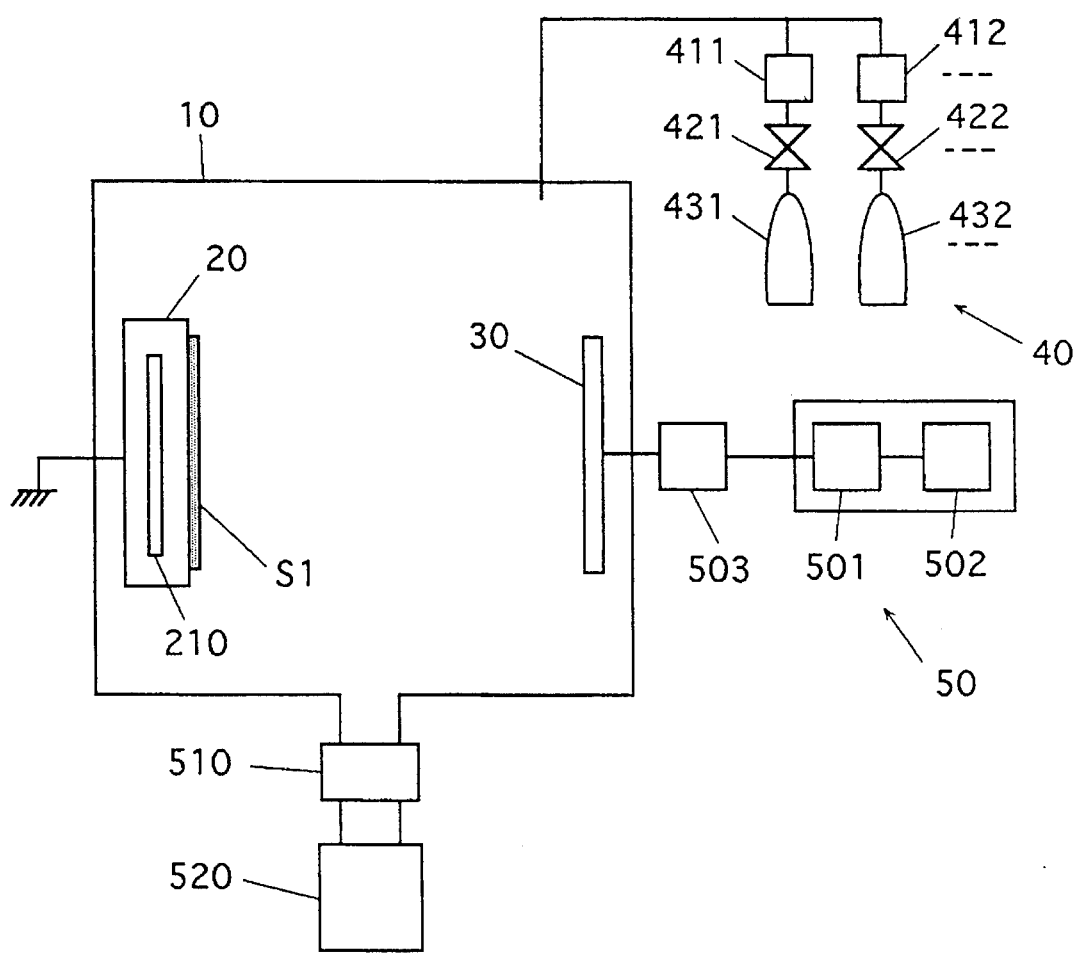
FIG. 1 schematically shows an example of a structure of a plasma-CVD apparatus executing a method of the invention.

FIG. 1 schematically shows an example of a parallel plated rf-plasma-CVD apparatus used for executing a method of the invention.

Figure 15:
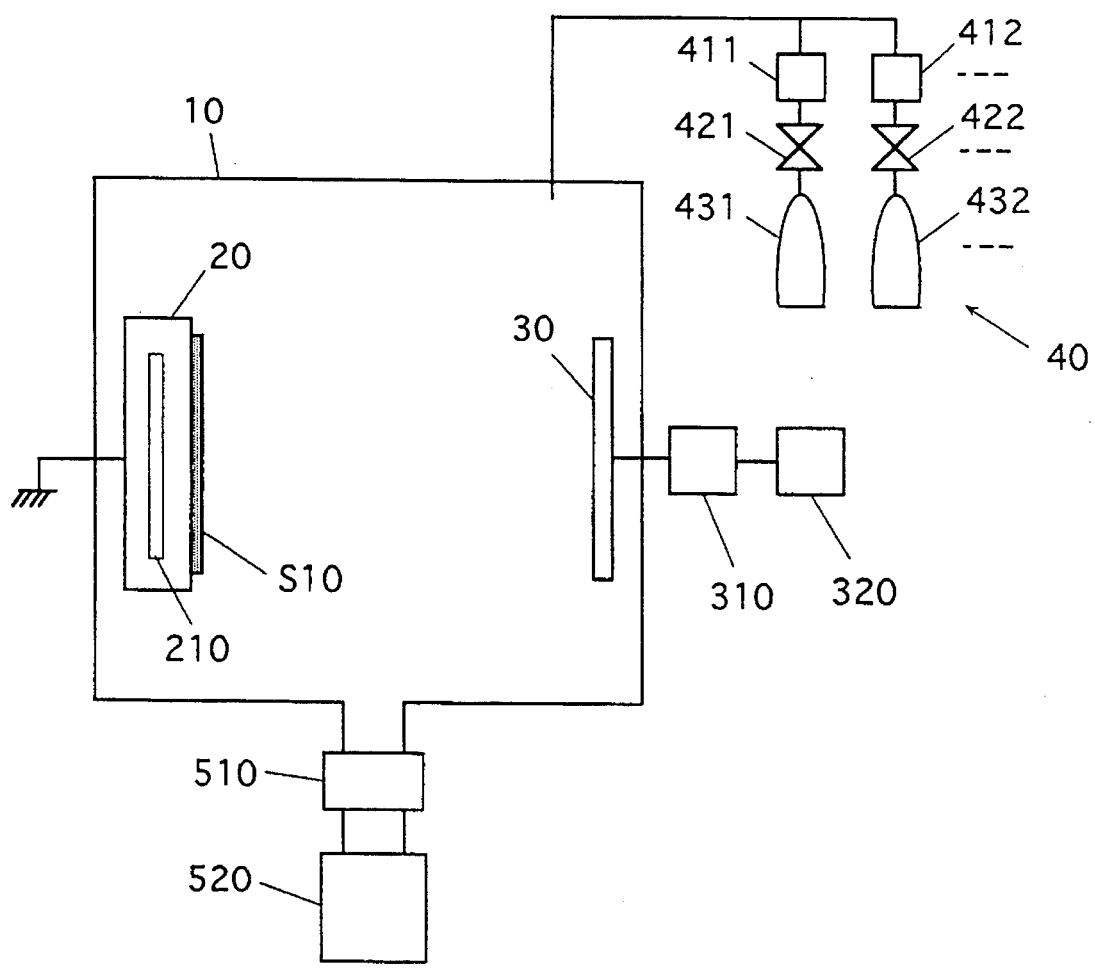
FIG. 15 schematically shows an example of a structure of a plasma-CVD apparatus in the prior art.

This apparatus differs from the conventional apparatus shown in FIG. 15 in that an rf-power source 50 is provided in place of the rf-power source 320, and is connected to an rf-electrode 30 via a matching box 503. The rf-power source 50 is formed of an rf-power amplifier (i.e., wide range signal amplifier) 501 and a waveform composing unit (i.e., rf arbitrary waveform generator) 502. The arbitrary waveform generator 502 controls the timings of applying and cutting the rf-power. The arbitrary waveform generator 502 also controls and sets on-period and off-period of the rf-power. The rf-power amplifier 501 controls the magnitude of the applied power.

Other structures are the same as those of the conventional apparatus shown in FIG. 15. Parts and portions similar to those in the conventional apparatus bear the same reference numbers as those in FIG. 15.

Although a gas supply unit 40 is directly connected to a process chamber 10 via a piping, it may be connected to an rf-electrode also serving as a gas nozzle, so that a deposition material gas may be supplied in a shower-like fashion into a process chamber 10 from many apertures provided at the nozzle.

According to this parallel plated plasma-CVD apparatus, a substrate S1 on which a film is to be deposited is transferred into the process chamber 10 by an unillustrated substrate transferring device, and is mounted on a ground electrode 20. A valve 510 is operated and an exhaust pump 520 is driven to set the chamber 10 to a predetermined degree of vacuum, and the gas supply unit 40 introduces a deposition material gas into the chamber 10. A waveform formed by the arbitrary waveform generator 502 is amplified by the amplifier 501 and is applied to the rf-electrode 30, so that plasma is formed from the introduced gas. An intended film is deposited on a surface of the substrate S1 in this plasma.

In this embodiment, the rf-power applied from the power source 50 to the electrode 30 is prepared or produced by effecting a pulse modulation on a predetermined basic rf-power of a frequency in a range from 10 MHz to 200 MHz. A modulation frequency of this pulse modulation is in a range from 1/1000 to 1/10 of the frequency of the basic rf-power.

Figure 2A:
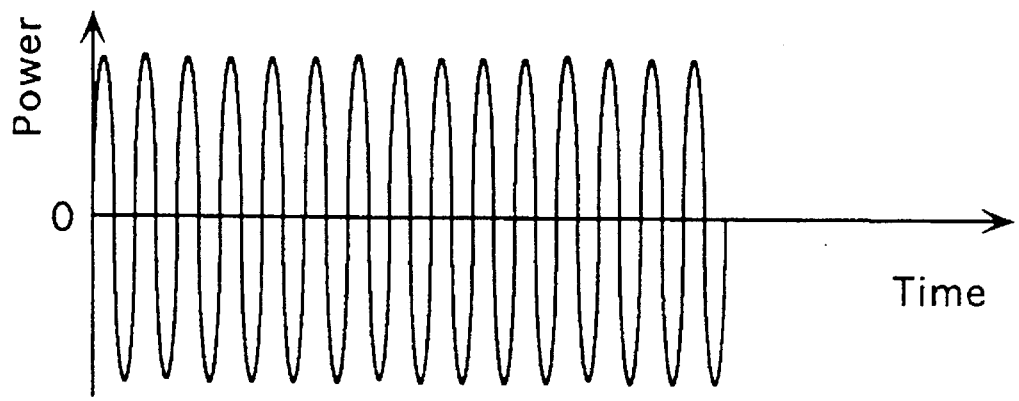
FIG. 2A schematically shows an example of a waveform of a basic rf-power to be applied for forming plasma from a deposition material gas before being modulated.
Figure 2B:
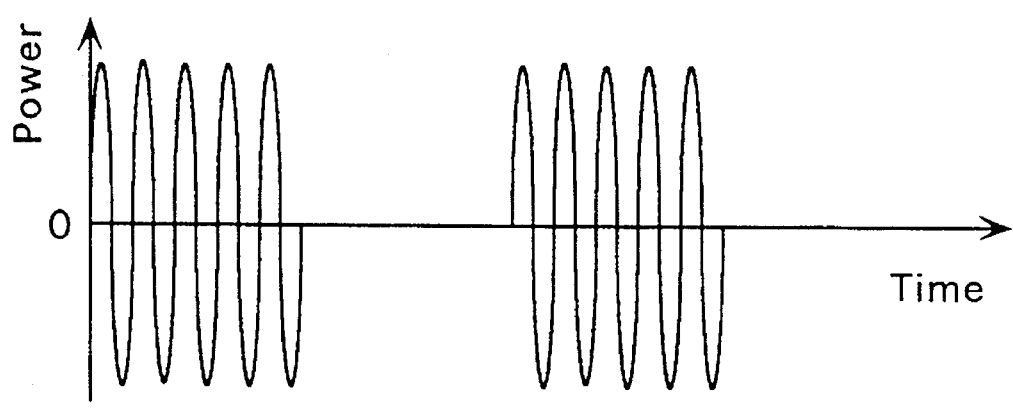
FIG. 2B schematically shows an example of a waveform of a modulation waveform of a modulated rf-power to be applied for forming plasma from a deposition material gas.

The power is applied in accordance with a pattern shown in FIG. 2B, which is obtained by effecting the pulse modulation with a duty cycle of 50% on the basic rf-power in FIG. 2A similar to the conventionally applied rf-power which is continuous and has a constant frequency and a constant amplitude.

Thereby, generation of radicals, which cause generation of dust particles, is suppressed, and generation of radicals contributing to deposition is not suppressed. Thus, the amount of the radicals contributing to deposition relatively increases. Therefore, the generation of dust particles is suppressed as compared with the case not performing the pulse modulation, so that the film quality is improved and the deposition rate is prevented from excessive reduction or is improved. Also, the thickness uniformity of the film is improved.

Description will now be given on examples of forming an amorphous hydrogenated silicon film (a-Si:H) and an amorphous hydrogenated silicon nitride film (a-SiN:H). Also, examples for comparison will be described below.

Example 1-1 (a-Si:H film formation)

| Deposition Conditions | |
| --- | --- |
| Substrate S1: | glass substrate of 100 mm × 100 mm × 1 mm (thickness) |
| Electrodes 20, 30: | 360 mm × 360 mm |
| Deposition Temperature: | 210° C. |
| Deposition Gas Pressure: | 0.35 Torr |
| Basic rf-Power: | 13.56MHz (Sinusoidal Wave) Voltage $V_{P-P}$ 146(V) |
| Modulation Method: | Pulse Modulation (Duty 50%) |
| Modulation Frequency: | 100Hz, 1kHz, 10kHz, 20KHz, 48kHz, 68kHz, 100KHz, 200KHz, 300KHz, 1000KHz (respectively) |
| Deposition Gas: | Monosilane (SiH4) 200 sccm Hydrogen ($H_2$) 200 sccm |
| Thickness: | 1000Å |

Example 1-2 (a-SiN:H film formation)

| Deposition Conditions | |
| --- | --- |
| Substrate: | glass substrate of 100 mm × 100 mm × 1 mm (thickness) |
| Electrodes 20, 30: | 360 mm × 360 mm |
| Deposition Temperature: | 250–280° C. |
| Deposition Gas Pressure: | 0.8 Torr |
| Basic rf-Power: | 13.56MHz (Sinusoidal wave) Voltage $V_{P-P}$ 146(v) |
| Modulation Method: | Pulse Modulation (Duty 50%) |
| Modulation Frequency: | 100Hz, 1kHz, 10kHz, 20KHz, 48kHz, 68kHz, 100KHz, 200KHz, 300KHz, 1000KHz (respectively) |
| Deposition Gas: | Monosilane ($SiH_4$) 50 sccm ammonia ($NH_3$) 400 sccm |
| Thickness: | 3000Å |

Example for Comparison 1-1 (a-Si:H film formation)

The basic rf-power which is the base for modulation in the example 1-1 is continuously applied, and the conditions relating to the substrate, electrodes, deposition temperature, deposition gas pressure, voltage and material gas are the same as those of the example 1-1. Under these conditions, an a-Si:H film of 1000 Å in thickness is deposited.

Example for Comparison 1-2 (a-SiN:H film formation)

The basic rf-power which is the base for modulation in the example 1-2 is continuously applied, and the conditions relating to the substrate, electrodes, deposition temperature, deposition gas pressure, voltage and material gas are the same as those of the example 1-2. Under these conditions, an a-SiN:H film of 3000 Å in thickness is deposited.

Figure 3A:
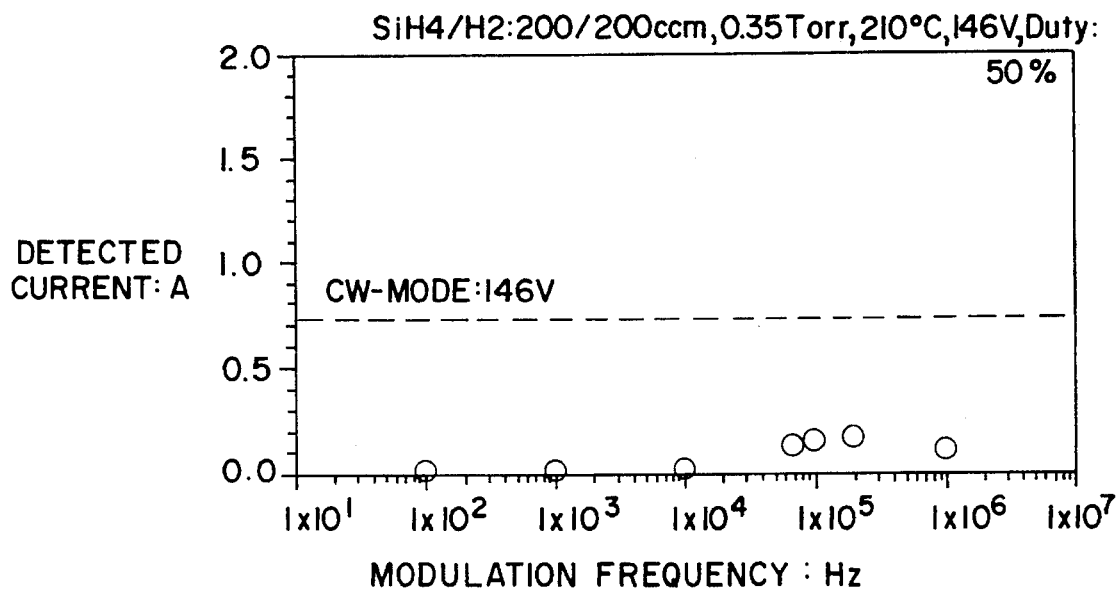
FIG. 3 is a graph showing a relationship between a deposition rate and a quantity of generated dust particles as a function of a modulation frequency of an applied modulated rf-power in a process of depositing an amorphous hydrogenated silicon by the apparatus shown in FIG. 1.
Figure 3B:
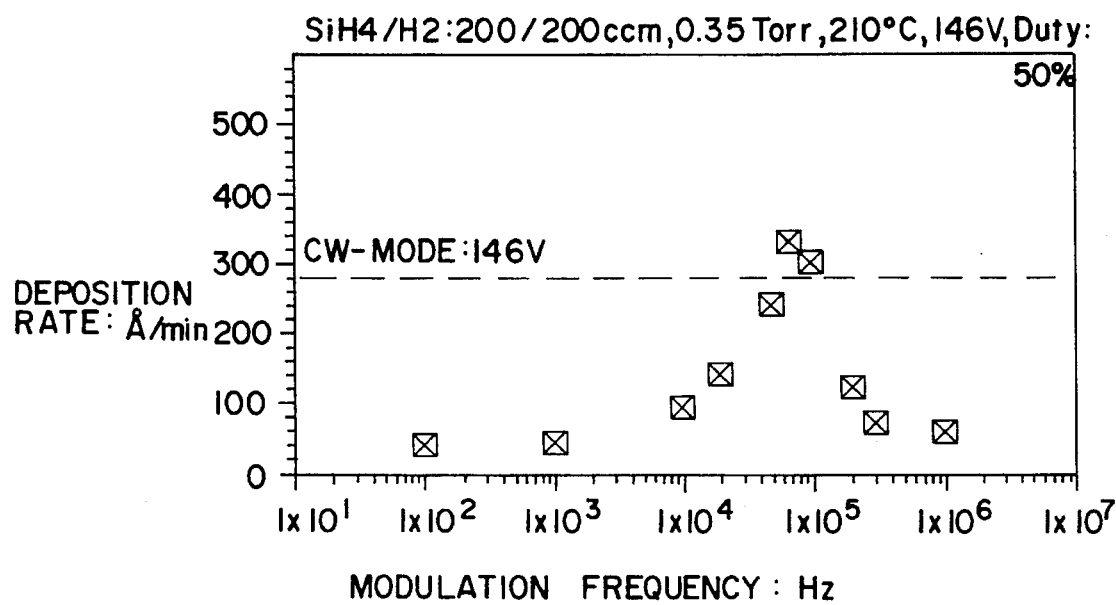

FIG. 3 shows the quantity of generated dust particles and deposition rate in the deposition process of the example 1-1 and the example for comparison 1-1. The quantity of particles was measured by the well known laser scattering system with argon laser. In FIG. 3, "Detected Current: A (ampere)" at the ordinate represents the current value indicative of the quantity of generated particles obtained by the above measurement. As can be seen from FIG. 3, if the rf-power is employed as is done in the example 1-1, the particle generation is remarkably suppressed as compared with the case of employment of the continuous rf-power (CW-Mode: $V_{P-P}$ 146 (V)). Also according to FIG. 3, the modulation frequency, which can prevent significant reduction of the deposition rate as compared with the case of employment of the continuous rf-power or can improve the deposition rate while suppressing the particle generation, is in a range from about 1/270 to about 1/68 of the basic rf-power frequency (13.56 Mz) and thus in a range from about 50 kHz to about 200 kHz. The modulation frequency, which can improve the deposition rate while suppressing the particle generation, is in a range from about 1/270 to about 1/135 of the basic rf-power frequency (13.56 Mz) and thus in a range from about 50 kHz to about 100 kHz, and is more desirably about 68 kHz.

The similar results were obtained with respect to the example 1-2 and the example for comparison 1-2.

The thickness uniformity was additionally determined, and the results were that the examples 1-1 and 1-2 using the modulation frequency from 50 to 200 kHz had better uniformity that the examples for comparison 1-1 and 1-2.

According to the above method and apparatus, since the dust generation is suppressed, the flow rate of deposition gas and the power applied for forming the plasma from the gas can be increased, so that the deposition rate can be further improved.

Since the dust generation is suppressed, adhesion of the dust onto the substrate is also suppressed, so that the film containing less defects and hence having good quality can be formed. Meanwhile, adhesion of the dust to various portions in the process chamber 10 is suppressed, so that the frequency of required maintenance of the apparatus can be reduced, so that the operating efficiency is improved, and hence the manufacturing cost of the film can be reduced.

According to the above method and apparatus, the aforementioned effects can be achieved by the apparatus which can be obtained without significantly improving the conventional apparatus.

From various experiments, the inventors have found the followings. In the plasma-CVD method and apparatus which deposit the film with the plasma obtained from the deposition gas by applying thereto the rf-power prepared by modulation of the basic rf-power of a frequency from 10 MHz to 200 MHz, the deposition rate can be prevented from significantly decreasing or can be improved while suppressing the particle generation as compared with the case employing a continuous rf-power. The modulation frequency of the modulation for this purpose is desirably in a range from about 1/270 to about 1/68 of the basic rf-power frequency, and more preferably, from about 1/270 to about 1/135 (e.g., about 1/200).

The film forming process by a plasma-CVD apparatus according to the invention shown in FIG. 4 will be described below.

Figure 4:
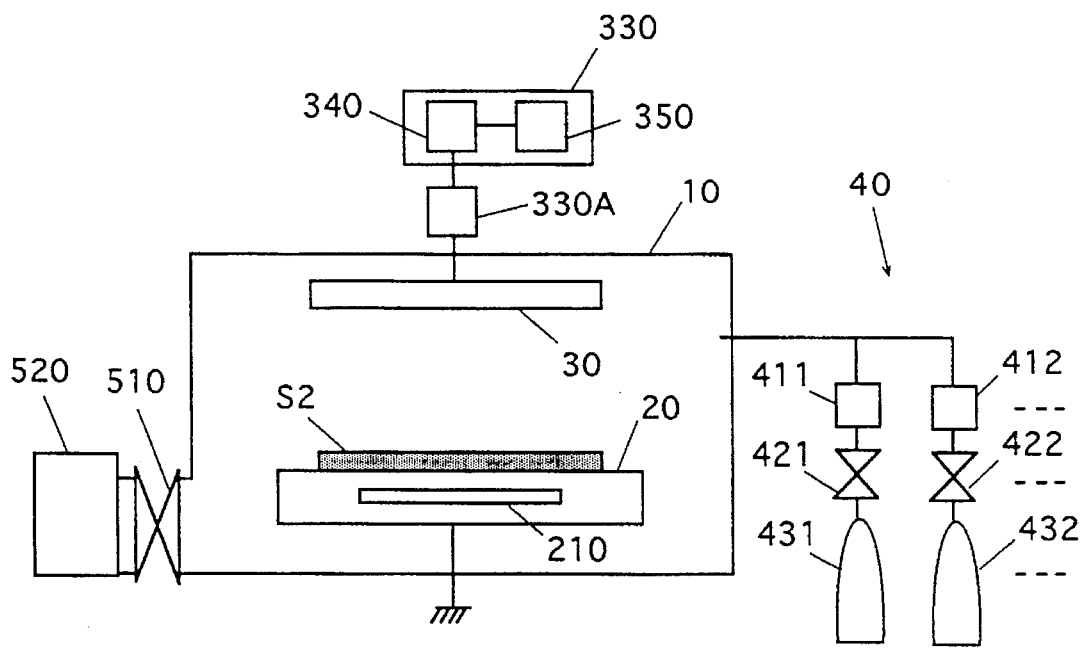
FIG. 4 schematically shows another example of a structure of a plasma-CVD apparatus executing the method of the invention.
Figure 16:
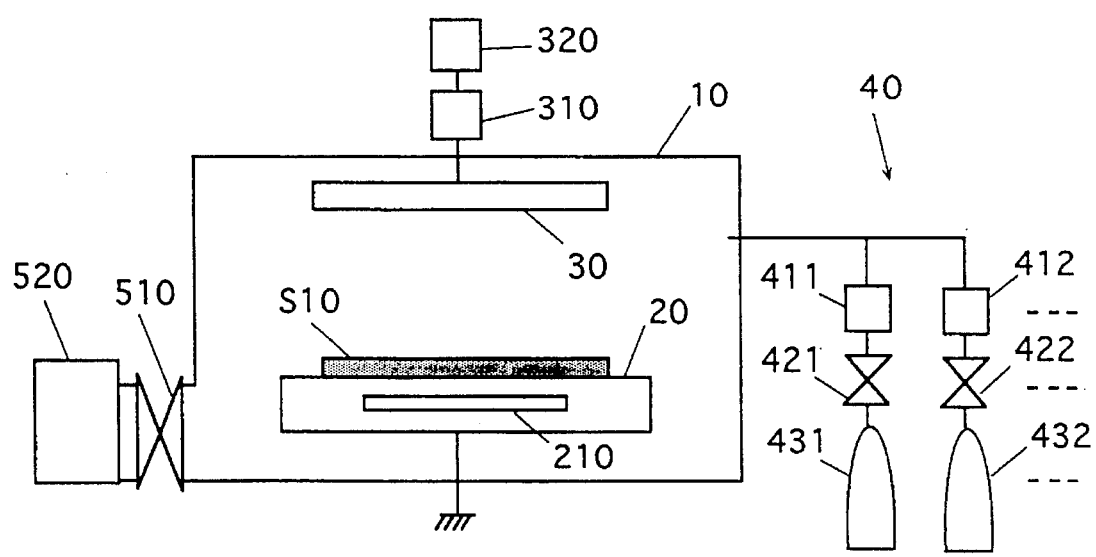
FIG. 16 schematically shows another example of a structure of a plasma-CVD apparatus in the prior art.

The apparatus shown in FIG. 4 is a parallel plated plasma-CVD apparatus, and has a structure similar to that shown in FIG. 16 except for that an rf-power generating device 330 is employed in place of the rf-power source 320 and is connected to the rf-power electrode 30 via a matching box 330A. Portions and parts similar to those in FIG. 16 bear the same reference numbers.

The power generating device 330 includes an rf-wave generator 350 connected to the matching box 330A via an rf-power amplifier 340.

Figure 6A:
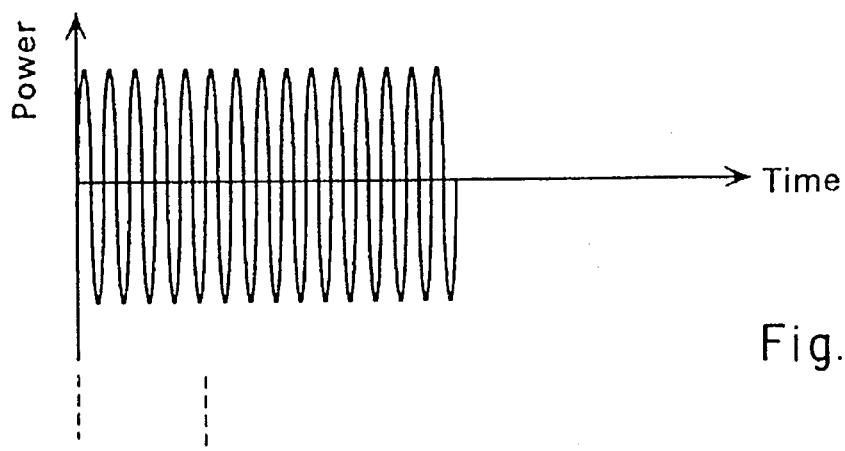
FIGS. 6A, 6B and 6C schematically exemplify waveforms of a basic rf-power, a modulated rf-power formed by effecting a first amplitude modulation on the basic rf-power and a modulated rf-power formed by effecting a second amplitude modulation on the modulated rf-power.

According to this apparatus, the rf-power generating device 330 effects an amplitude modulation on a continuous rf-power (i.e., basic rf-power) of a sinusoidal waveform of a frequency from 10 MHz to 200 MHz as shown at an upper portion in FIG. 6A. A modulation frequency of the amplitude modulation is in a range from 1/1000 to 1/10 of the basic rf-power frequency as shown at a middle portion of FIG. 6A. Thereby, the device 330 generates the rf-power of which power-on period T1 and power-off period T2 are repeated in accordance with a predetermined duty cycle. The peak-to-peak power in the power-on period is constant, and is set to a magnitude larger than a magnitude which causes practically nonnegligible generation of the particles if only the continuous rf-power of a sinusoidal waveform is applied to form the plasma from the material gas, and is set to correspond to an rf-power density not lower than 0.4 W/cm$^2$ which is an quotient obtained by division with an area of the rf-electrode 30 (1000 cm$^2$ or more in this embodiment).

According to this plasma-CVD apparatus, a substrate S2 is mounted on the electrode 20 in the process chamber 10, and is heated to a predetermined temperature by a heater 210. Meanwhile, the valve 510 is operated and the exhaust pump 520 is driven to set the chamber 10 to a predetermined degree of vacuum, and the gas supply unit 40 introduces a predetermined amount of deposition gas. The rf-power generating device 330 applies the rf-power, on which the amplitude modulation is effected as described above, to the rf-electrode 30. Thereby, the plasma is formed from the introduced gas, and an intended film is deposited on the surface of substrate S2 in the plasma.

According to the above plasma-CVD method and apparatus, the power applied for forming the plasma from the deposition material gas is set to exceed a value which causes generation of the particles in the conventional deposition process. Therefore, decomposition of the material gas is promoted, and thus the deposition rate is improved. Also, the plasma is formed from the deposition material gas by applying the rf-power on which the amplitude modulation is effected as described above, so that generation of the particles is suppressed.

Description will now be given on the deposition by a plasma-CVD apparatus shown in FIG. 5.

This apparatus has the same structure as that of the apparatus shown in FIG. 4 except for that an rf-power generating device 360 is employed in place of the rf-power generating device 330 shown in FIG. 4.

Figure 6B:
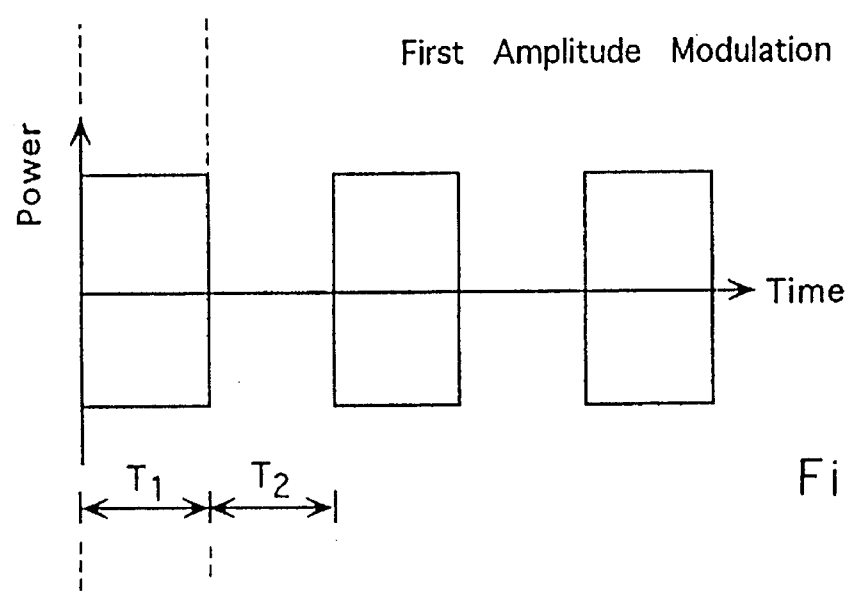
Figure 6C:
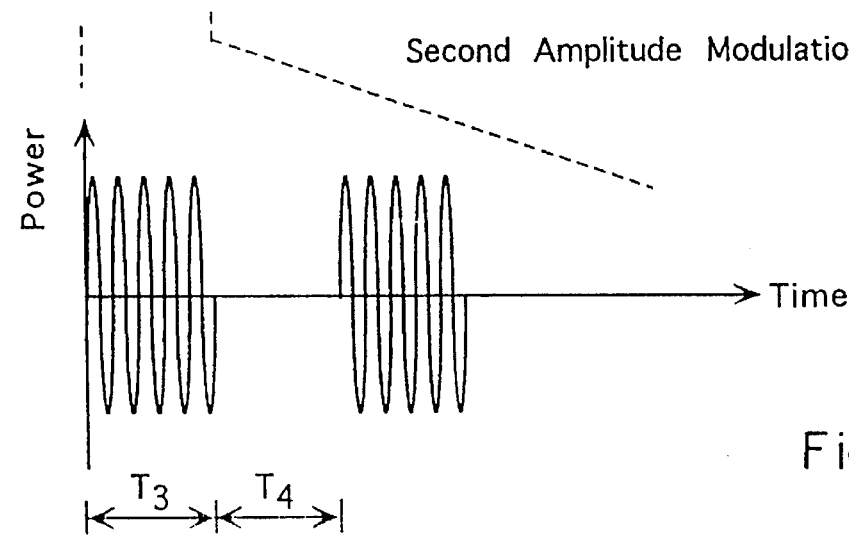
Figure 6D:
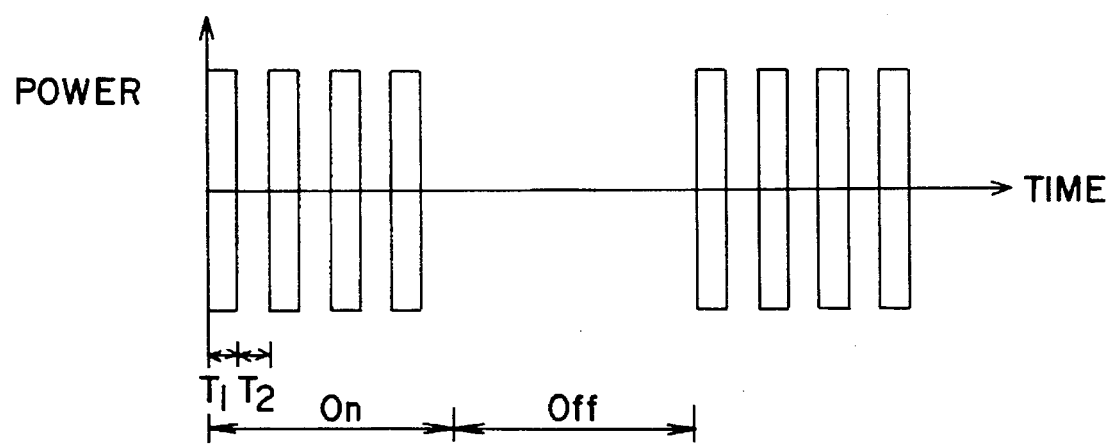
FIG. 6D shows another example of the waveform of the modulated rf-power formed by effecting the second amplitude modulation on the first modulated rf-power shown in FIG. 6B.

The rf-power generating device 360 includes an rf-wave generating device 370 connected to a matching box 330A via an rf-power amplifier 340. The device 360 effects a first amplitude modulation on a continuous rf-power (i.e., basic rf-power) having a sinusoidal waveform of a frequency 13.56 MHz as shown at the upper portion of FIG. 6A. A modulation frequency of the first amplitude modulation is in a range from 1/1000 to 1/10 of the basic rf-power frequency. The device 360 further effects on the power thus modulated a second amplitude modulation at a modulation frequency from 1/100 to 100 times the frequency of the first amplitude modulation, so that it generates the rf-power, of which power-on period T3 and power-off period T4 are sequentially repeated with a predetermined duty ratio during each power-on period T1 set by the first modulation as shown at the lower portion of FIG. 6A, or it generates the rf-power on which the second amplitude modulation is effected with a predetermined duty ratio as shown in FIG. 6B.

In this case, the peak-to-peak power during the power-on period is constant, and is set to a magnitude larger than a magnitude which causes practically nonnegligible generation of the dust particles if only the continuous rf-power of a sinusoidal waveform of 13.56 MHz is applied to form the plasma from the material gas, and is set to correspond to an rf-power density not lower than 0.4 W/cm$^2$ which is an quotient obtained by division with an area of the rf-electrode 30 (1000 cm$^2$ or more in this embodiment).

Also in this case, the plasma is formed from the material gas by applying the rf-power on which the first and second amplitude modulations are effected as described above, so that generation of the dust particles is remarkably suppressed and the deposition rate is further improved.

Description will now be given on examples of forming an amorphous silicon (will be also referred to as "a-Si") film and a silicon nitride (will be also referred to as "$SiN_x$") film. Also, examples for comparison will be described below.

Example 2-1

(a-Si film formation by the apparatus in FIG. 4)

Deposition Conditions

| | |
|---|---|
| Substrate S2: | glass substrate of 100 mm$^2$, and silicon wafer of 4 sq. in. |
| Electrode Area: | 350 mm × 400 mm |
| rf-Power: | 13.56MHz, rf-power density 0.45 W/cm$^2$ AM freq. 68kHz, duty ratio 50% |
| Deposition Gas: | silane gas (SiH$_4$) 200 sccm hydrogen gas (H$_2$) 200 sccm |
| Deposition Temperature: | 230° C. |

Example 2-2

(SiNx film formation by the apparatus in FIG. 4)

Deposition Conditions

| | |
|---|---|
| Substrate S2: | glass substrate of 100 mm$^2$, and silicon wafer of 4 sq. in. |
| Electrode Area: | 350 mm × 400 mm |
| rf-Power: | 13.56MHz, rf-power density 1W/cm$^2$ AM freq. 68kHz, duty ratio 50% |
| Deposition Gas: | silane gas (SiH$_2$) 60 sccm ammonia gas (NH$_3$) 200 sccm |
| Deposition Temperature: | 250° C. |

Example 2-3

Figure 5:
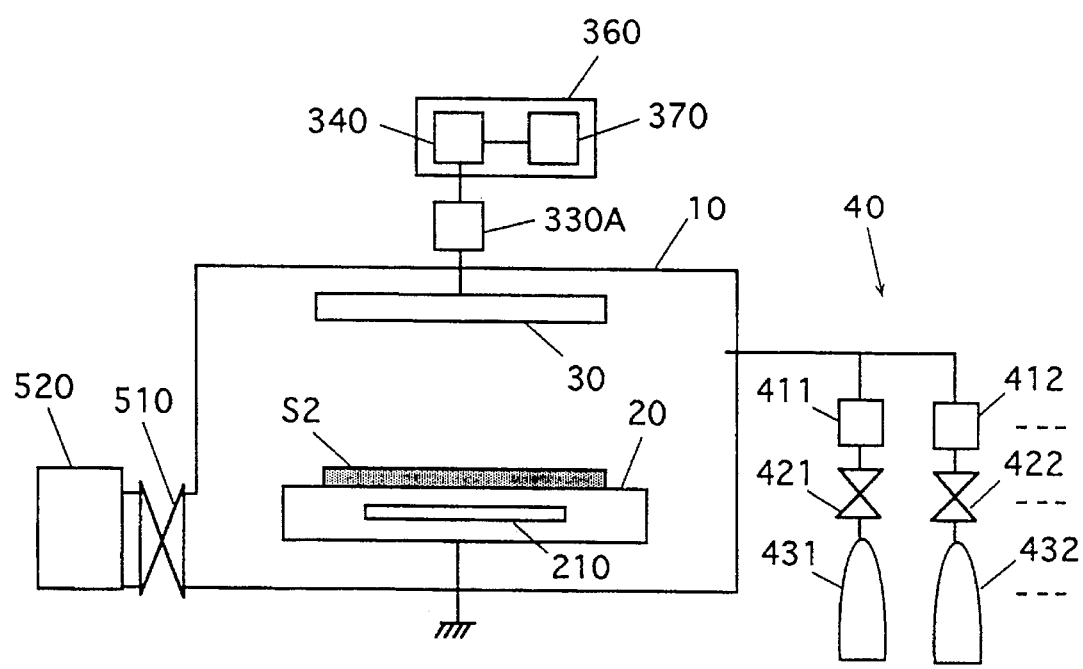
FIG. 5 schematically shows still another example of a structure of a plasma-CVD apparatus executing the method of the invention.

(a-Si film formation by the apparatus in FIG. 5)

Deposition Conditions

| | |
|---|---|
| Substrate S2: | glass substrate of 100 mm$^2$, and silicon wafer of 4 sq. in. |
| Electrode Area: | 350 mm × 400 mm |
| rf-Power: | 13.56MHz, rf-power density 0.45W/cm$^2$ 1st AM freq. 68kHz duty ratio 50% 2nd AM freq. 1kHz, duty ratio 25% |
| Deposition Gas: | silane gas (SiH$_4$) 200 sccm hydrogen gas (H$_2$) 200 sccm |
| Deposition Temperature: | 230° C. |

Example 2-4

(SiNx film formation by the apparatus in FIG. 5)

Deposition Conditions

| | |
|---|---|
| Substrate S2: | glass substrate of 100 mm$^2$, and silicon wafer of 4 sq. in. |
| Electrode Area: | 350 mm × 400 mm |
| rf-Power: | 13.56MHz, rf-power density 1W/cm$^2$ 1st AM freq. 68kHz duty ratio 50% 2nd AM freq. 1kHz, duty ratio 25% |
| Deposition Gas: | silane gas (SiH$_4$) 60 sccm ammonia gas (NH$_3$) 200 sccm |
| Deposition Temperature: | 250° C. |

Example for Comparison 2-1

An a-Si film is deposited by the conventional apparatus shown in FIG. 16 under the same conditions as the example 2-1 except for that the amplitude modulation is not effected.

Example for Comparison 2-2

An SiNx film is deposited by the conventional apparatus shown in FIG. 16 under the same conditions as the example 2-2 except for that the amplitude modulation is not effected.

The results of deposition are as follows. The particle concentration is represented by converting a laser scattering intensity in the plasma obtained by the laser scattering method into the concentration of particles of 0.1 µm or more in diameter.

| | Deposition Rate (Å/min) | Particle Density (pts/cm$^3$) |
|---|---|---|
| Example 2-1 (a-Si) | 1000 | About 1 × 10$^8$ |
| Example 2-2 (SiNx) | 1400 | About 1 × 10$^8$ |
| Example 2-3 (a-Si) | 1300 | About 1 × 10$^7$ |
| Example 2-4 (SiNx) | 1600 | About 1 × 10$^7$ |
| EC* 2-1 (a-Si) | 300 | About 1 × 10$^{10}$ |
| EC* 2-2 (SiNx) | 500 | About 1 × 10$^{11}$ |

EC*: Example for Comparison

Figure 7:
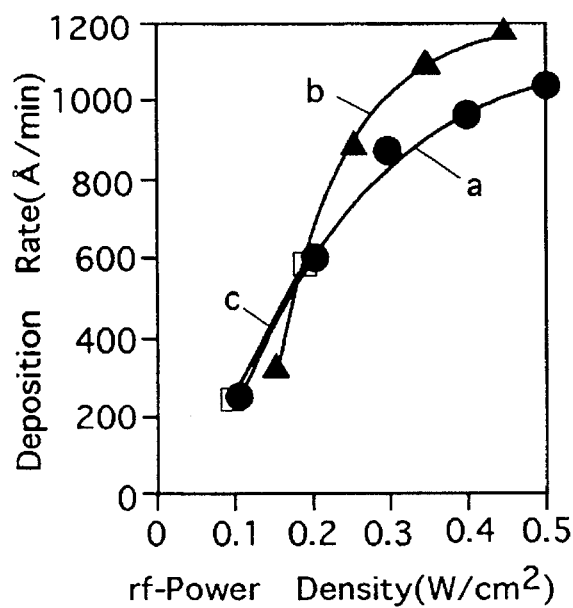
FIG. 7 is a graph showing results of an experiment for determining a power density of the rf-power and a deposition rate.
Figure 8:
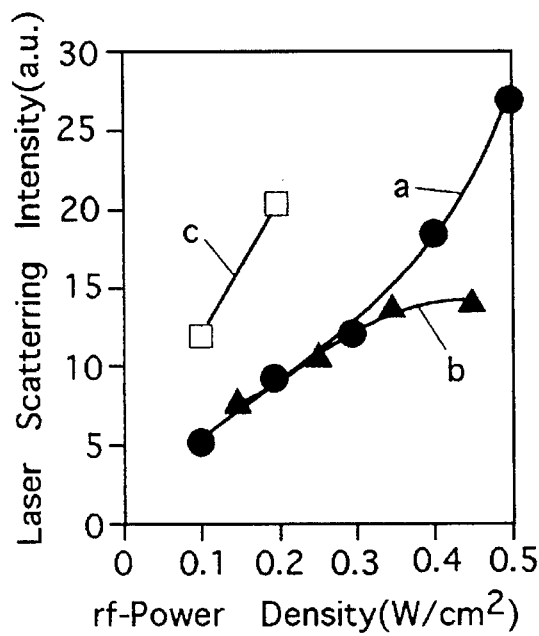
FIG. 8 is a graph showing results of an experiment for determining a power density of the rf-power and a laser scattering intensity in the plasma.

For the examples 2-1 and 2-3 as well as the example for comparison 2-1, the inventors determined a relationship between the power density and the deposition rate as well as the laser scattering intensity by the laser scattering system in the plasma corresponding to various values of the rf-power density. The results are shown in FIGS. 7 and 8. In FIGS. 7 and 8, line a corresponds to the example 2-1, line b corresponds to the example 2-3, and line c corresponds to the example for comparison 2-1.

From the results shown therein, it can be seen that if the plasma is formed from the material gas by applying the rf-power which is prepared by effecting the first amplitude modulation on the basic rf-power of a predetermined frequency, the particle generation is significantly suppressed and the deposition rate is improved as compared with the prior art, and that if the second amplitude modulation is additionally effected, the particle generation is further suppressed and the deposition rate is further improved.

It can be seen from FIG. 7 that the deposition rate increases in accordance with increase of the rf-power density of the applied rf-power, and it can be seen from FIG. 8 that, although the power density of 0.4 W/cm$^2$ or more generate a relatively large amount of particles in the prior art, the embodiment of the invention can significantly suppress the same even if the power density is 0.4 W/cm$^2$ or more. Further, it can be seen from FIG. 8 that, if only the first amplitude modulation is effected, the rf-power density must be about 0.5 W/cm$^2$ or less from the viewpoint of the particle generation, and is preferably about 0.45 W/cm$^2$ or less. If the second amplitude modulation is effected, the rf-power density may be higher than the above value.

Now, deposition by a plasma-CVD apparatus shown in FIG. 9 will be described below.

Figure 9:
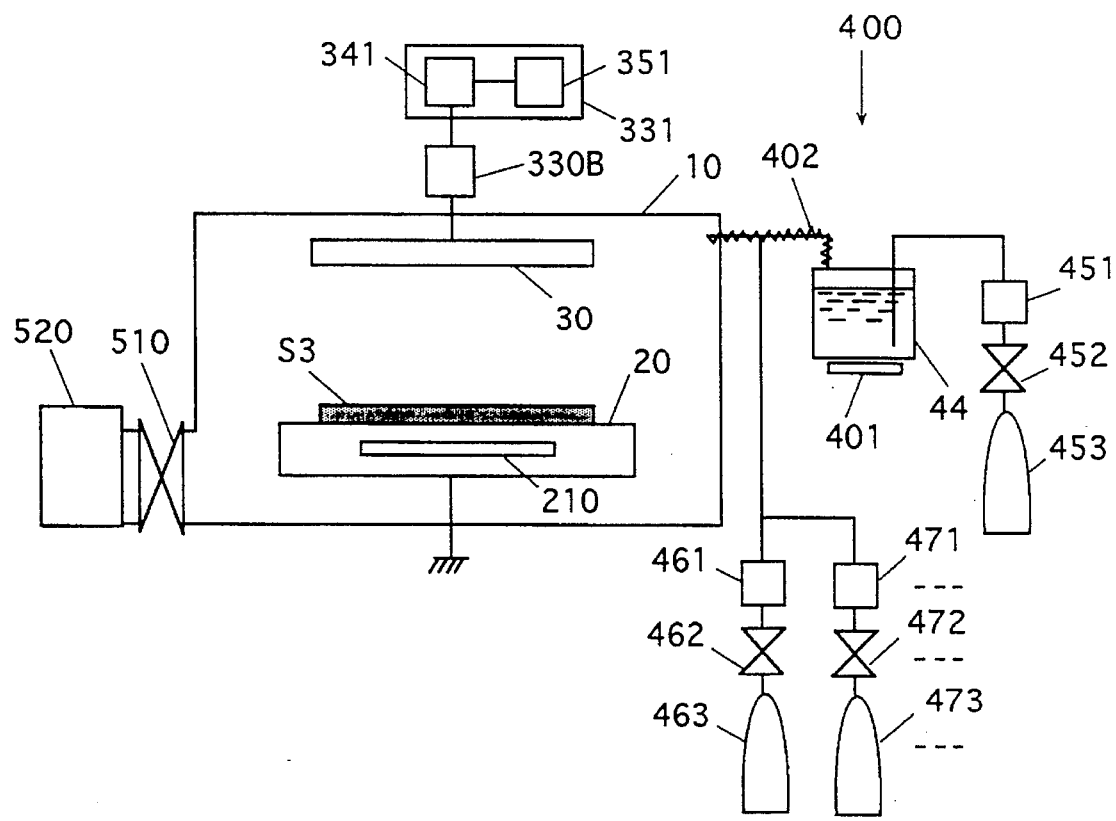
FIG. 9 schematically shows yet another example of a structure of a plasma-CVD apparatus executing the method of the invention.
Figure 17:
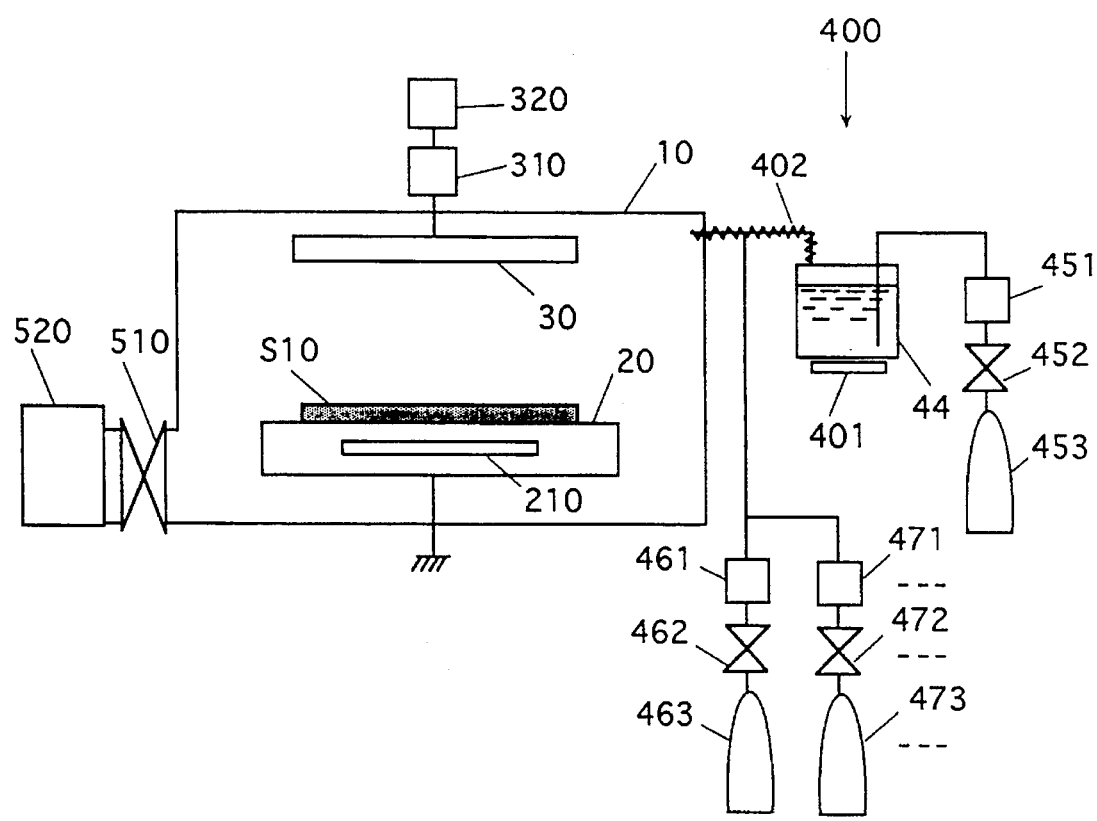
FIG. 17 schematically shows still another example of a structure of a plasma-CVD apparatus in the prior art.

The apparatus shown in FIG. 9 is a parallel plated rf-plasma-CVD apparatus, and has the same structure as that shown in FIG. 17 except for that an rf-power generating device 331 is employed in place of the rf-power source 320 in the conventional apparatus shown in FIG. 17 and is connected to the rf-electrode 30 via a matching box 330B. The same parts and portions as those in FIG. 17 bear the same reference numbers.

The rf-power generating device 331 includes an rf-wave generating device 351 connected to a matching box 330B via an rf-power amplifier 341.

The rf-power generating device 331 effects an amplitude modulation on a continuous rf-power (i.e., basic rf-power) having a sinusoidal waveform of a frequency from 10 MHz to 200 MHz as shown at an upper portion of FIG. 6A. A modulation frequency of the amplitude modulation is in a range from 1/1000 to 1/10 of the basic rf-power frequency.

Thereby, the device 331 generates the rf-power which is repetitively turned on and off at a predetermined duty cycle. The peak-to-peak power during the on-period is constant.

According to this plasma-CVD apparatus, a substrate S3 is mounted on the ground electrode 20 in the process chamber 10, and is heated to a predetermined temperature by the heater 210. Meanwhile, the valve 510 is operated and the exhaust pump 520 is driven to set the chamber 10 to a predetermined degree of vacuum, and the gas supply unit 400 introduces a predetermined amount of deposition gas. Liquid halogen compound is stored in a bubbler 44, and a carrier gas is introduced from a gas source 453 into the halogen compound in the bubbler 44, so that the compound is bubbled and introduced into the chamber 10. If necessary, gas sources 463, 473, . . . introduce additional deposition material gases of different kinds into the chamber 10. If the liquid halogen compound can be bubbled with the additional material gas(es), this gas(es) can be used as the carrier gas. Although the halogen compound gas and the additional material gas are introduced into the chamber 10 through a common piping, they may be introduced into the chamber 10 through different pipings. The rf-power generating device 331 applies the rf-power thus amplitude-modulated to the rf-electrode 30, so that the plasma is formed from the introduced gas(es), and the intended film is deposited on the surface of the substrate S3 in the plasma.

According to these plasma-CVD method and apparatus, although the halogen compound gas is used as the deposition material gas, the plasma is formed from the gas by applying the amplitude-modulated rf-power. Therefore, it is possible to reduce the number of halogen atoms remaining in the deposited film, so that it is not necessary to maintain the substrate at a high temperature during deposition, which improves the film quality.

Since the plasma is formed from the material gas by applying the amplitude-modulated rf-power, it is possible to suppress generation of the radicals causing the dust particles without suppressing generation of the radicals required for deposition. Therefore, the deposition operation at a relatively low temperature significantly suppresses the particle generation. Also the deposition rate is prevented from excessive reduction or is improved.

Since it is not necessary to use, as the deposition material, a dangerous gas such as $SiH_4$ gas, the deposition can be performed in a safe manner.

Description will now be given on the deposition by a plasma-CVD apparatus shown in FIG. 10.

This apparatus has the same structure as that apparatus shown in FIG. 9 except for that an rf-power generating device 361 is employed in place of the rf-power generating device 331 shown in FIG. 9.

The rf-power generating device 361 includes an rf-wave generating device 371 connected to the matching box 330B via an rf-power amplifier 341.

The device 361 effects a first amplitude modulation on a continuous rf-power (i.e., basic rf-power) having a sinusoidal waveform of a frequency from 10 MHz to 200 MHz as shown at the upper portion of FIG. 6A. This first amplitude modulation is effected at a frequency in a range from 1/1000 to 1/10 of the basic rf-power frequency and a predetermined duty cycle. The device 361 further effects, as shown at the lower portion in FIG. 6A or in FIG. 6B, on the modulated power a second amplitude modulation at a second modulation frequency from 1/100 to 100 times the frequency of the first modulation and a predetermined duty cycle. In this manner, the device 361 generates the modulated rf-power.

According to this plasma-CVD apparatus, since the plasma is formed from the deposition material gas by applying the rf-power on which the first and second amplitude modulations are effected as described above, generation of the dust particles is further suppressed and the deposition rate is further improved.

Description will now be given on examples of forming a polycrystalline silicon film (p-Si) and a titanium nitride (will be also referred to as "TiN") film. Also, examples for comparison will be described below.

Example 3-1

(p-Si film formation by the apparatus in FIG. 9)

Deposition Conditions

| | |
|---|---|
| Substrate: | silicon wafer of 4 sq. in. |
| rf-Electrode Size | 200 mm in diameter |
| Deposition Presssure: | 1 Torr |
| rf-Power: | 13.56MHz, rf-power 100W |
| | AM freq. 68kHz, duty ratio 50% |
| Deposition Gas: | $SiCl_4$, bubbling temp. 50° C. |
| Carrier Gas: | $H_2$, 200 sccm |
| Substrate Temperature: | 450° C. |

Example 3-2

(TiN film formation by the apparatus in FIG. 9)

Deposition Conditions

| | |
|---|---|
| Substrate: | silicon wafer of 4 sq. in. |
| rf-Electrode Size | 200 mm in diameter |
| Deposition Presssure: | 0.6 Torr |
| rf-Power: | 13.56MHz, rf-power 200W |
| | AM freq. 68kHz, duty ratio 50% |
| Deposition Gas: | $TiCl_4$, bubbling temp. 50° C. |
| | $NH_3$, 200 sccm |
| Carrier Gas: | $N_2$ 60 sccm |
| Substrate Temperature: | 300° C. |

Example 3-3

Figure 10:
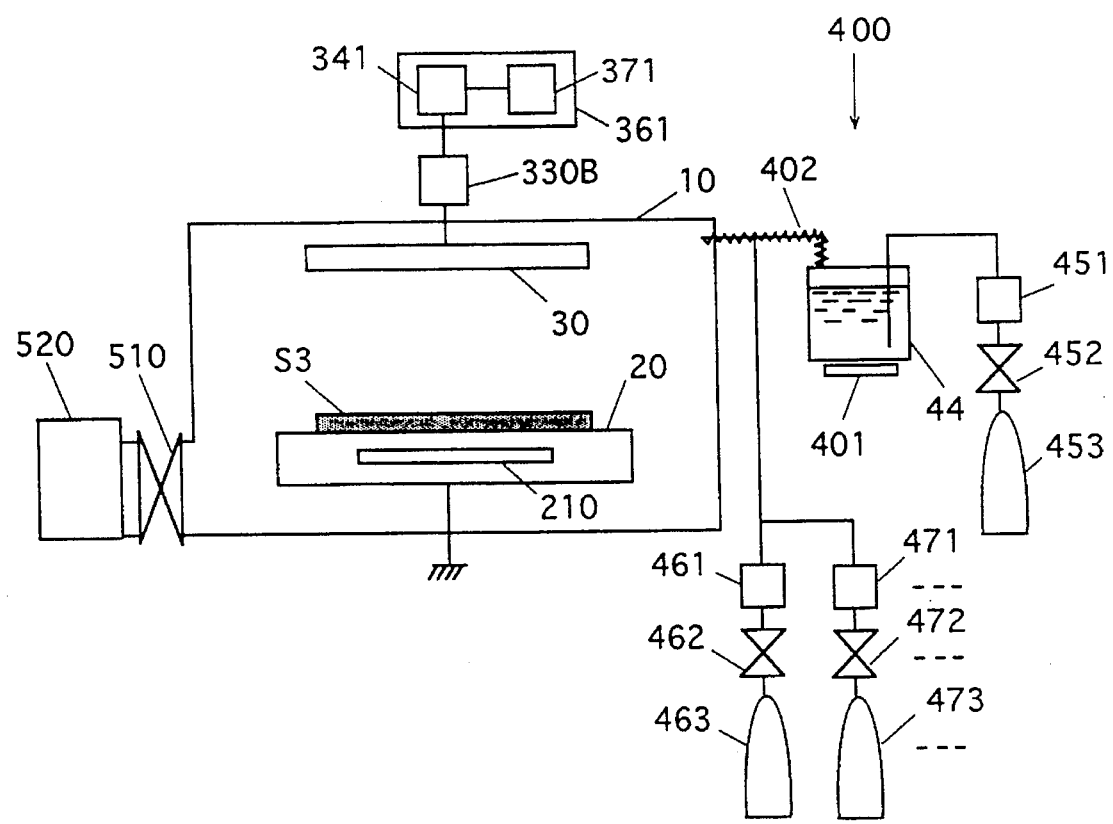
FIG. 10 schematically shows further another example of a structure of a plasma-CVD apparatus executing the method of the invention.

(p-Si film formation by the apparatus in FIG. 10)

Deposition Conditions

| | |
|---|---|
| Substrate: | silicon wafer of 4 sq. in. |
| rf-Electrode Size: | 200 mm in diameter |
| Deposition Presssure: | 1 Torr |
| rf-Power: | 13.56MHz, rf-power 100W |
| | 1st AM freq. 68kHz, duty ratio 50% |
| | 2nd AM freq. 1kHz, duty ratio 50% |
| Deposition Gas: | $SiCl_4$, bubbling temp. 40° C. |
| Carrier Gas: | $H_2$, 200 sccm |
| Substrate Temperature: | 450° C. |

Example 3-4

(TiN film formation by the apparatus in FIG. 10)

Deposition Conditions

| | |
|---|---|
| Substrate: | silicon wafer of 4 sq. in. |
| rf-Electrode Size: | 200 mm in diameter |
| Deposition Presssure: | 0.6 Torr |
| rf-Power: | 13.56MHz, rf-power 200W |
| | 1st AM freq. 68kHz, duty ratio 50% |
| | 2nd AM freq. 1kHz, duty ratio 50% |
| Deposition Gas: | $TiCl_4$, bubbling temp. 25° C. |
| | $NH_3$, 200 sccm |
| Carrier Gas: | $N_2$ 60 sccm |
| Substrate Temperature: | 300° C. |

Example for comparison 3-1

The conventional apparatus shown in FIG. 17 is used, and a p-Si film is deposited under the same deposition conditions as those of the example 3-1 except for that the amplitude modulation is not effected and the substrate temperature is 550° C.

Example for Comparison 3-2

The conventional apparatus shown in FIG. 17 is used, and a TiN film is deposited under the same deposition conditions as those of the example 3-2 except for that the amplitude modulation is not effected and the substrate temperature is 500° C.

The films deposited in accordance with the examples 3-1, 3-2, 3-3 and 3-4 as well as the examples for comparison 3-1 and 3-2 were evaluated with respect to the deposition rate, the amount of residual chlorine in the film and the concentration of particles of 0.1 μm or more in diameter. The amount of residual chlorine was measured by Auger electron microscope method, and the particle concentration was represented by converting a laser scattering intensity in the plasma obtained by the laser scattering method (Mie scattering method) into the concentration of particles of 0.1 μm or more. Also, with respect to the examples 3-2 and 3-4 as well as the example for comparison 3-2, color of the deposited films were evaluated.

The results are as follows.

| Film | Deposition Rate (Å/min) | Residual Chroline (atoms %) | Particle Conc. (pts/cm³) | Color |
|---|---|---|---|---|
| p-Si Ex 3-1 | 200 | 0.2 | $1 \times 10^7$ | — |
| p-Si Ex 3-3 | 240 | 0.15 | $<1 \times 10^7$ | — |
| p-Si EC 3-1 | 100 | 1 | $1 \times 10^8$ | — |
| TiN Ex 3-2 | 500 | 0.1 | $1 \times 10^7$ | gold |
| TiN Ex 3-4 | 570 | 0.07 | $<1 \times 10^7$ | gold |
| TiN EC 3-2 | 350 | 1 | $1 \times 10^8$ | brown |

Ex: Example,
EC: Example for Comparison

From the aforementioned results of experiment, it can be seen that application of the modulated rf-power for forming the plasma from the material gas reduces the amount of residual chlorine (Cl) in the film as compared with the case not employing the modulated power. In connection with the TiN film, the film deposited with the amplitude-modulated power is gold in contrast to the brown film formed without utilizing the modulated power. The reason for this is probably that the denseness of TiN increases and hence orientation occurs.

It can also be seen that if the plasma is formed from the material gas by applying the rf-power on which the first amplitude modulation is effected, the particle generation is suppressed and the deposition rate is improved as compared with the case not employing the modulated power, and that if the second amplitude modulation is additionally effected, the particle generation is further suppressed and the deposition rate is further improved.

Description will now be given on the deposition of a carbon film by a plasma-CVD apparatus shown in FIG. 4 according to the invention. The rf-electrode 30, however, is a circular disk electrode in this case.

For deposition of the carbon film on the substrate, the plasma-CVD apparatus shown in FIG. 4 is adapted such that the material gas supply unit 40 supplies a gas including only a hydrocarbon compound gas for forming the intended carbon film or a mixture of a hydrocarbon compound gas and a different kind of gas (e.g., hydrogen gas) for forming the intended film together with the hydrocarbon compound gas.

The substrate is mounted on the electrode 20 in the process chamber 10, and is heated to a predetermined temperature by the heater 210. Meanwhile, the valve 510 is operated and the exhaust pump 520 is driven to set the chamber 10 to a predetermined degree of vacuum, and the gas supply unit 40 introduces a predetermined amount of deposition gas. The rf-power generating device 330 applies the amplitude-modulated rf-power to the rf-electrode 30, so that the plasma is formed from the introduced gas, and the intended carbon film is deposited on the surface of the substrate in the plasma.

Also in this deposition process, the rf-power applied from the rf-power generating device 330 to the electrode 30 is prepared by effecting an amplitude modulation on a basic rf-power of a frequency from 10 MHz to 200 MHz. The amplitude modulation is performed at a modulation frequency from 1/1000 to 1/10 of the basic rf-power frequency and a predetermined duty ratio. The power is applied in accordance with such a pattern that turn-on and turn-off are repeated as shown in FIG. 2B and the middle portion of FIG. 6A. The peak-to-peak power during the power-on period is constant.

Thereby, it is possible to suppress generation of the radicals, which cause generation of the dust particles, while generation of the radicals contributing to the deposition is not suppressed and the latter relatively increases in number. Therefore, the dust particles decrease in number, so that the film quality is improved, and the deposition rate is prevented from excessive reduction or is improved. A diamond-like carbon film (DLC film) of good quality can be formed at a relatively low temperature.

Description will now be given on the deposition of a carbon film by a plasma-CVD apparatus shown in FIG. 5 according to the invention. The rf-electrode 30, however, is a circular disk electrode in this case.

For deposition of the carbon film on the substrate, the plasma-CVD apparatus shown in FIG. 5 is adapted such that the material gas supply unit 40 supplies a gas including only a hydrocarbon compound gas for forming the intended carbon film or a mixture of a hydrocarbon compound gas and a different kind of gas (e.g., hydrogen gas) for forming the intended film together with the hydrocarbon compound gas.

The substrate is mounted on the electrode 20 in the process chamber 10, and is heated to a predetermined temperature by the heater 210. Meanwhile, the valve 510 is operated and the exhaust pump 520 is driven to set the chamber 10 to a predetermined degree of vacuum, and the gas supply unit 40 introduces a predetermined amount of deposition gas. The rf-power generating device 360 applies the rf-power, on which first and second amplitude modulations are effected, to the rf-electrode 30, so that the plasma is formed from the introduced gas, and a diamond-like carbon film (DLC film) of good quality is deposited on the surface of the substrate in the plasma.

Also in this deposition process, the rf-power applied from the rf-power generating device 360 to the electrode 30 is prepared by effecting an amplitude modulation (first amplitude modulation) on a basic rf-power of a frequency from 10 MHz to 200 MHz, and effecting the second amplitude modulation thereon. The first amplitude modulation is performed at a frequency in a range from 1/1000 to 1/10 of the basic rf-power frequency and a predetermined duty ratio, as shown in FIG. 2B and at the middle portion in FIG. 6A. The second amplitude modulation is performed at a modulation frequency from 1/100 to 100 times the first amplitude modulation frequency as shown at the lower portion in FIG. 6A or as shown in FIG. 6B.

As described above, the plasma is formed from the material gas by applying the rf-power on which the first and second amplitude modulations are effected in a superposed manner. As a result, generation of the dust particles is further suppressed, and the deposition rate and the film quality of DLC film are further improved.

Description will now be given on examples of forming a DLC film. Also, an example for comparison will be described below.

Example 4-1

(DLC film formation by the apparatus in FIG. 4)

Deposition Conditions

| | |
|---|---|
| Substrate: | polyimide resin of 100 mm² |
| rf-Power: | 13.56MHz, 100W |
| | AM freq. 68kHz, duty ratio 50% |
| rf-Electrode Size: | 200 mm in diameter |
| Deposition Gas: | methane (CH₄) 10 sccm |
| | hydrogen (H₂) 200 sccm |
| Substrate Temperature: | 100° C. |
| Deposition Presssure: | 0.1 Torr |

Example 4-2

(DLC film formation by the apparatus in FIG. 5)

Deposition Conditions

| | |
|---|---|
| Substrate: | polyimide resin of 100 mm² |
| rf-Power: | 13.56MHz, 100W |
| | 1st Am freq. 68kHz, duty ratio 50% |
| | 2nd AM freq. 1kHz, duty ratio 50% |
| Deposition Gas: | methane (CH₄) 10 sccm |
| | hydrogen (H₂) 200 sccm |
| Substrate Temperature: | 100° C. |
| Deposition Presssure: | 0.1 Torr |

Example for Comparison 4-1

The conventional apparatus shown in FIG. 16 is used, and a film is deposited under the same deposition conditions as those of the example 4-1 except for that the amplitude modulation is not effected.

The results are as follows. The concentration of generated particles is represented by converting a laser scattering intensity in the plasma obtained by the laser scattering method (Mie scattering method) into the concentration of particles of 0.1 μm or more in diameter.

| | Deposition Rate (Å/min) | Particle Conc. (pts/cm³) |
|---|---|---|
| Ex 4-1 | 2000 | about 3 × 10⁷ |
| Ex 4-2 | 2400 | <1 × 10⁷ |
| EC 4-1 | 1000 | about 1 × 10⁶ |

Ex: Example,
EC: Example for Comparison

From the aforementioned results of experiment, it can be seen that if the plasma is formed from the material gas by applying the rf-power which is prepared by effecting the first amplitude modulation on the basic rf-power, the particle generation is suppressed and the deposition rate is improved as compared with the prior art, and that if the second amplitude modulation is additionally effected, the particle generation is further suppressed and the deposition rate is further improved.

Figure 11:
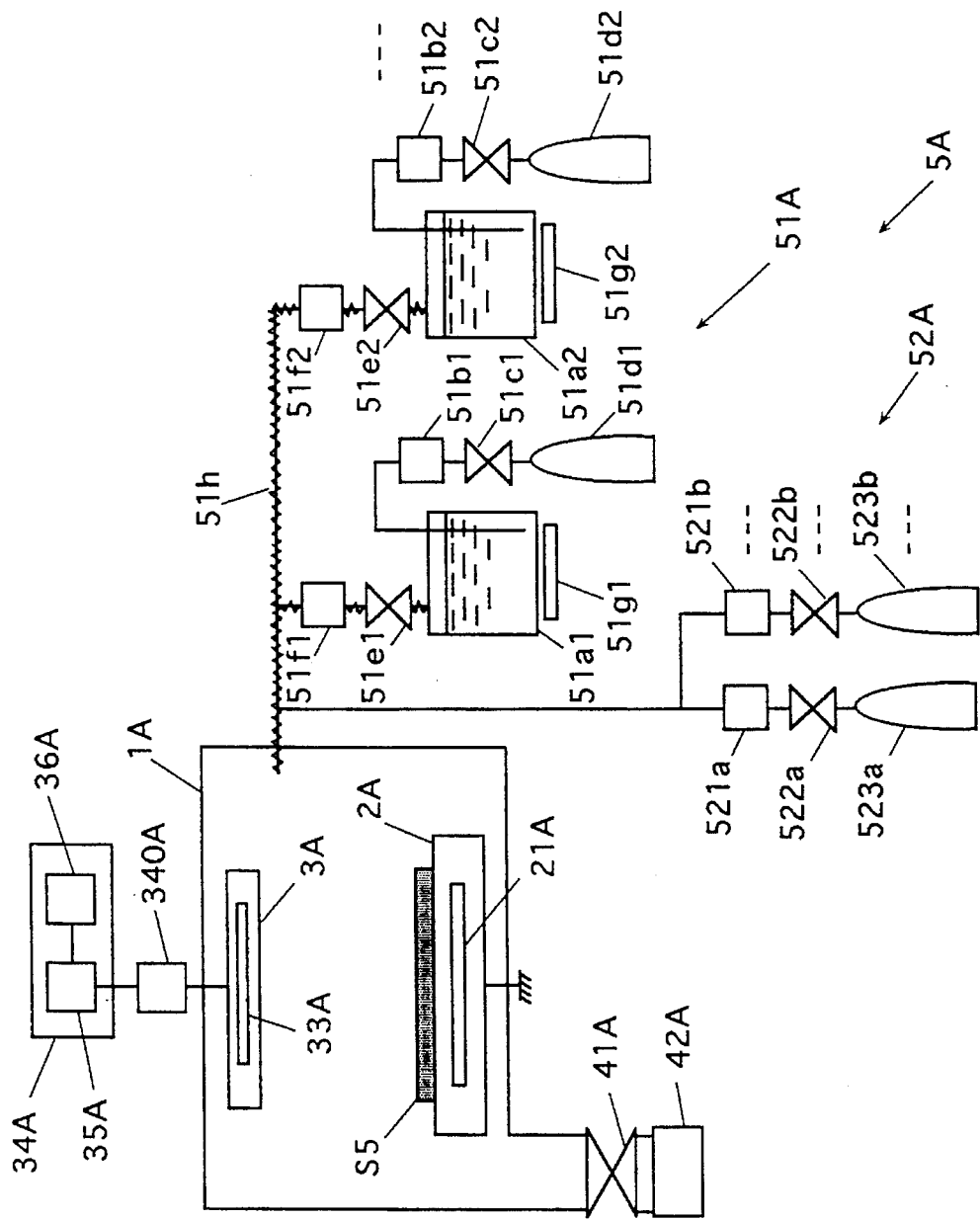
FIG. 11 schematically shows a further example of a structure of a plasma-CVD apparatus executing the method of the invention.

Description will now be given on the film deposition by a plasma-CVD apparatus shown in FIG. 11.

Figure 18:
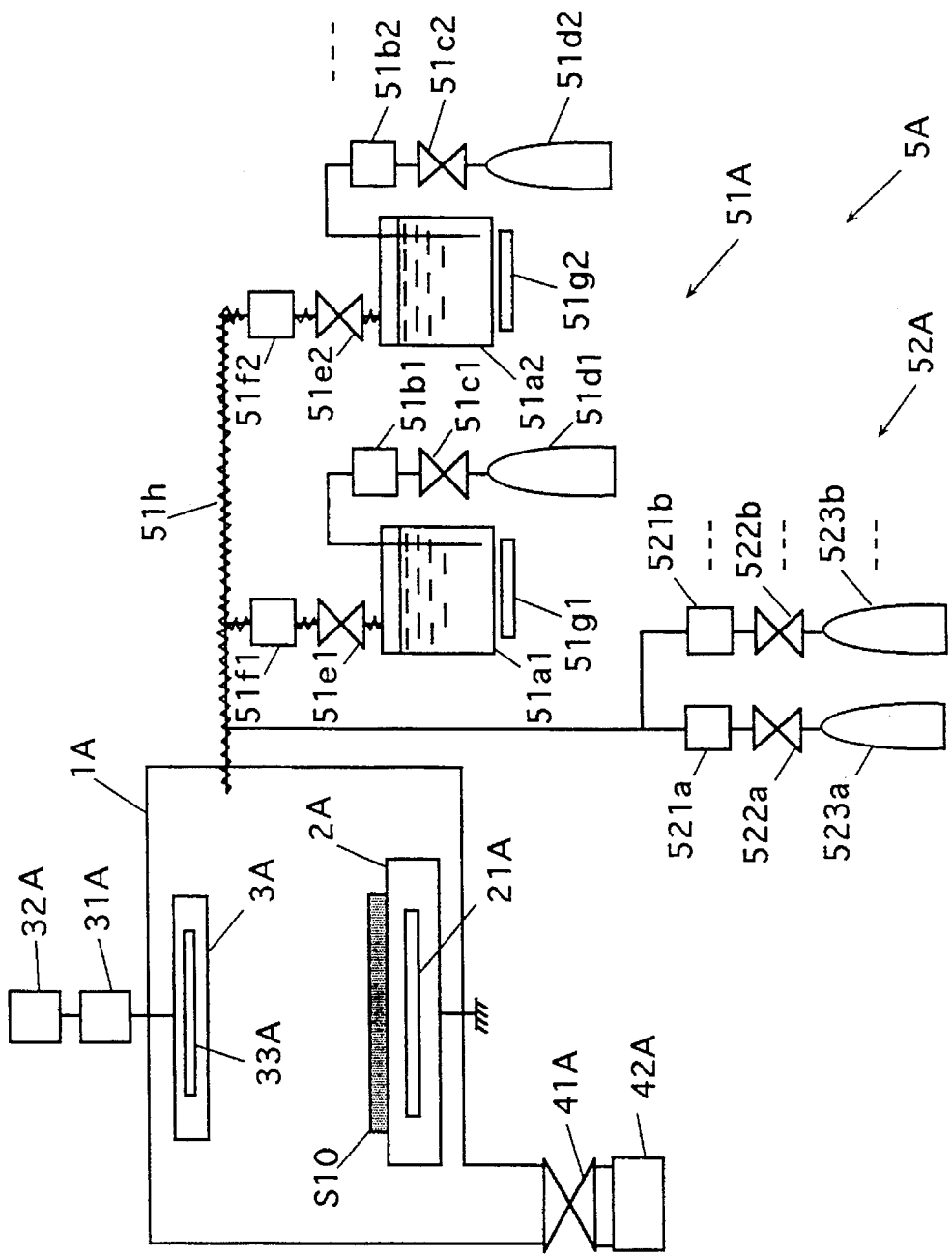
FIG. 18 schematically shows yet another example of a structure of a plasma-CVD apparatus in the prior art.

This apparatus is similar to the conventional plasma-CVD apparatus shown in FIG. 18 but differs therefrom in that an electrode 3A is connected to an rf-power generating device 34A via a matching box 340A. The rf-power generating device 34A includes an rf-wave generating device 36A connected to the matching box 340A via an rf-power amplifier 35A.

The device 34A effects a first amplitude modulation on a continuous rf-power (i.e., basic rf-power) having a sinusoidal waveform of a frequency from 10 MHz to 200 MHz as shown at the upper and middle portions of FIG. 6A so as to generate the rf-power in which on-state and off-state are repeated at a predetermined duty cycle. The peak-to-peak power is constant during the power-on period.

Other structures are the same as those in the conventional apparatus shown in FIG. 18. The same parts and portions as those in FIG. 18 bear the same reference numbers.

In this embodiment, a substrate S5 is mounted on the ground electrode 20. Alternatively, the substrate may be mounted on the rf-electrode 3A, in which case a self-potential effect of the rf-electrode 3A may be obtained.

In the deposition process, the substrate S5 is transferred into a process chamber 1A, and is mounted on the electrode 2A heated by a heater 21A to a predetermined temperature. Meanwhile, a valve 41A is operated and an exhaust pump 42A is driven to set the chamber 1A to a predetermined degree of vacuum, and a gas supply portion 52A in a gas supply unit 5A introduces a pretreatment gas. The rf-power generating device 34A applies the modulated rf-power to the rf-electrode 3A for a predetermined time period, so that the plasma is formed from the pretreatment gas, and the substrate S5 is cleaned in this plasma.

Then, a carrier gas is introduced from a gas source 51$d$1 into a bubbler 51$a$1 storing a liquid film material for bubbling it, and a deposition gas thus generated is supplied into the process chamber 1A. In this operation, the bubbler 51$a$1 is heated, if necessary, by a temperature controller 51$g$1. Also, a piping between the bubbler 51$a$1 and the chamber 1A is heated, if necessary, by a heater 51$h$, to a similar temperature, and the electrode 3A is heated, if necessary, by a heater 33A to a similar temperature. Along with the bubbling, the gas supply portion 52A may supply a gas. The deposition gas thus introduced forms the plasma owing to application of the rf-power to the rf-electrode 3A, and the film is deposited on the cleaned surface of the substrate S5 in the plasma. In this deposition operation, the same modulated rf-power as that during the cleaning is applied to the rf-electrode 3A.

Since formation of the plasma from the pretreatment gas is effected by application of the modulated rf-power, the generation region of plasma is large, so that the whole substrate S5 is uniformly cleaned, resulting in improvement of the thickness uniformity of the film deposited on the cleaned substrate. Since decomposition of the gas at the gaseous phase is promoted during the cleaning, the concentration of radicals contributing to the cleaning in the plasma increases, so that the cleaning efficiency of the substrate and the reproducibility of cleaning are improved.

Since the plasma is formed from the deposition gas by applying the amplitude-modulated rf-power, generation of the dust particles is suppressed, and the film quality is improved. Also, the deposition rate is prevented from excessive reduction or is improved.

Description will now be given on an example of forming a titanium nitride film on a silicon substrate. Also, examples for comparison will be described below.

Example 5-1

| Pretreatment Conditions | |
|---|---|
| Substrate: | silicon wafer of 4 inch in diameter |
| rf-Electrode Size: | 200 mm in diameter |
| rf-Power: | equal to CW of 300W |
| | basic rf-power 13.56MHz, 100W |
| | AM freq. 1kHz, duty ratio 50% |
| Pretreatment Gas: | (1) H₂ 200 sccm, 5 minutes |
| | (2) H₂ 200 sccm and |
| | NH₃ 200 sccm, 5 minutes |
| Pressure: | 0.6 Torr |
| Deposition Conditions | |
| rf-Power: | 200W |
| | basic frequency 13.56MHz |
| | AM freq. 68kHz, duty ratio 50% |
| Deposition Gas: | TiCl₄, bubbling temperature 25° C. |
| | H₂ (carrier gas) 200 sccm |
| Film Thickness: | 3000Å |
| Deposition Presssure: | 0.6 Torr |
| Substrate Temperature: | 500° C. |

Example for Comparison 5-1

A titanium nitride film of 3000 Å in thickness was deposited on the substrate S5 under the same conditions as those in the example 5-1 except for that the power applied for forming the plasma from the deposition material gas was a continuous rf-power of a frequency of 13.56 MHz.

Example for Comparison 5-2

A titanium nitride film of 3000 Å in thickness was deposited on the substrate S5 under the same conditions as those in the example 5-1 except for that the powers applied for forming the plasma from the pretreatment gas and forming the plasma from the material gas were continuous rf-powers of a frequency of 13.56 MHz.

In the examples for comparison 5-1 and 5-2, the wettability was evaluated by measuring a contact angle of pure water with respect to the substrate after the pretreatment and before the deposition. Based on this, the cleaning efficiency of the substrate was evaluated. With respect to the example 5-1 as well as the examples for comparison 5-1 and 5-2, the film thickness of the titanium nitride film deposited on the substrate S5 was evaluated. This evaluation was performed in such a manner that the substrate S5 before deposition is partially covered with a shield, and a magnitude of a step, which was formed between the deposited film and the surface not covered with the deposited film was measured at three points.

The results are as follows.

| | Ex 5-1 | EC 5-1 | EC 5-2 |
|---|---|---|---|
| Contact Angle (deg.) | — | 45 | 80 |
| Thickness Uniformity (±%) | 5 | 7 | 15 |

From these results, the following can be seen. If the rf-power applied to the pretreatment gas for forming the plasma is the modulated rf-power, the wettability of pure water decreases, and in other words, the cleaning efficiency of the substrate is improved. Further, the thickness uniformity of the film deposited on the substrate S5 after the cleaning is improved.

Further, owing to the application of the modulated rf-powers to both the pretreatment gas and the deposition material gas for forming the plasma, the thickness uniformity of the film deposited on the cleaned substrate S5 is further improved.

Description will now be given on the deposition by a plasma-CVD apparatus according to the invention shown in FIG. 12.

Figure 12:
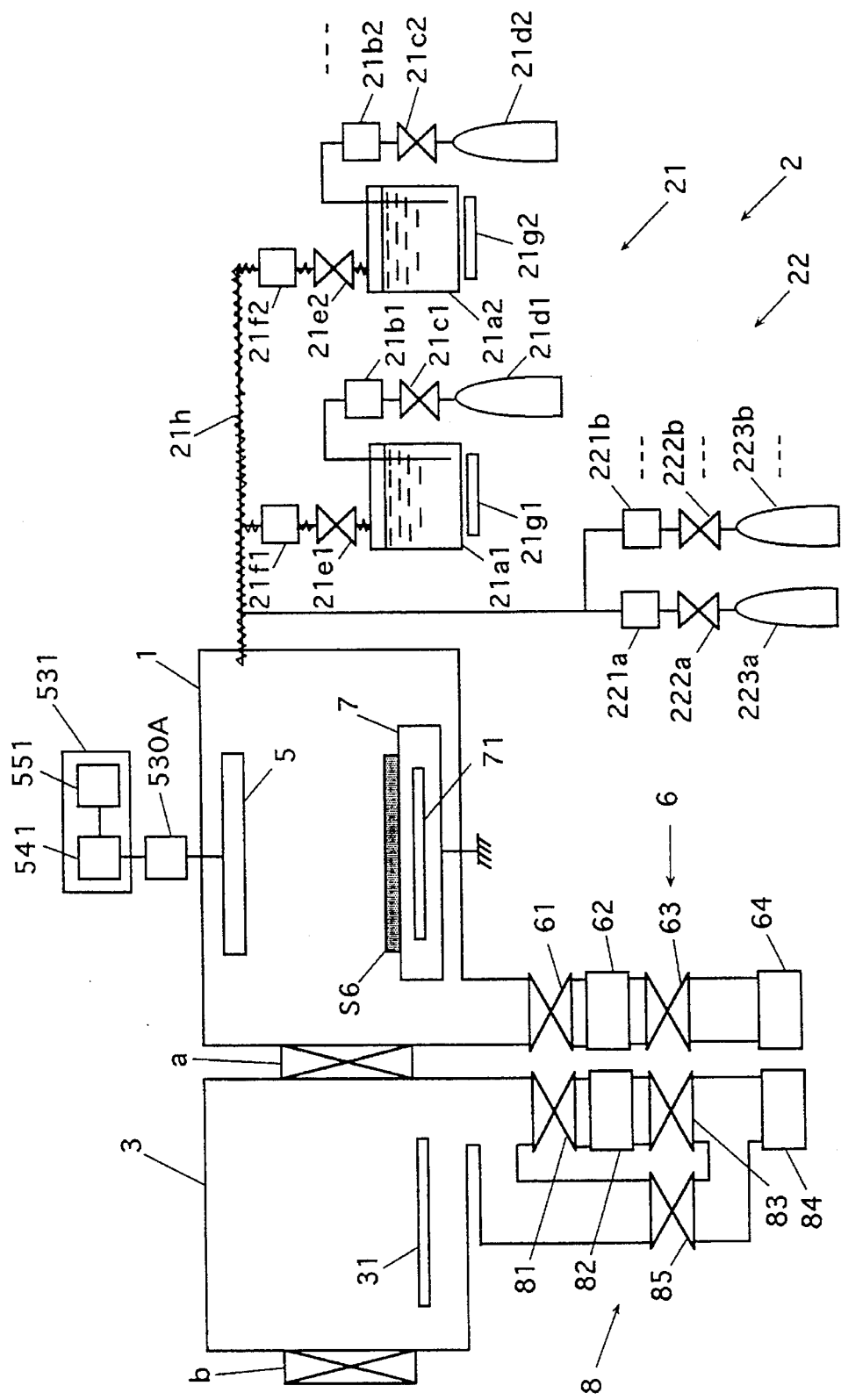
FIG. 12 schematically shows a further example of a structure of a plasma-CVD apparatus executing the method of the invention.
Figure 20:
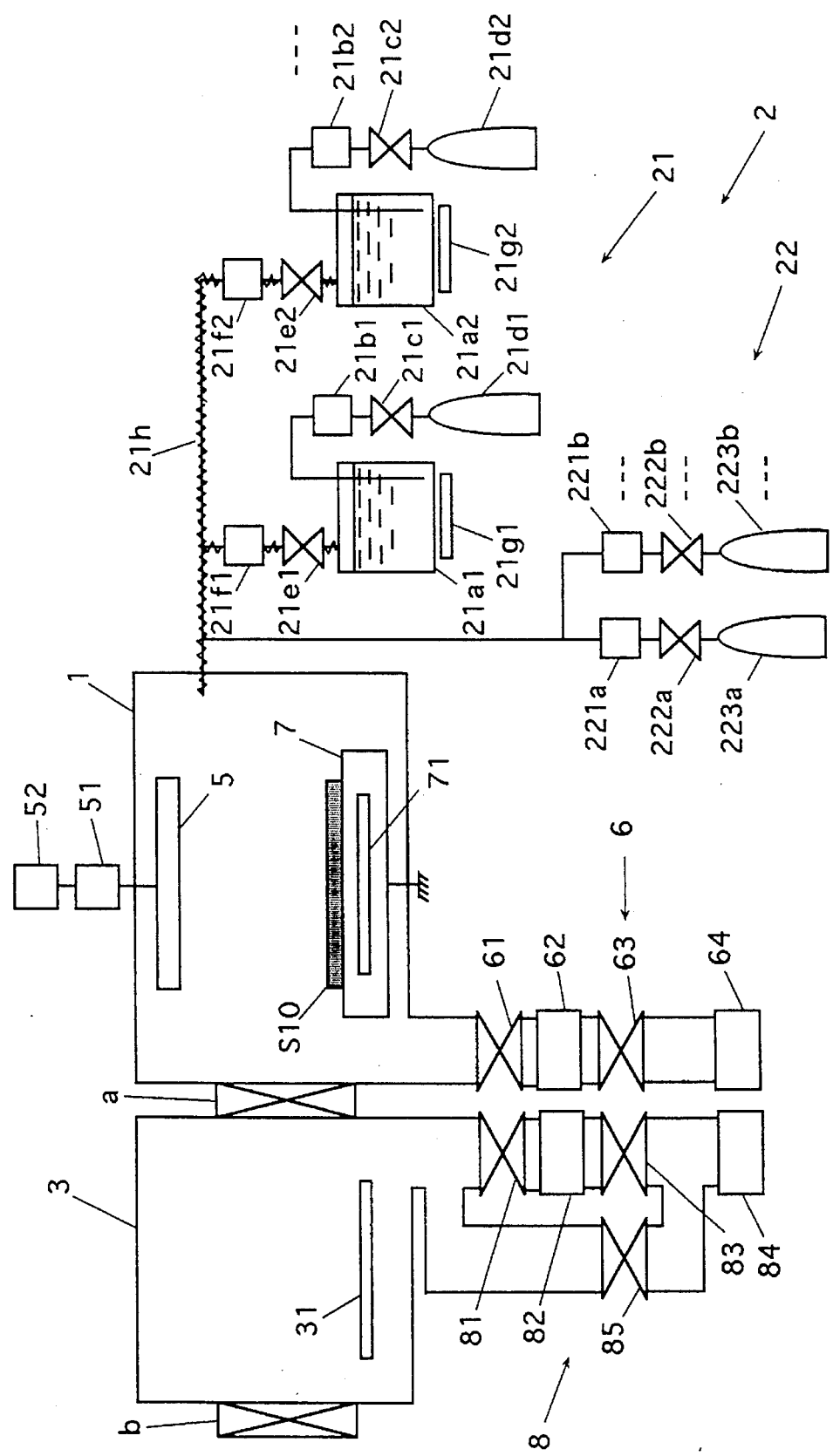
FIG. 20 schematically shows an example of a structure of a plasma-CVD apparatus which is an improvement of the thermal-CVD apparatus and was developed by the inventors during development of the invention.

The apparatus shown in FIG. 12 is a parallel plated rf-plasma-CVD apparatus, and is similar to the plasma-CVD apparatus shown in FIG. 20 except for that the rf-power generating device 531 is employed in place of the power source 52 in FIG. 20, and is connected to an rf-electrode 5 via a matching box 530A.

The device 531 includes an rf-wave generating device 551 connected to a matching box 530A via an rf-power amplifier 541.

The device 531 effects an amplitude modulation on a continuous rf-power (i.e., basic rf-power) having a sinusoidal waveform of a frequency from 10 MHz to 200 MHz shown at the upper portion of FIG. 6A. The a modulation frequency of the amplitude modulation is in a range from 1/1000 to 1/10 of the basic rf-power frequency as shown at the middle portion in FIG. 6A. Thereby, the device 531 generates the rf-power in which on-state and off-state are repeated at a predetermined duty cycle. The peak-to-peak power is constant during the power-on period.

Figure 19:
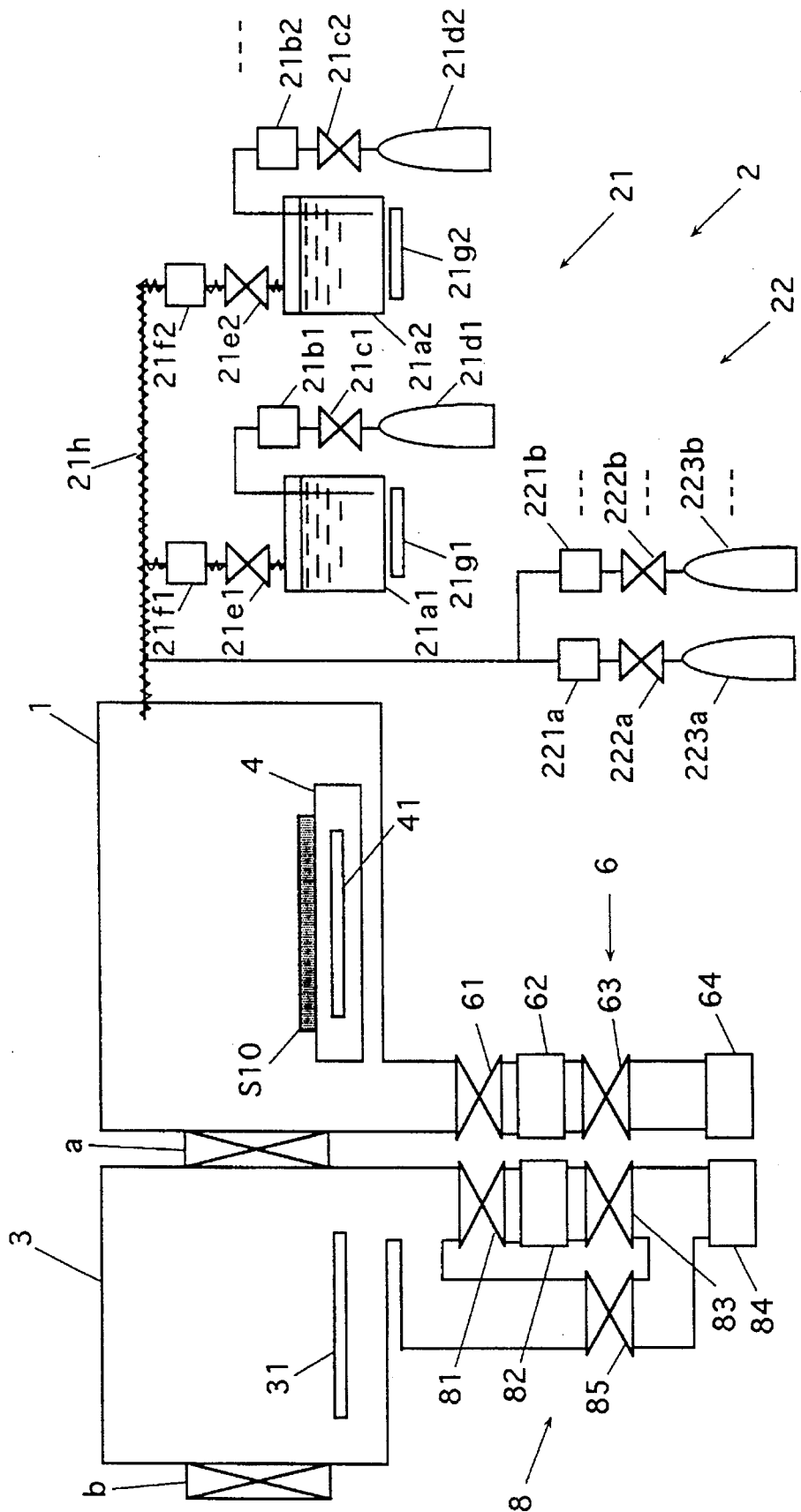
FIG. 19 schematically shows an example of a thermal-CVD apparatus in the prior art.

Other structures are the same as those in the conventional apparatus shown in FIG. 19 and the apparatus shown in FIG. 20. The same parts and portions as those in FIGS. 19 and 20 bear the same reference numbers.

In the operation of depositing a ferroelectric film, a substrate S6 is preheated in a load lock chamber 3 heated by a lamp heater 31, and is mounted on the electrode 7 heated by the heater 71. While maintaining the process chamber 1 at a vacuum state for deposition, the gas supply unit 2 introduces a predetermined amount of deposition gas into the process chamber 1 similarly to the apparatus in FIG. 20. The amplitude-modulated rf-power is applied to the gas for forming the plasma from this gas, and the ferroelectric film is deposited on the surface of the substrate S6 in the plasma.

In the deposition process, the deposition material gas includes an organic compound gas containing an element of the ferroelectric film to be formed and a gas containing oxygen and differing in kind from the organic compound gas. The ferroelectric film is deposited in plasma formed from the above deposition material gas by applying thereto the modulated rf-power. Therefore, a gas decomposition is promoted, and hence a concentration of radicals contributing to the deposition in the plasma increases, so that it is not necessary to maintain the substrate at a high temperature during deposition. Therefore, atoms having a high vapor pressure in the film are suppressed from being escaping therefrom, so that the required quantity of the film material can be reduced and the deposition cost can be reduced. Since the radical concentration increases, the thickness uniformity of the film is also improved.

Further, owing to application of the amplitude-modulated rf-power for forming the plasma from the material gas, generation of radicals causing the dust particles is suppressed, while generation of the radicals required for deposition is not suppressed, so that the deposition rate is prevented from excessive reduction or is improved.

owing to application of the amplitude-modulated rf-power for forming the plasma from the material gas, the radical concentration in the plasma increases. Therefore, the composition ratio of the film to be deposited can be controlled accurately as compared with the process by the thermal-CVD, so that the film having an intended composition ratio can be formed easily.

Description will now be given on the deposition by a plasma-CVD apparatus according to the invention shown in FIG. 13.

Figure 13:
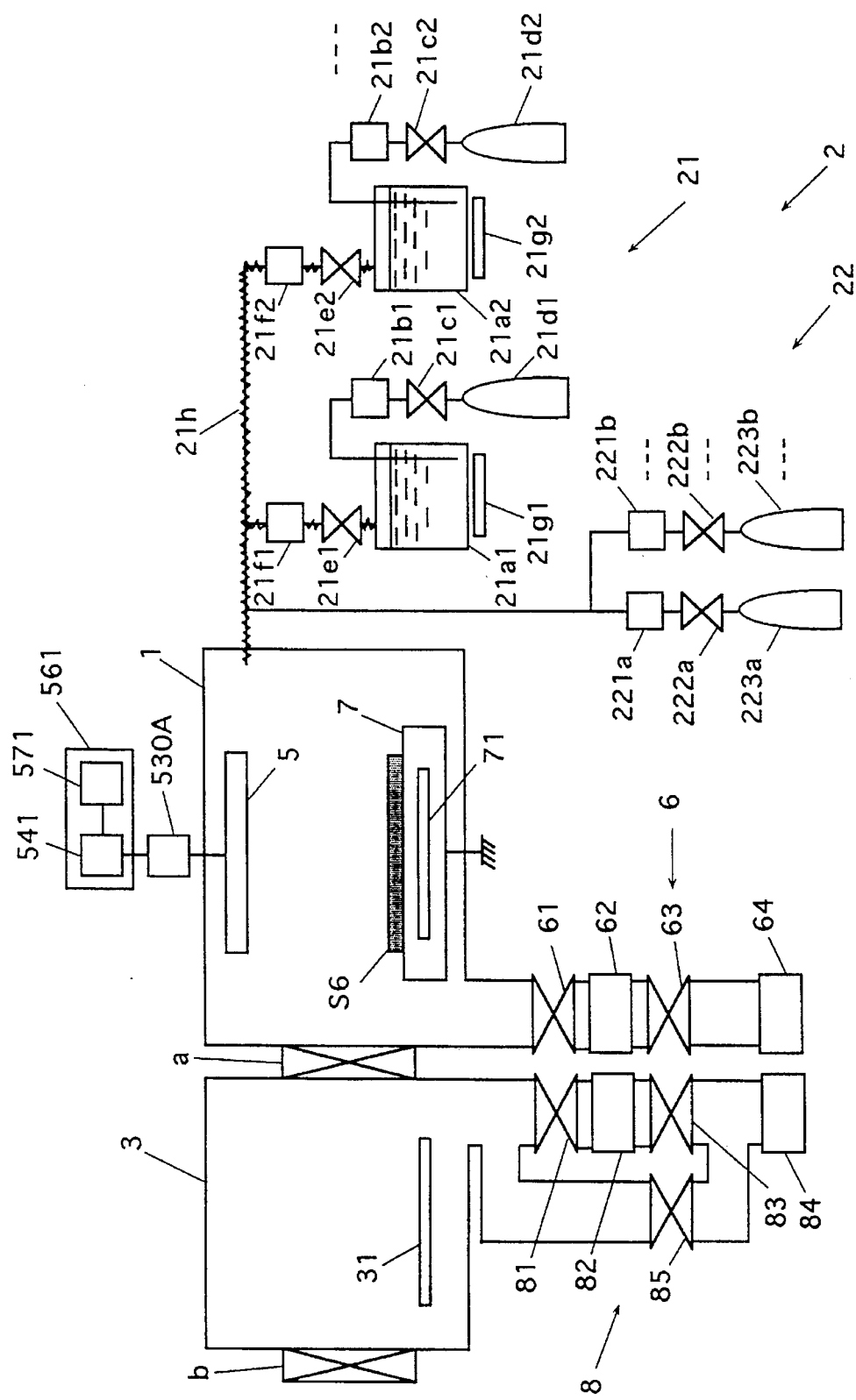
FIG. 13 schematically shows a further example of a structure of a plasma-CVD apparatus executing the method of the invention.
Figure 14:
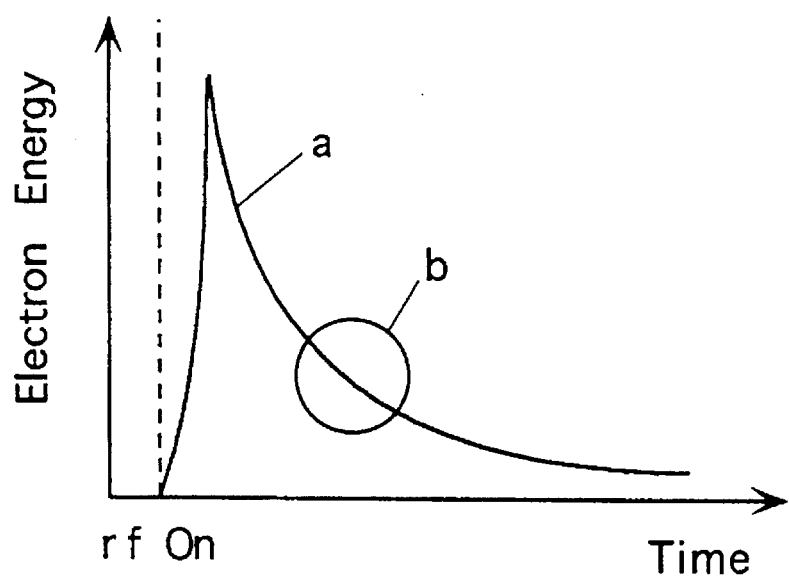
FIG. 14 shows non Maxwellian fast electrons in the plasma.

The apparatus shown in FIG. 13 is similar to the plasma-CVD apparatus shown in FIG. 12 except for that the rf-power generating device 561 is employed in place of the rf-power generating device 531.

Other structures are the same as those of the apparatus shown in FIG. 12. The same parts and portions as those of the apparatus in FIG. 12 bear the same reference numbers.

The rf-power generating device 561 includes an rf-wave generating device 571 connected to the matching box 530A via an rf-power amplifier 541.

The device 561 effects an amplitude modulation (first amplitude modulation) on a continuous rf-power (i.e., basic rf-power) having a sinusoidal waveform of a frequency from 10 MHz to 200 MHz as shown at the upper and middle portions of FIG. 6A, and further effects, as shown at the lower portion in FIG. 6A or in FIG. 6B, a second amplitude modulation on the power thus modulated. The first amplitude modulation is performed at a modulation frequency from 1/1000 to 1/10 of the basic rf-power frequency and a predetermined duty cycle. The second amplitude modulation is performed at a second modulation frequency from 1/100 to 100 times the frequency of the first modulation and a predetermined duty cycle. In this manner, the device 561 generated the modulated rf-power.

According to this plasma-CVD apparatus, since the plasma is formed from the deposition material gas by applying the rf-power on which the first and second amplitude modulations are effected as described above, generation of the dust particles is further suppressed and the deposition rate is further improved.

Description will now be given on examples of forming a ditantalum pentoxide ($Ta_2O_5$) film, a barium metatitanate ($BaTiO_3$) film and a zirconium oxide titanium oxide lead ($Pb(Zr,Ti)_xO_2$) film by respective apparatuses in FIGS. 12 and 13. Also, examples for comparison will be described below.

Example 6-1

(ditantalum pentoxide ($Ta_2O_5$) film formation by the apparatus in FIG. 12)

| Deposition Conditions | |
|---|---|
| Substrate S6: | silicon wafer of 100 mm in diameter |
| rf-Electrode Size: | 200 mm in diameter |
| rf-Power: | equal to CW of 100W ($V_{P-P}$ 25V) |
| | basic frequency 13.56 MHz |
| | AM freq. 68 kHz, duty ratio 50% |
| Deposition Gas: | pentaethoxytantalum, |
| | bubbling temp. 200° C. |
| | $H_2$ (carrier gas) 100 sccm |
| | $O_2$ 200 sccm |
| Film Thickness: | 100Å |
| Deposition Presssure: | 0.6 Torr |
| Substrate Temperature: | 280° C. |

Example 6-2

(barium metatitanate ($BaTiO_3$) film formation by the apparatus in FIG. 12)

| Deposition Conditions | |
|---|---|
| Substrate S6: | silicon wafer of 100 mm in diameter |
| rf-Electrode Size: | 200 mm in diameter |
| rf-Power: | equal to CW of 100W ($V_{P-P}$ 25V) |
| | basic frequency 13.56 MHz |
| | AM freq. 68 kHz, duty ratio 50% |
| Deposition Gas: | tetraisoproxytitanium |
| | bubbling temp. 40° C. |
| | $H_2$ (carrier gas) 50 sccm |
| | diethoxybarium, bubbling temp. 35° C. |
| | $H_2$ (carrier gas) 50 sccm |
| | $O_2$ 200 sccm |
| Film Thickness: | 100Å |
| Deposition Presssure: | 0.6 Torr |

-continued

| Deposition Conditions | |
|---|---|
| Substrate Temperature: | 450° C. |

Example 6-3

(zirconium oxide titanium oxide lead ($Pb(Zr,Ti)_xO_2$) film formation by the apparatus in FIG. 12)

| Deposition Conditions | |
|---|---|
| Substrate S6: | silicon wafer of 100 mm in diameter |
| rf-Electrode Size: | 200 mm in diameter |
| rf-Power: | equal to CW of 100W ($V_{P-P}$ 25V) |
| | basic frequency 13.56 MHz |
| | AM freq. 68 kHz, duty ratio 50% |
| Deposition Gas: | tetraisoproxytitanium |
| | bubbling temp. 40° C. |
| | $H_2$ (carrier gas) 40 sccm |
| | lead dipivalylmethanate |
| | bubbling temp. 40° C. |
| | $H_2$ (carrier gas) 100 sccm |
| | tetra-tert-butoxyzirconium |
| | bubbling temp. 4° C. |
| | $H_2$ (carrier gas) 50 sccm |
| | $O_2$ 200 sccm |
| Film Thickness: | 100Å |
| Deposition Presssure: | 0.6 Torr |
| Substrate Temperature: | 450° C. |

Example 6-4

(ditantalum pentoxide ($Ta_2O_5$) film formation by the apparatus in FIG. 13)

| Deposition Conditions | |
|---|---|
| Substrate S6: | silicon wafer of 100 mm in diameter |
| rf-Electrode Size: | 200 mm in diameter |
| rf-Power: | equal to CW of 100W ($V_{P-P}$ 25V) |
| | basic frequency 13.56 MHz |
| | 1st AM freq. 68 kHz, duty ratio 50% |
| | 2nd AM freq. 1 kHz, duty ratio 50% |
| Deposition Gas: | pentaethoxytantalum |
| | bubbling temp. 200° C. |
| | $H_2$ (carrier gas) 100 sccm |
| | $O_2$ 200 sccm |
| Film Thickness: | 100Å |
| Deposition Presssure: | 0.6 Torr |
| Substrate Temperature: | 280° C. |

Example 6-5

(barium metatitanate ($BaTiO_3$) film formation by the apparatus in FIG. 13)

| Deposition conditions | |
|---|---|
| Substrate S6: | silicon wafer of 100 mm in diameter |
| rf-Electrode Size: | 200 mm in diameter |
| rf-Power: | equal to CW of 100W ($V_{P-P}$ 25V) |
| | basic frequency 13.56 MHz |
| | 1st AM freq. 68 kHz, duty ratio 50% |
| | 2nd AM freq. 1 kHz, duty ratio 50% |
| Deposition Gas: | tetraisoproxytitanium |
| | bubbling temp. 40° C. |
| | $H_2$ (carrier gas) 50 sccm |
| | diethoxybarium, bubbling temp. 35° C. |
| | $H_2$ (carrier gas) 50 sccm |
| | $O_2$ 200 sccm |
| Film Thickness: | 100Å |
| Deposition Presssure: | 0.6 Torr |
| Substrate Temperature: | 450° C. |

Example 6-6
(zirconium oxide titanium oxide lead $(Pb(Zr,Ti)_xO_2)$ film formation by the apparatus in FIG. 13)

| Deposition Conditions | |
|---|---|
| Substrate S6: | silicon wafer of 100 mm in diameter |
| rf-Electrode Size: | 200 mm in diameter |
| rf-Power: | equal to CW of 100W ($V_{p-p}$ 25V) |
| | basic frequency 13.56 MHz |
| | 1st AM freq. 68 kHz, duty ratio 50% |
| | 2nd AM freq. 1 kHz, duty ratio 50% |
| Deposition Gas: | tetraisoproxytitanium |
| | bubbling temp. 40° C. |
| | $H_2$ (carrier gas) 40 sccm |
| | lead dipivalylmethanate |
| | bubbling temp. 40° C. |
| | $H_2$ (carrier gas) 100 sccm |
| | tetra-tert-butoxyzirconium |
| | bubbling temp. 4° C. |
| | $H_2$ (carrier gas) 50 sccm |
| | $O_2$ 200 sccm |
| Film Thickness: | 100Å |
| Deposition Presssure: | 0.6 Torr |
| Substrate Temperature: | 450° C. |

Example for Comparison 6-1

The thermal-CVD apparatus shown in FIG. 19 is used. A ditantalum pentoxide $(Ta_2O_5)$ film is deposited with the substrate temperature of 420° C. The substrate, deposition gas and film thickness are the same as those in the example 6-1.

Example for Comparison 6-2

The thermal-CVD apparatus shown in FIG. 19 is used. A barium metatitanate $(BaTiO_3)$ film is deposited with the substrate temperature of 650° C. The substrate, deposition gas and film thickness are the same as those in the example 6-2.

Example for Comparison 6-3

The thermal-CVD apparatus shown in FIG. 19 is used. A zirconium oxide titanium oxide lead $(Pb(Zr,Ti)_xO_2)$ film is deposited with the substrate temperature of 650° C. The substrate, deposition gas and film thickness are the same as those in the example 6-3.

The films formed in the examples 6-1–6-6 and the examples for comparison 6-1–6-3 were evaluated with respect to the deposition rate, dielectric constant of the film, concentration of particles of 0.1 μm or more in diameter and thickness uniformity. The concentration of particles is represented by converting a laser scattering intensity in the plasma obtained by the laser scattering method (Mie scattering method) into the concentration of particles of 0.1 μm or more. The results are as follows.

| Film | | D/R | D/C | P/C | T/U |
|---|---|---|---|---|---|
| $Ta_2O_5$ | Ex 6-1 | 220 | 25 | $3 \times 10^7$ | ±3 |
| | Ex 6-4 | 240 | 26 | $<1 \times 10^7$ | ±3 |
| | EC 6-1 | 150 | 20 | $1 \times 10^8$ | ±8 |
| $BaTiO_3$ | Ex 6-2 | 120 | 300 | $3 \times 10^7$ | ±5 |
| | Ex 6-5 | 140 | 320 | $<1 \times 10^7$ | ±5 |
| | EC 6-2 | 85 | 280 | $1 \times 10^8$ | ±15 |
| $Pb(Zr, Ti)_xO_2$ | Ex 6-3 | 150 | 900 | $3 \times 10^7$ | ±6 |
| | Ex 6-6 | 180 | 910 | $<1 \times 10^7$ | ±5 |
| | EC 6-3 | 60 | 850 | $1 \times 10^8$ | ±13 |

D/R: Deposition Rate (Å/min)
D/C: Dielectric Constant (F/m)
P/C: Particle Concentration (pts/cm³)
T/U: Thickness uniformity
Ex: Example
EC: Example for Comparison From the aforementioned results, the followings are seen.

If the ferroelectric film is deposited in the plasma formed from the material gas by applying the rf-power which is prepared by effecting the first amplitude modulation on the basic rf-power of a predetermined frequency, the deposition can be performed at a lower temperature than the deposition by the thermal-CVD method, so that the thickness uniformity of the film is improved. Also, generation of the dust particles is suppressed, and the deposition rate is improved. Since the radical concentration increases owing to the amplitude modulation, the film composition ratio is accurately controlled, which improves the dielectric constant of the film.

The second amplitude modulation further suppresses the particle generation and improves the deposition rate.

Description will now be given on a further deposition of a ferroelectric film by a plasma-CVD apparatus shown in FIG. 12.

In this deposition process of the plasma-CVD apparatus in FIG. 12, the heater 71 which is provided at the ground electrode 7 in the process chamber 1 can substantially heat the substrate S6 to a temperature allowing thermal decomposition of the deposition material gas near the substrate S6, and this apparatus is a parallel plated plasma-CVD apparatus also serving as a thermal-CVD apparatus.

In this deposition process, the substrate S6 is mounted on the electrode 7 after being preheated in the load lock chamber 3 heated by the lamp heater 31. While maintaining the process chamber 1 at a predetermined degree of vacuum, the gas supply unit 2 supplies a predetermined amount of deposition material gas into the process chamber 1. The deposition material gas is made of a mixture of an organic compound gas containing an element of the ferroelectric film to be deposited and a different kind of gas containing oxygen. The material gas is decomposed at the vicinity of the substrate S6 heated by the heater 71, so that a boundary layer of ferroelectric substance is deposited on the surface of the substrate S6. Then, the modulated rf-power is applied to the gas to form the plasma, in which the ferroelectric film is subsequently deposited on the boundary layer.

In this deposition process, the boundary layer of ferroelectric substance is formed by the thermal decomposition of the material gas prior to the deposition of the ferroelectric film on the substrate by forming the plasma from the deposition material gas, so that it is possible to prevent defects which may be caused by the plasma damage near the boundary between the deposited film and the substrate, and thus it is possible to prevent reduction of the dielectric constant of the film which may be caused by such defects.

As compared with the deposition by the conventional thermal-CVD method and apparatus, since a major portion of the deposition process can be executed without maintaining the substrate at a high temperature during the deposition, it is possible to suppress the escape of atoms having a high vapor pressure from the film during deposition, so that the required deposition material gas can be reduced in quantity, and the deposition cost can be reduced. The thickness uniformity is also improved.

According to this apparatus, since the plasma is formed from the material gas by applying the amplitude-modulated rf-power in the deposition process after formation of the boundary layer, generation of radicals required for the deposition is promoted, and generation of radicals causing the particles is suppressed. Therefore, adhesion and mixing of the particles are suppressed, and hence the film quality is improved. Also, the deposition rate is prevented from excessive reduction or is improved.

The decomposition in the gaseous phase is promoted, and the radical concentration in the plasma increases, which allows accurate control of the film composition ratio.

Description will now be given on a further deposition of a ferroelectric film by a plasma-CVD apparatus shown in FIG. 13.

In this deposition process, the plasma-CVD apparatus in FIG. 13 includes the heater 71, which is provided at the ground electrode 7 in the process chamber 1 and can substantially heat the substrate S6 mounted on the electrode 7 to a temperature allowing thermal decomposition of the deposition material gas near the substrate S6, and this apparatus is a parallel plated plasma-CVD apparatus also serving as a thermal-CVD apparatus.

In this deposition process, a boundary layer is formed on the substrate prior to the deposition of the intended film in the plasma similarly to the apparatus in FIG. 12. The subsequent deposition is, however, performed in the plasma formed by applying the rf-power on which first and second amplitude modulations are effected. As a result, generation of the particles is further suppressed, and the deposition rate is further improved.

Description will now be given on examples of forming a ditantalum pentoxide ($Ta_2O_5$) film, a barium metatitanate ($BaTiO_3$) film and a zirconium oxide titanium oxide lead ($Pb(Zr,Ti)_xO_2$) film by the respective apparatuses in FIGS. 12 and 13. Also, examples for reference and examples for comparison will be described below.

Example for Reference 1

(ditantalum pentoxide ($Ta_2O_5$) film formation by the apparatus in FIG. 20)

| Boundary Layer Deposition Conditions | |
|---|---|
| Substrate: | silicon wafer of 100 mm in diameter |
| Deposition Gas: | pentaethoxytantalum bubbling temp. 200° C. $H_2$ (carrier gas) 100 sccm $O_2$ 200 sccm |
| Deposition Presssure: | 0.6 Torr |
| Substrate Temperature: | 420° C. |
| Layer Thickness: | 150Å |
| Film Deposition Conditions | |
| rf-Electrode Size: | 200 mm in diameter |
| rf-Power: | Frequency 13.56 MHz, 100W ($V_{P-P}$ 25V) |
| Deposition Gas: | same as that for boundary layer deposition |
| Deposition Presssure: | 0.6 Torr |
| Substrate Temperature: | 280° C. |
| Film Thickness: | 1800Å |

Example 7-1

(ditantalum pentoxide ($Ta_2O_5$) film formation by the apparatus in FIG. 12)
Boundary Layer Deposition Conditions A ditantalum pentoxide ($Ta_2O_3$) layer of 150 Å in thickness is formed under the same condition as the example for reference 1.

| Film Deposition Conditions | |
|---|---|
| rf-Electrode Size: | 200 mm in diameter |
| rf-Power: | equal to CW of 100W ($V_{P-P}$ 25V) basic frequency 13.56 MHz AM freq. 68 kHz, duty ratio 50% |
| Deposition Gas: | same as that for boundary layer deposition |
| Deposition Presssure: | 0.6 Torr |
| Substrate Temperature: | 280° C. |
| Film Thickness: | 1760Å |

Example 7-2

(ditantalum pentoxide ($Ta_2O_5$) film formation by the apparatus in FIG. 13)
Boundary Layer Deposition Conditions A ditantalum pentoxide ($Ta_2O_5$) layer of 150 Å in thickness is formed under the same condition as the example for reference 1.

| Film Deposition Conditions | |
|---|---|
| rf-Electrode Size: | 200 mm in diameter |
| rf-Power: | equal to CW of 100W ($V_{P-P}$ 25V) basic frequency 13.56 MHz 1st AM freq. 68 kHz, duty ratio 50% 2nd AM freq. 1 kHz, duty ratio 50% |
| Deposition Gas: | same as that for boundary layer deposition |
| Deposition Presssure: | 0.6 Torr |
| Substrate Temperature: | 280° C. |
| Film Thickness: | 1840Å |

Example for Reference 2

(barium metatitanate ($BaTiO_3$) film formation by the apparatus in FIG. 20)

| Boundary Layer Deposition Conditions | |
|---|---|
| Substrate: | silicon wafer of 100 mm in diameter |
| Deposition Gas: | tetraisoproxytitanium bubbling temp. 40° C. $H_2$ (carrier gas) 50 sccm diethoxybarium bubbling temp. 35° C. $H_2$ (carrier gas) 50 sccm $O_2$ 200 sccm |
| Deposition Presssure: | 0.6 Torr |
| Substrate Temperature: | 650° C. |
| Layer Thickness: | 65Å |
| Film Deposition Conditions | |
| rf-Electrode Size: | 200 mm in diameter |
| rf-Power: | Frequency 13.56 MHz, 100W ($V_{P-P}$ 25V) |
| Deposition Gas: | same as that for boundary layer deposition |
| Deposition Presssure: | 0.6 Torr |
| Substrate Temperature: | 450° C. |
| Film Thickness: | 1900Å |

Example 7-3

(barium metatitanate ($BaTiO_3$) film formation by the apparatus in FIG. 12)
Boundary Layer Deposition Conditions A barium metatitanate ($BaTiO_3$) layer of 65 Å in thickness is formed under the same condition as the example for reference 2.

| Film Deposition Conditions | |
|---|---|
| rf-Electrode Size: | 200 mm in diameter |
| rf-Power: | equal to CW of 100W ($V_{P-P}$ 25V) basic frequency 13.56 MHz |

| Film Deposition Conditions | |
|---|---|
| Deposition Gas: | AM freq. 68 kHz, duty ratio 50% same as that for boundary layer deposition |
| Deposition Presssure: | 0.6 Torr |
| Substrate Temperature: | 450° C. |
| Film Thickness: | 1900Å |

Example 7-4

(barium metatitanate (BaTiO$_3$) film formation by the apparatus in FIG. 13)

Boundary Layer Deposition Conditions

A barium metatitanate layer of 65 Å in thickness is formed under the same condition as the example for reference 2.

| Film Deposition Conditions | |
|---|---|
| rf-Electrode Size: | 200 mm in diameter |
| rf-Power: | equal to CW of 100W (V$_{P-P}$ 25V) basic frequency 13.56 MHz 1st Am freq. 68 kHz, duty ratio 50% 2nd AM freq. 1 kHz, duty ratio 50% |
| Deposition Gas: | same as that for boundary layer deposition |
| Deposition Presssure: | 0.6 Torr |
| Substrate Temperature: | 450° C. |
| Film Thickness: | 1950Å |

Example for Reference 3

(zirconium oxide titanium oxide lead (Pb(Zr,Ti)$_x$O$_2$) film formation by the apparatus in FIG. 20)

| Boundary Layer Deposition Conditions | |
|---|---|
| Substrate: | silicon wafer of 100 mm in diameter |
| Deposition Gas: | tetraisoproxytitanium bubbling temp. 40° C. H$_2$ (carrier gas) 40 sccm lead dipivalylmethanate bubbling temp. 40° C. H$_2$ (carrier gas) 100 sccm tetra-tert-butoxyzirconium bubbling temp. 4° C. H$_2$ (carrier gas) 50 sccm O$_2$ 200 sccm |
| Deposition Presssure: | 0.6 Torr |
| Substrate Temperature: | 650° C. |
| Layer Thickness: | 60Å |
| Film Deposition Conditions | |
| rf-Electrode Size: | 200 mm in diameter |
| rf-Power: | Frequency 13.56 MHz, 100W (V$_{P-P}$ 25V) |
| Deposition Gas: | same as that for boundary layer deposition |
| Deposition Presssure: | 0.6 Torr |
| Substrate Temperature: | 450° C. |
| Film Thickness: | 1500Å |

Example 7-5

(zirconium oxide titanium oxide lead (Pb(Zr,Ti)$_x$O$_2$) film formation by the apparatus in FIG. 12)

Boundary Layer Deposition Conditions

A zirconium oxide titanium oxide lead (Pb(Zr,Ti)$_x$O$_2$) layer of 60 Å in thickness is formed under the same condition as the example for reference 3.

| Film Deposition Conditions | |
|---|---|
| rf-Electrode Size: | 200 mm in diameter |
| rf-Power: | equal to CW of 100W (V$_{P-P}$ 25V) basic frequency 13.56 MHz AM freq. 68 kHz, duty ratio 50% |
| Deposition Gas: | same as that for boundary layer deposition |
| Deposition Presssure: | 0.6 Torr |
| Substrate Temperature: | 450° C. |
| Film Thickness: | 1950Å |

Example 7-6

(zirconium oxide titanium oxide lead (Pb(Zr,Ti)$_x$O$_2$) film formation by the apparatus in FIG. 13)

Boundary Layer Deposition Conditions

A zirconium oxide titanium oxide lead layer of 60 Å in thickness is formed under the same condition as the example for reference 3.

| Film Deposition Conditions | |
|---|---|
| rf-Electrode Size: | 200 mm in diameter |
| rf-Power: | equal to CW of 100W (V$_{P-P}$ 25V) basic frequency 13.56 MHz 1st AM freq. 68 kHz, duty ratio 50% 2nd AM freq. 1 kHz, duty ratio 50% |
| Deposition Gas: | same as that for boundary layer deposition |
| Deposition Presssure: | 0.6 Torr |
| Substrate Temperature: | 450° C. |
| Film Thickness: | 1955Å |

Example for Comparison 7-1

The thermal-CVD apparatus shown in FIG. 19 is used. A ditantalum pentoxide film of 2000 Å in thickness is formed under the same boundary layer deposition conditions as the example for reference 1.

Example for Comparison 7-2

The plasma-CVD apparatus shown in FIG. 20 is used. A ditantalum pentoxide film of 2000 Å in thickness is formed under the same film deposition conditions as the example for reference 1 (i.e., with a continuous rf-power and without using an amplitude-modulated rf-power).

Example for Comparison 7-3

The thermal-CVD apparatus shown in FIG. 19 is used. A barium metatitanate film of 1950 Å in thickness is formed under the same boundary layer deposition conditions as the example for reference 2.

Example for Comparison 7-4

The plasma-CVD apparatus shown in FIG. 20 is used. A barium metatitanate film of 2000 Å in thickness is formed under the same film deposition conditions as the example for reference 2 (i.e., with a continuous rf-power and without using an amplitude-modulated rf-power).

Example for Comparison 7-5

The thermal-CVD apparatus shown in FIG. 19 is used. A zirconium oxide titanium oxide lead film of 1980 Å in thickness is formed under the same boundary layer deposition conditions as the example for reference 3.

Example for Comparison 7-6

The plasma-CVD apparatus shown in FIG. 20 is used. A zirconium oxide titanium oxide lead film of 2000 Å in thickness is formed under the same film deposition conditions as the example for reference 3 (i.e., with a continuous rf-power and without using an amplitude-modulated rf-power).

The films formed in the examples for reference 1–3, examples 7-1–7-6 and the examples for comparison 7-1–7-6 were evaluated with respect to the deposition rate, concentration of particles of 0.1 μm or more in diameter and thickness uniformity. For each example, a film sample of 100 Å in thickness was prepared under the same conditions, and the dielectric constant of these films were evaluated. The concentration of particles is represented by converting a laser scattering intensity in the plasma obtained by the laser scattering method (Mie scattering method) into the concentration of particles of 0.1 μm or more. The results are as follows.

| Film | | D/R | D/C | P/C | T/U |
|---|---|---|---|---|---|
| $Ta_2O_5$ | RF 1 | 150:200* | 12 | $2 \times 10^8$ | ±6 |
| | Ex 7-1 | 150:220 | 27 | $3 \times 10^7$ | ±3 |
| | Ex 7-2 | 150:240 | 29 | $<1 \times 10^7$ | ±3 |
| | EC 7-1 (T-CVD) | 150 | 20 | $1 \times 10^8$ | ±8 |
| | EC 7-2 (P-CVD) | 200 | 12 | $2 \times 10^8$ | ±6 |
| $BaTiO_3$ | RF 2 | 65:100 | 180 | $2 \times 10^8$ | ±10 |
| | Ex 7-3 | 65:120 | 320 | $3 \times 10^7$ | ±5 |
| | Ex 7-4 | 65:140 | 350 | $<1 \times 10^7$ | ±5 |
| | EC 7-3 (T-CVD) | 65 | 280 | $1 \times 10^8$ | ±15 |
| | EC 7-4 (P-CVD) | 100 | 180 | $2 \times 10^8$ | ±10 |
| $Pb(Zr, Ti)_xO_2$ | RF 3 | 60:100 | 450 | $2 \times 10^8$ | ±10 |
| | Ex 7-5 | 60:150 | 950 | $3 \times 10^7$ | ±6 |
| | Ex 7-6 | 60:180 | 970 | $<1 \times 10^7$ | ±5 |
| | EC 7-5 (T-CVD) | 60 | 850 | $1 \times 10^8$ | ±13 |
| | EC 7-6 (P-CVD) | 100 | 450 | $2 \times 10^8$ | ±10 |

*: (boundary layer deposition):(film deposition)
D/R: Deposition Rate (Å/min)
D/C: Dielectric Constant (F/m)
P/C: Particle Concentration (pts/cm³)
T/U: Thickness Uniformity
RF: Example for Reference
Ex: Example
EC: Example for Comparison
T-CVD: Thermal-CVD Method
P-CVD: Plasma-CVD Method From the aforementioned results, the followings are seen.

For depositing the ferroelectric film, the plasma-CVD method is executed after depositing the boundary layer for the film by the thermal-CVD method, so that defects at the boundary between the substrate and the film is suppressed and thus the dielectric constant of the film is improved as compared with the film deposition only by the plasma-CVD. Also, a major portion of the process can be performed at a lower temperature than the deposition by the thermal-CVD method, so that the thickness uniformity and the deposition rate are improved.

In the deposition process by the plasma-CVD method, the plasma is formed from the material gas by applying the rf-power which is prepared by effecting the first amplitude modulation on the basic rf-power of a predetermined frequency, so that generation of the dust particles is suppressed, and the deposition rate is improved. Since the radical concentration in the gaseous phase increases owing to application of the amplitude-modulated rf-power for forming the plasma, the film composition ratio is accurately controlled, which improves the dielectric constant of the film.

The thickness uniformity is improved as compared with the case not employing the modulated power.

The second amplitude modulation, if applied, can further suppress generation of the particles and improve the deposition rate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma-CVD method including the steps of:

forming plasma from a film deposition material gas in a process chamber; and depositing, in said plasma, a film on a substrate disposed in said process chamber, wherein formation of said plasma from said material gas is performed by application of an rf-power prepared by effecting a first amplitude modulation on a basic rf-power having a frequency in a range from 10 MHz to 200 MHz, said amplitude modulation being performed at a modulation frequency in a range from 1/1000 to 1/10 of the frequency of said basic rf-power.

2. A plasma-CVD method according to claim 1, wherein said modulation frequency is in a range from 1/270 to 1/68 of said basic rf-power frequency.

3. A plasma-CVD method according to claim 1, wherein said modulation frequency is in a range from 1/270 to 1/135 of said basic rf-power frequency.

4. A plasma-CVD method according to claim 1, wherein said rf-power applied to said material gas for forming said plasma is prepared by effecting said first amplitude modulation on said basic rf-power and additionally effecting a second amplitude modulation on said modulated rf-power, a modulation frequency of said second amplitude modulation being in a range from 1/100 to 100 times said modulation frequency of said first amplitude modulation.

5. A plasma-CVD method according to claim 1, wherein said deposition material gas is a halogen compound gas used for forming said film, or is mixture of a halogen compound gas and a different kind of gas different from said halogen compound gas, said different kind of gas being used for forming said film together with said halogen compound gas.

6. A plasma-CVD method according to claim 5, wherein said rf-power applied to said material gas for forming said plasma is prepared by effecting said first amplitude modulation on said basic rf-power and additionally effecting a second amplitude modulation on said modulated rf-power, a modulation frequency of said second amplitude modulation being in a range from 1/100 to 100 times said modulation frequency of said first amplitude modulation.

7. A plasma-CVD method according to claim 1, wherein said carbon film to be deposited is a carbon film, and said deposition material gas is a hydrocarbon compound gas used for forming said film, or is mixture of a hydrocarbon compound gas and a different kind of gas different from said hydrocarbon compound gas, said different kind of gas being used for forming said carbon film together with said hydrocarbon compound gas.

8. A plasma-CVD method according to claim 7, wherein said rf-power applied to said material gas for forming said plasma is prepared by effecting said first amplitude modulation on said basic rf-power and additionally effecting a second amplitude modulation on said modulated rf-power, a modulation frequency of said second amplitude modulation being in a range from 1/100 to 100 times said modulation frequency of said first amplitude modulation.

9. A plasma-CVD method according to claim 1, wherein said film to be deposited is a ferroelectric film, and said deposition material gas includes at least an organic compound gas containing an element of said ferroelectric film to be formed and a gas containing oxygen and differing in kind from said organic compound gas.

10. A plasma-CVD method according to claim 9, wherein said rf-power applied to said material gas for forming said plasma is prepared by effecting said first amplitude modulation on said basic rf-power and additionally effecting a second amplitude modulation on said modulated rf-power, a modulation frequency of said second amplitude modulation being in a range from 1/100 to 100 times said modulation frequency of said first amplitude modulation.

11. A plasma-CVD method according to claim 1, wherein
   said film to be deposited is a ferroelectric film, said deposition material gas includes at least an organic compound gas containing an element of said ferroelectric film to be formed and a gas containing oxygen and differing in kind from said organic compound gas, and
   said method further comprises the steps of:
   thermally decomposing said deposition material gas prior to said formation of said plasma from said deposition material gas,
   exposing said substrate to said thermally decomposed gas to form a boundary layer made of a ferroelectric layer,
   applying said modulated rf-power to said deposition material gas to form said plasma after said formation of said boundary layer, and
   exposing said boundary layer on said substrate to said plasma formed from said deposition material gas to form said ferroelectric film thereon.

12. A plasma-CVD method according to claim 11, wherein said rf-power applied to said material gas for forming said plasma is prepared by effecting said first amplitude modulation on said basic rf-power and additionally effecting a second amplitude modulation on said modulated rf-power, a modulation frequency of said second amplitude modulation being in a range from 1/10 to 100 times said modulation frequency of said first amplitude modulation.

13. A plasma-CVD method according to claim 1, further comprising the steps of:
   introducing a pretreatment gas into said process chamber prior to said formation of said plasma from said deposition material gas;
   forming plasma from said pretreatment gas by applying thereto an rf-power prepared by effecting an amplitude modulation at a frequency, which is in a range from $1/10^5$ to 1/10 of the frequency of a basic rf-power having a frequency from 10 MHz to 200 MHz, on said basic rf-power;
   exposing said substrate to said plasma formed from said pretreatment gas to clean said substrate;
   introducing said deposition material gas into said process chamber; and
   applying said modulated rf-power to said deposition material gas to form said plasma therefrom for depositing said film on the cleaned surface of said substrate.

14. A plasma-CVD method according to claim 13, wherein said rf-power applied to said material gas for forming said plasma is prepared by effecting said first amplitude modulation on said basic rf-power and additionally effecting a second amplitude modulation on said modulated rf-power, a modulation frequency of said second amplitude modulation being in a range from 1/100 to 100 times said modulation frequency of said first amplitude modulation.

15. A plasma-CVD method according to claim 13, wherein said amplitude modulation for obtaining said amplitude-modulated rf-power used for forming said plasma from said pretreatment gas is performed by a pulse modulation or a pulse-like modulation performing turn-on and turn-off of an applied power.

16. A plasma-CVD method according to any one of claims 1 to 15, wherein said amplitude modulation for obtaining said amplitude-modulated rf-power used for forming said plasma from said deposition material gas is performed by a pulse modulation or a pulse-like modulation performing turn-on and turn-off of an applied power.

17. A plasma-CVD apparatus comprising:
   a process chamber for accommodating a substrate for deposition;
   a gas supply unit for supplying a film deposition material gas into said process chamber; and
   rf-power applying means for applying an rf-power to said material gas supplied from said gas supply unit into said process chamber to form plasma from said material gas, wherein
   said rf-power applied by said rf-power applying means is prepared by effecting a first amplitude modulation on a basic rf-power having a frequency in a range from 10 MHz to 200 MHz, said amplitude modulation being performed at a modulation frequency in a range from 1/1000 to 1/10 of said frequency of said basic rf-power.

18. A plasma-CVD apparatus according to claim 17, wherein said modulation frequency of said amplitude modulation for said rf-power applied by said rf-power applying means is in a range from 1/270 to 1/68 of said basic rf-power frequency.

19. A plasma-CVD apparatus according to claim 17, wherein said modulation frequency of said amplitude modulation for said rf-power applied by said rf-power applying means is in a range from 1/270 to 1/135 of said basic rf-power frequency.

20. A plasma-CVD apparatus according to claim 17, wherein said rf-power applied by said rf-power applying means to said material gas for forming said plasma is prepared by effecting said first amplitude modulation on said basic rf-power and additionally effecting a second amplitude modulation on said modulated rf-power, a modulation frequency of said second amplitude modulation being in a range from 1/100 to 100 times said modulation frequency of said first amplitude modulation.

21. A plasma-CVD apparatus according to claim 17, wherein said deposition material gas supplied from said material gas supply unit is a halogen compound gas used for forming said film, or is mixture of a halogen compound gas and a different kind of gas different from said halogen compound gas, said different kind of gas being used for forming said film together with said halogen compound gas.

22. A plasma-CVD apparatus according to claim 21, wherein said rf-power applied by said rf-power applying means to said material gas for forming said plasma is prepared by effecting said first amplitude modulation on said basic rf-power and additionally effecting a second amplitude modulation on said modulated rf-power, a modulation frequency of said second amplitude modulation being in a range from 1/100 to 100 times said modulation frequency of said first amplitude modulation.

23. A plasma-CVD apparatus according to claim 17, wherein said film to be deposited is a carbon film, and said deposition material gas supplied from said material gas supply unit is a hydrocarbon compound gas used for forming said carbon film, or is mixture of a hydrocarbon compound gas and a different kind of gas different from said hydrocarbon compound gas, said different kind of gas being used for forming said carbon film together with said hydrocarbon compound gas.

24. A plasma-CVD apparatus according to claim 23, wherein said rf-power applied by said rf-power applying means to said material gas for forming said plasma is prepared by effecting said first amplitude modulation on said basic rf-power and additionally effecting a second amplitude modulation on said modulated rf-power, a modulation frequency of said second amplitude modulation being in a range from 1/100 to 100 times said modulation frequency of said first amplitude modulation.

25. A plasma-CVD apparatus according to claim 17, wherein said film to be deposited is a ferroelectric film, and said deposition material gas supplied from said material gas supply unit includes at least an organic compound gas containing an element of said ferroelectric film to be formed and a gas containing oxygen and differing in kind from said organic compound gas.

26. A plasma-CVD apparatus according to claim 25, wherein said rf-power applied by said rf-power applying means to said material gas for forming said plasma is prepared by effecting said first amplitude modulation on said basic rf-power and additionally effecting a second amplitude modulation on said modulated rf-power, a modulation frequency of said second amplitude modulation being in a range from 1/100 to 100 times said modulation frequency of said first amplitude modulation.

27. A plasma-CVD apparatus according to claim 17, wherein
said film to be deposited is a ferroelectric film, and said deposition material gas supplied from said material gas supply unit includes at least an organic compound gas containing an element of said ferroelectric film to be formed and a gas containing oxygen and differing in kind from said organic compound gas, and said apparatus further comprises heating means for thermally decomposing said deposition material gas supplied from said gas supply unit to said process chamber.

28. A plasma-CVD apparatus according to claim 27, wherein said rf-power applied by said rf-power applying means to said material gas for forming said plasma is prepared by effecting said first amplitude modulation on said basic rf-power and additionally effecting a second amplitude modulation on said modulated rf-power, a modulation frequency of said second amplitude modulation being in a range from 1/100 to 100 times said modulation frequency of said first amplitude modulation.

29. A plasma-CVD apparatus according to claim 17, further comprising:

a pretreatment gas supply unit for supplying a pretreatment gas into said process chamber; and rf-power applying means for applying an rf-power to said pretreatment gas supplied from said pretreatment gas supply unit into said process chamber to form plasma from said pretreatment gas, wherein said rf-power applied by said rf-power applying means for said pretreatment gas is prepared by effecting an amplitude modulation at a frequency, which is in a range from $1/10^5$ to $1/10$ of a frequency of said basic rf-power in a range from 10 MHz to 200 MHz, on said basic rf-power.

30. A plasma-CVD apparatus according to claim 29, wherein said rf-power applied by said rf-power applying means to said material gas for forming said plasma is prepared by effecting said first amplitude modulation on said basic rf-power and additionally effecting a second amplitude modulation on said modulated rf-power, a modulation frequency of said second amplitude modulation being in a range from 1/100 to 100 times said modulation frequency of said first amplitude modulation.

31. A plasma-CVD apparatus according to claim 29, wherein said amplitude modulation for said amplitude-modulated rf-power applied by said rf-power applying means for forming said plasma from said pretreatment gas is performed by a pulse modulation or a pulse-like modulation performing turn-on and turn-off of an applied power.

32. A plasma-CVD apparatus according to any one of claims 17 to 31, wherein said amplitude modulation for said amplitude-modulated rf-power applied by said rf-power applying means for forming said plasma from said deposition material gas is performed by a pulse modulation or a pulse-like modulation performing turn-on and turn-off of an applied power.

* * * * *